United States Patent
Sakui et al.

[19]

[11] Patent Number: 6,031,760
[45] Date of Patent: Feb. 29, 2000

[54] SEMICONDUCTOR MEMORY DEVICE AND METHOD OF PROGRAMMING THE SAME

[75] Inventors: Koji Sakui, Tokyo; Junichi Miyamoto, Yokohama; Kenichi Imamiya, Kawasaki; Kei Takano, Chigasaki, all of Japan

[73] Assignee: Kabushiki Kaisha Toshiba, Kawasaki

[21] Appl. No.: 09/124,063

[22] Filed: Jul. 29, 1998

[30] Foreign Application Priority Data

Jul. 29, 1997 [JP] Japan ................................ 9-203260
Jan. 6, 1998 [JP] Japan ................................ 10-000745

[51] Int. Cl.[7] ................................ G11C 16/00
[52] U.S. Cl. ................ 365/185.21; 365/185.22
[58] Field of Search ................ 365/185.21, 185.22, 365/185.09, 185.28, 185.12

[56] References Cited

U.S. PATENT DOCUMENTS

| | | | |
|---|---|---|---|
| 5,172,338 | 12/1992 | Mehrotra et al. ................ 365/185 |
| 5,495,442 | 2/1996 | Cernea et al. ................ 365/185.22 |
| 5,566,105 | 10/1996 | Tanaka et al. ................ 365/185.22 |
| 5,638,323 | 6/1997 | Itano ................ 365/185.22 |
| 5,642,312 | 6/1997 | Harari ................ 365/185.33 |
| 5,675,540 | 10/1997 | Roohparvar ................ 365/185.22 |
| 5,691,941 | 11/1997 | Imamiya et al. ................ 365/185.3 |
| 5,784,318 | 7/1998 | Anami ................ 365/185.22 |

*Primary Examiner*—Tan T. Nguyen
*Attorney, Agent, or Firm*—Banner & Witcoff, Ltd.

[57] ABSTRACT

A semiconductor memory device includes sense amplifier circuits each having a latch circuit connected to a sense node and storing circuits for storing identification data indicating sense amplifier circuits instructed to perform program when program data is loaded into the sense amplifier circuits. Before program verify read operation, data in the sense amplifier circuits instructed to perform programming by the loaded data is reset to the loaded data on the basis of the identification data in the storing circuits. This suppresses any rise in the potential of the common source line of a plurality of memory cells when a program verify operation is performed or when a page divisional program operation is performed, or suppresses any difference between the common source line potential rises in a program verify read operation and a normal read operation, thereby preventing incomplete programming. This improves the reliability of the program verify read operation and the page divisional program operation.

29 Claims, 47 Drawing Sheets

|  | ERASE | READ | PROGRAM |
|---|---|---|---|
| SELECTED WL | 0 | 0 | Vpgm(=18) |
| UNSELECTED (PASSED) WL | 0 | Vpass(=4.5) | Vm(=10) |
| SSL | F | Vpass(=4.5) | Vcc |
| GSL | F | Vpass(=4.5) | 0 |
| "0" BL | F | 1.5 | 0 |
| "1" BL | F | 0.7 | Vcc |
| Bulk | Ver | 0 | 0 |

SEMICONDUCTOR MEMORY DEVICE AND METHOD OF PROGRAMMING THE SAME

BACKGROUND OF THE INVENTION

The present invention relates to a semiconductor memory device and a method of programming the memory device and, more particularly, to an electrically programmable nonvolatile semiconductor memory device, a method of programming the memory, and method of verify reading after programming operation of the memory device.

This application is based on Japanese Patent Application No. 9-203260, filed Jul. 29, 1997 and Japanese Patent Application No. 10-000745, filed Jan. 6, 1998, the content of which is incorporated herein by reference.

As one conventional semiconductor memory device, an electrically programmable EEPROM is known. In an EEPROM, a plurality of memory cell units (e.g., NAND cell unit, NOR cell unit, AND cell unit, or DINOR cell unit) each including a plurality of memory cells are arrayed to form a memory cell array. Of EEPROMS, a NAND cell type EEPROM in which a plurality of memory cells are connected in series to form a NAND cell unit is attracting attention because high-degree integration is possible.

One memory cell unit of a NAND cell type EEPROM has a FETMOS structure in which a floating gate (charge storage layer) and a control gate are stacked on a semiconductor substrate via an insulating film. A plurality of such memory cells are connected in series to form a NAND memory cell unit such that adjacent memory cells share a source and a drain. A plurality of such NAND memory cell units are arranged in a matrix manner to form a memory cell array.

Drains at one end of NAND memory cell units arranged in the column direction of the memory cell array are connected together to a bit line through selection gate transistors. Sources at the other end are connected to a common source line through selection gate transistors. The control gate lines of memory cell transistors and the gate electrodes of the selection gate transistors are connected together as a word line (control gate line) and a selection gate line, respectively, in the row direction of the memory cell.

NAND cell type EEPROMs as described above are disclosed in, e.g.,

K. -D. Suh et al., "A 3.3 V 32 Mb NAND Flash Memory with Incremental Step Pulse Programming Scheme," IEEE J. Solid-State Circuits, vol. 30, pp. 1149–1156, November 1995 (reference 1), and Y. Iwata et al., "A 35 ns Cycle Time 3.3 V Only 32 Mb NAND flash EEPROM," IEEE J. Solid-State,Circuits, vol. 30, pp. 1157–1164, November 1995 (reference 2).

A conventional NAND cell type EEPROM disclosed in reference 1 will be described below with reference to FIG. 1 (FIG. 1 of reference 1) and FIGS. 2A and 2B (FIGS. 3A and 3B of reference 1).

FIG. 1 is a block diagram showing the arrangement of the conventional NAND cell type EEPROM. In FIG. 1, reference numeral 10 denotes a NAND cell unit. Reference symbol BSEL denotes a block selection signal; $CG_0$ to $CG_{15}$, common gate lines; $WL_0$ to $WL_{15}$, word lines; $BL_0$ to $BL_{4243}$, bit lines; SSL, a selection gate line on the bit line side; GSL, a selection gate line on the source line side; and S/A, a part (sense amplifier circuit S/A) of a page buffer.

FIG. 2A shows the arrangement of the NAND memory cell unit shown in FIG. 1. FIG. 2B shows the bias states when erase, read, and program operations are performed for the NAND memory cell unit.

In FIG. 2B, "Bulk" denotes a p-type well formed in an n-type semiconductor substrate; and "F", a floating state.

In the NAND cell unit 10 shown in FIGS. 1, 2A, and 2B, a plurality of cell transistors made of n-channel MOSFETs having a floating gate and a control gate are connected in series. Drains at one end are connected to the bit lines BL through NMOS transistors as selection gates. Sources at the other end are connected to a common source line through NMOS transistors as selection gates.

These transistors are formed on the same well substrate. The control electrodes of the memory cells are connected to the word lines $WL_0$ to $WL_{15}$ continuously extending in the row direction. The control gates of selection transistors on the bit line side are connected to the selection gate line SSL. The control gates of selection transistors on the source line side are connected to the selection gate line GSL.

Each cell transistor has a threshold voltage corresponding to stored data. In the case of a NAND flash memory, a state wherein a cell transistor is depletion type (D type) is defined as a data "1" storing state (erased state). A state wherein a cell transistor is an enhancement type (E type) is defined as a data "0" storing state (programmed state). Also, an operation of shifting the threshold voltage of a cell transistor storing data "1" in the positive direction to make the transistor store data "0" is called a "program operation". An operation of shifting the threshold voltage of a cell transistor storing data "0" in the negative direction to make the transistor store data "1" is called an "erase operation".

During the erase operation, the common gate lines $CG_0$ to $CG_{15}$ are grounded. The logic level of-the block selection signal BSEL of a selected block changes to "H" (power-supply voltage). The logic level of a block selection signal of an unselected block maintains "L" (ground potential). Accordingly, each word line of the selected block is set at the ground potential, and each word line of the unselected block is set in the floating state.

Next, a 21-V and 3-ms erase pulse is applied to the bulk (a p-type well of the cell transistor). In the selected block, this erase voltage (21 V) is applied between the bulk and the word line. Electrons in a floating gate flow into the p-type well in the cell due to an FN (Fowler-Nordheim) tunnel current. Consequently, the threshold voltage of the cell becomes about –3 V. Since over-erase is not a problem in a NAND type flash memory, the cell is deliberately erased to have a threshold voltage of about –3 V by one erase pulse.

On the other hand, the unselected block is unaffected by the erase pulse due to capacitive coupling of the word line in the floating state and the p-type well of the cell. The word line in the floating state is connected to the source of a transistor to which the block selection signal BSEL is applied, to a metal wire between this source and a polysilicon word line, and to the polysilicon word line. The capacitive coupling ratio (coupling ratio) between this word line and the channel is calculated from the capacitance connected to the word line in the floating state.

This capacitance includes the source junction capacitance of the transistor, the overlap capacitance of the source and the gate, the capacitance on the field of the polysilicon and the metal wire, the capacitance between the polysilicon word line and the well region (p-type well) of the cell, and the like. Of these capacitances, the capacitance between the word line and the p-type well is dominantly large with respect to the total capacitance. Therefore, the coupling ratio calculated on the basis of results of actual measurements is as large as approximately 0.9. This prevents the FN tunnel current from flowing.

In an erase-verify operation, whether the threshold voltages of all cells in the selected block are −1 V or less is checked.

In a read operation, cell data of one page is simultaneously transferred to a latch circuit of a page buffer (to be referred to as a sense amplifier circuit S/A hereinafter) and continuously read out.

FIG. 3 (FIG. 4 of reference 1) is a timing chart showing the operating waveforms of principal signals when a read operation is performed for the EEPROM shown in FIG. 1.

In sensing cell data of one page, the sense amplifier circuit S/A is first initialized to store "0" data (level "L", a state wherein data has been read out from a programmed cell). At time t1, the bit line is at 0 V, and the selection gate lines SSL and GSL are at 4.5 V.

At time t2, 0 V is applied to a selected word line $WL_i$ in the selected block (NAND cell), and 4.5 V as a pass voltage are applied to an unselected word line $WL_i$ in the selected block. Since 4.5 V applied to the unselected word line are higher than the threshold voltages of each cell after programming operation and erasure, all unselected cells function as pass transistors.

The selected word line to which 0 V is applied turns on only erased cell transistors. Accordingly, a NAND cell unit in which data of an erased cell has been read becomes a verification passed cell whose bit line BL is grounded. A NAND cell unit in which data of a programmed cell has been read sets the bit line BL in an open state.

At time t3, a direct sense path from a bit line to a latch circuit is shut off by changing the control signal PGM in FIG. 1 to "L", so latch data is determined only through a sense transistor. A current load transistor of a PMOS current mirror circuit is activated by a reference voltage Vref to supply a load current of 2 μA to bit lines. This load current flows through a bit line reading out data of an erased cell, so this bit line maintains level "L". A bit line reading out data of a programmed cell changes to level "H".

At time t4, the bit line reading out data of a programmed cell turns on a sense transistor to invert latch data to "1".

In this manner, a latch circuit which has read out data of a programmed cell stores "1", and a latch circuit which has read out data of an erased cell stores "0". These latch data are supplied to a read circuit and converted into normal logic levels. Accordingly, data are simultaneously set to all latch circuits of one page to enable a continuous read operation.

In a program operation, program data is first continuously loaded into a sense amplifier circuit S/A. "0" is cell data for performing programming, and "1" is cell data for inhibiting programming. A program cycle is repeated until cells in columns corresponding to all latch data "0" are programmed.

Each program cycle includes application of a program pulse and a program verify read operation for preventing over-programming of a cell storing "0" data.

More specifically, a 40-μs program cycle includes the following steps.

(1) Bit line set up (8 μs): in accordance with program data in a latch circuit of the sense amplifier circuit S/A, the bit line level is set to 0 V for programming or to Vcc for program inhibition.

(2) Programming (20 μs): a program voltage is applied as a narrow pulse to a selected word line.

(3) Word line discharge (4 μs): a high potential of the selected word line is discharged to prepare for application of a next low verify potential.

(4) Program verify (8 μs): whether the threshold voltage of the programmed cell is programmed to a target value or more is checked.

In the program verify read operation, data in a latch circuit connected to a sufficiently programmed cell changes from "0" to "1" to prevent further programming. Bias conditions during the program verify read operation are nearly identical with those during the read operation. However, programmed data is stored in a latch circuit, and 0.7 V different from 0 V is applied to a selected word line.

Under this condition, when the threshold voltage of the programmed cell exceeds 0.7 V, i.e., when the cell is sufficiently programmed, the data in the latch circuit changes from "0" to "1". A latch circuit storing data "1" is unaffected during the verify operation because data in a latch circuit changes only from "0" to "1".

A program cycle is repeated until all latch circuits in the page buffer store "1" or a maximum programming time of 10 cycles is reached.

FIG. 4 (FIG. 5 of reference 1) shows the bias conditions of a program inhibiting voltage supplied to the channel of a selected cell.

A transistor of the selection gate line SSL on the bit line side is rendered conductive, and a transistor of the selection gate line GSL on the source line side is rendered nonconductive. The bit line of a cell to be programmed is set at 0 V, and the bit line of a program inhibiting cell is set at Vcc. Each channel of memory cells in a NAND cell unit is set at the ground potential by a 0-V bit line.

When a program voltage is applied to the gate of a selected cell, a large potential difference is produced between the floating gate and the channel.

Consequently, electrons are injected into the floating gate by an FN tunnel current, and the cell is programmed.

In a program inhibiting cell, the channel of a selected NAND cell unit is precharged by a Vcc bit line.

When word lines of the selected NAND cell unit, i.e., a selected word line to which the program voltage is applied and unselected word lines to which the pass voltage is applied rise, series capacitances are coupled through the word lines, floating gates, channels, and p-wells of the cells to increase the channel capacitance.

As described above, the channel potential of a program inhibiting NAND cell unit in a selected block is determined by the capacitive coupling of word lines and channels. Therefore, to sufficiently increase the program inhibit potential, it is important to sufficiently charge the channels at initial and increase the capacitive coupling ratio between the word lines and the channels.

A coupling ratio B between word lines and channels is given by:

$$B=Cox/(Cox+Cj)$$

where Cox is the total sum of gate capacitances between word lines and channels, and Cj is the total sum of junction capacitances between the sources and drains of cell transistors. The channel capacitance of the NAND cell unit is the total of the total sum Cox of the gate capacitances and the total sum Cj of the junction capacitances. The overlap capacitances between selection gates and sources, the capacitances between bit lines and sources/drains, and the like as other capacitances are ignored since they are much smaller than the total channel capacitance.

FIG. 5 shows prior art of a peripheral core circuit of a sense amplifier circuit S/A. FIG. 6 is a timing chart showing a program operation and a program verify read operation of the circuit.

In FIGS. 5 and 6, reference symbols LOAD, SBL, DCB, BLSHF, $\phi_{latch1}$, and $\phi_{latch2}$ denote control signals supplied to a sense amplifier circuit S/A; and $N_{sense}$, a bit line potential sense node.

Referring to FIG. 5, the sense amplifier circuit S/A comprises a p-channel transistor M2 as a constant-current source, an n-channel transistor M1 for bit line potential clamping, a latch circuit LT, an n-channel transistor M3, a transfer gate NMOS transistor M4 for sense amplifier circuit S/A resetting, an NMOS transistor MS for forcibly inverting the data in the sense amplifier, an NMOS transistor M7 for sensing, and an NMOS transistor M6 for inverse read latch control. The p-channel transistor M2 charges the bit line BL for a predetermined period on the basis of a precharge control signal LOAD (corresponding to an output $CM_{out}$ of the current mirror circuit shown in FIG. 1). The n-channel transistor M1 is inserted in series into the bit line BL and has a gate to which a control voltage BLSHF is applied. The latch circuit LT latches memory cell data read out to a sense node $N_{sense}$ between the p-channel transistor M2 and the n-channel transistor M1.

The n-channel transistor M3 discharges electric charge in the sense node $N_{sense}$ for a predetermined period on the basis of a discharge control signal DCB. The NMOS transistor M4 is inserted between the sense node $N_{sense}$ and a second storage node Q of the latch circuit LT and has a gate driven by a control signal SBL. The NMOS transistor M5 is connected between a first storage node /Q ("/" indicates inversion in the remainder of this specification) of the latch circuit LT and a ground potential and turned on by a first data latch control signal $\phi_{latch1}$ applied to its gate for a predetermined period. The NMOS transistor M7 is connected in series with the NMOS transistor M5 between the first storage node /Q of the latch circuit LT and the ground potential and has a gate connected to the sense node $N_{sense}$. The NMOS transistor M6 is connected in series with the NMOS transistor M7 between the first storage node /Q of the latch circuit LT and the ground potential and turned on by a second data latch control signal (inverse read latch control signal) $\phi_{latch2}$ applied to its gate for a predetermined period.

The latch circuit LT is a flip-flop circuit in which the input nodes and output nodes of two CMOS inverter circuits IV1 and IV2 are cross-coupled (inversely connected in parallel).

In this arrangement, the input node (first storage node /Q) of the first CMOS inverter circuit IV1 is an sense amplifier inverting signal input node. The input node (second storage node Q) of the second CMOS inverter circuit IV2 is connected to an input/output circuit I/O through a data bus and functions as a reset node.

Read, erase, and program operations of the sense amplifier circuit S/A shown in FIG. 5 will be described below.

In a normal read operation of the EEPROM, the transistors M3 and M4 are turned on for a predetermined period to reset the latch circuit LT, setting the nodes Q and /Q at "L" and "H", respectively. After that, the bit line BL is charged by a constant current from the transistor M2. While the constant current is kept flowed, the bit line is discharged by a cell current ICELL generated in accordance with the level of the threshold voltage of the cell transistor. When a predetermined time elapses, the transistor M5 is turned on.

If data "1" is read out from the NAND memory cell unit to the bit line BL, a cell current flows. Then, the bit line potential lowers, the transistor M7 is kept OFF, and the node /Q remains level "H" as the reset state of the latch circuit LT. Conversely, if data "0" is read out from the NAND memory cell unit to the bit line BL, no cell current flows. The bit line potential is kept at level "H", the transistor M7 is turned on, and stored data in the latch circuit LT is forcibly inverted. Consequently, the nodes /Q and Q change to levels "L" and "H", respectively. Data in the node Q of the latch circuit LT corresponding to a selected column is read out to the input/output circuit I/O through the data bus.

When the EEPROM is to be erased, the sense amplifier circuit S/A is used in an erase verify read operation. In this operation, the sense amplifier circuit S/A operates in the same manner as in the normal read operation. If the cell transistor is erased (if data "1" is stored), the nodes /Q and Q change to levels "H" and "L", respectively. Conversely, if the cell transistor is not erased (if data "0" is stored), the nodes /Q and Q change to levels "L" and "H", respectively. Since it is determined that the erase is incomplete if even one of the nodes Q of all the sense amplifier circuits simultaneously operating is level "H", an erase restart signal is output to restart the erase operation on the basis of this data.

When the EEPROM is to be programmed, program/ unprogram data is applied to input data from the data bus to the node Q of the latch circuit LT corresponding to a selected column. If data "0" is input, the node Q changes to level "L". If data "1" is input, the node Q changes to level "H". When the transistor M4 is turned on, the data in the node Q is transferred to the bit line BL through the transistor M4. During the program operation, the channel in the selected memory cell is booted to an intermediate potential. Thus, the cell is programmed if data "L" is applied to the bit line BL. However, it is not programmed if data "H" is applied.

To obtain a high-speed, high-reliability EEPROM, it is necessary to narrow the cell transistor threshold voltage distribution after programming operation. As described previously, whenever programming is performed the programmed data is read out (program verify read) and compared with the data to be programmed. If the data is insufficiently programmed, programming is continued. When the programmed data agrees with the data to be programmed, programming is complete.

In this program verify read operation, a conventional approach is to perform a read operation with program data stored in the sense amplifier circuit S/A without resetting the latch circuit LT. This program verify read operation is the same as a normal read operation except that no reset operation for the latch circuit LT is performed.

The nodes Q of the latch circuits LT corresponding to unprogrammed cells to be kept erased and programmed cells which is changed to programmed state from erased state change to level "H". The node Q of the latch circuit LT corresponding to an insufficiently programmed cell of which programming is not completed changes to level "L". Therefore, only an insufficiently programmed cell can be reprogrammed by using the data in the node Q as it is.

Also, a verify voltage (reference voltage) Vref (>0 V) is applied to a selected word line in the program verify read operation, whereas 0 V is applied to a selected word line in the normal read operation. Therefore, cell transistors having threshold voltages between 0 V and Vref are reprogrammed until the minimum value of the threshold voltage distribution after programming operation becomes equal to or higher than the verify voltage (reference voltage) Vref. In this manner, a sufficient margin of programming variation for a given read voltage is assured.

The sense amplifier circuit S/A shown in FIG. 5, however, has a problem caused by a rise in the source-side potential (e.g., the ground potential) resulting from a voltage drop in the resistance component of the common source line which is formed of a diffusion layer or the like. This problem will be described in detail below.

The speeds of operations such as program/erase of an EEPROM are lower than those of a DRAM. To perform high-speed program/read, a page program method or a page read method is often used. In the page program method, program data is simultaneously programmed (in units of pages) from a plurality of column lines into a plurality of memory cells connected to the same row line (word line). In the page read method, stored data are simultaneously read out from a plurality of memory cells connected to the same row line (word line) to a plurality of column lines and sensed/amplified (read out in units of pages).

A program verify read operation when page programming is performed for this EEPROM will be described below.

Assume that the page size is 512 columns, all cells before programming are in an erased state, and only one cell transistor with a very high programming speed exists. Assume also that the cell with a high programming speed is programmed to have a threshold voltage of about 0 to 1 V and the threshold voltages of the other cells are decreased to 0 V or less by first programming.

If verification is performed in this state, a cell current flows in cells in 511 columns except for the very fast programming cell. A voltage drop takes place by the parasitic resistance component of a connection wiring (e.g., a diffusion layer) on the source side of a NAND memory cell unit, and the ground potential rises.

The cell with a high program speed in this state reduces the cell current due to the rise of the ground potential (and also increases the apparent threshold voltage due to a back bias effect resulting from the rise of the ground potential). This cell appears to be sufficiently programmed (i.e., the threshold voltage appears to have become higher than the actual threshold voltage) even if the cell is not sufficiently programmed. Consequently, it is erroneously determined by the verify operation that the cell with a high program speed is completely programmed.

When a page read is performed after all cells are completely programmed, however, most cells are programmed and hence no cell current flows. Therefore, the ground potential does not rise.

Accordingly, in a read operation with no ground potential rise, a cell current in the cell with a high program speed appears to flow easier than in a verify operation after the first programming. Consequently, although the cell with a high program speed is found to be completely programmed as described above, the cell may not have been sufficiently programmed to result in incomplete programming.

This problem will be described in detail below.

First, when a program command is externally input to the chip, a program operation is started. The control signals BLSHF and DCB change to Vcc, and the bit lines BL are grounded (the bit line potential is reset). Before program data is loaded into the sense amplifier circuits S/A, the control signal LOAD changes to Vss, the control signal $\phi_{latch1}$ changes to Vcc, and data in the sense amplifier circuits S/A are reset.

That is, the nodes Q and /Q of the latch circuits LT in all the sense amplifier circuits S/A of one page are reset to Vcc and Vss, respectively.

Next, program data is loaded from the input/output circuit I/O through the data bus and latched by the latch circuit LT in each sense amplifier circuit S/A. The nodes Q and /Q are set to Vcc or Vss, respectively, or vice versa in accordance with the data. That is, the node Q is set at Vss in a sense amplifier circuit S/A used for programming a memory cell. The node Q is set at Vcc in a sense amplifier circuit S/A not for programming the memory cell.

Subsequently, the bit lines BL are started to-be charged on the basis of the data latched in the latch circuit LT. That is, the bit line BL to be programmed stores potential Vss, and each bit line BL not to be programmed is charged to Vcc. One of the word lines $WL_0$ to $WL_{15}$, e.g., the word line $WL_2$ is selected and used to program so that this word line $WL_2$ rises to a program voltage Vpgm (about 20 V), and the other word lines change to a voltage Vpass (about 10 V). By this operation, a memory cell $CELL_2$ is programmed as described earlier.

After the programming, a program verify read operation is started. That is, the word line $WL_2$ used in the programming changes to a verify voltage (reference voltage) Vref (about 0.5 V). The other word lines change to a read voltage Vread (about 4.5 V).

The control signal LOAD to be applied to the gate of the load transistor M2 is controlled to about 1.8 V to balance the load current with the memory cell current. In this state, a read operation is done.

For example, the cell current in an erased memory cell is at least around 2 $\mu$A so that the current of the load transistor is set to about 1.5 $\mu$A in accordance with the cell current.

Accordingly, no cell current flows in a programmed memory cell, i.e., in a memory cell whose threshold voltage is higher than the verify voltage (reference voltage) Vref (about 0.5 V), so the potential of the bit line BL rises. If the bit line BL is charged to Vcc, the read time becomes long. Therefore, the control signal BLSHF to be applied to the gate of the high-voltage MOS transistor M1 is clamped to, e.g., 1.8 V. Consequently, if the potential of the bit line BL rises to, e.g., 0.9 V, the transistor M1 is cut off, and the sense node $N_{sense}$ changes to Vcc.

When the sense node $N_{sense}$ changes to Vcc, the data latch signal $\phi_{latch1}$ changes to Vcc. When the sense node $N_{sense}$ is Vcc, i.e., when a cell found to have a threshold voltage higher than the verify potential Vref is read out, the nodes /Q and Q change to Vss and Vcc, respectively, because the sense node $N_{sense}$ is Vcc.

In a sense amplifier circuit S/A not for programming, the node Q is preset to Vcc. Therefore, programming is complete when the potentials of the nodes Q in all the sense amplifier circuits S/A of one page change to Vcc.

If, however, a memory cell is insufficiently programmed in a sense amplifier circuit S/A used for programming, the sense node $N_{sense}$ remains Vss. Therefore, the latch circuit LT is not inverted, and the node Q maintains Vss.

The problem in the above conventional program operation and program verify read operation will be described below with reference to FIGS. 7 and 8.

Assume that programming is performed through, e.g., the word line $WL_{15}$ in FIG. 7. Assume also that all of memory cells $CELL_{i1}$ to $CELL_{i5}$ are so programmed as to increase their threshold voltages.

Memories have process variations in fabrication, so the coupling ratios and the like of memory cells are different. For example, assume that the memory cell $CELL_{i5}$ has a larger coupling ratio than those of the other memory cells and hence is programmed faster.

In a verify read operation after programming operation, the other memory cells are erased.

Therefore, the potential of a source node $S_{i5}$ of the memory cell $CELL_{i5}$ rises due to memory cell currents and resistance components $R_0$, $R_{i1}$, $R_{i2}$, ..., of source lines. The level of rise depends upon cell currents $I_{CELLi1}$ to $I_{CELLi4}$ and the resistance components and is represented by $I_{CELLi1} \times R_0 + I_{CELLi2} \times (R_0 + R_{i1}) + I_{CELLi3} \times (R_0 + R_{i1} + R_{i2}) + I_{CELLi4} \times (R_0 + R_{i1} + R_{i2} + R_{i3})$.

Consequently, even when verify voltage (reference voltage) Vref =0.5 V, if the potential of the source node $S_{i5}$ of the memory cell $CELL_{i5}$ is about 0.5 V, it is determined by verify read that the memory cell $CELL_{i5}$ is programmed even though the threshold voltage of the memory cell $CELL_{i5}$ is nearly 0 V.

When the memory cells $CELL_{i1}$ to $CELL_{i4}$ are programmed after the memory cell $CELL_{i5}$ which is programmed faster than the other cells is completely programmed, the threshold voltages of the memory cells $CELL_{i1}$ to $CELL_{i4}$ take positive values.

In a subsequent read operation, therefore, the potential of the source node $S_{i5}$ of the memory cell $CELL_{i5}$ does not rise to $I_{CELLi1} \times R_0 + I_{CELLi2} \times (R_0 + R_{i1}) + I_{CELLi3} \times (R_0 + R_{i1} + R_{i2}) + I_{CELLi4} \times (R_0 + Ri_1 + Ri_2 + Ri_3)$ unlike when the memory cell $CELL_{i5}$ alone is initially programmed.

Consequently, the threshold voltage of the memory cell $CELL_{i5}$ is read out to Vref or less. As shown in FIG. 8, therefore, the distribution of threshold voltages after programming operation produces a distribution foot of threshold voltages lower than the verify voltage (reference voltage) Vref. If data programming is insufficient, it is sometimes determined in a later read operation that these memory cells are erased cells, resulting in low reliability.

In one known method of reducing the influence of the resistance components of source lines as described above, contacts with metal source wirings are formed in the middle of diffusion layer source lines to thereby increase the number of contacts. Unfortunately, in this method an increase in the pattern area resulting from the increase of the contacts is no longer negligible.

In a NAND cell type EEPROM, it is possible to divide one page into a plurality of groups and program the page by programming a plurality of number of times, i.e., a divisional program scheme is permitted. For example, one page of a 64-Mbit NAND cell type EEPROM has 528 bytes (512 bytes +16 bytes) including 16 bytes of ECC (redundancy bits for error bit check and correction). When page programming is performed by this scheme, it is possible to divide one page into nine groups in units of 64 bytes and program 528 bytes in units of 64 bytes either sequentially or at random.

This scheme is effective when a mass of data to be handled by a user is smaller than 512 bytes.

FIG. 9 shows a part of a memory cell array to explain a divisional program operation in an EEPROM.

Assume that columns of one page selected by the same word lines are divided into first to ninth groups to sequentially program 528 bytes of the page. First, only columns in the first group are selected, and program data is loaded into, e.g., a 64-byte sense amplifier circuit S/A corresponding to this group (unprogram data is loaded into other sense amplifier circuits) to perform first divisional programming. Next, only columns in the second group are selected, and data is loaded into a 64-byte sense amplifier circuit S/A corresponding to this group to perform second divisional programming. A similar operation is repeated to completely program 528 bytes while the columns to be selected are changed.

Even in this divisional programming, however, the problem as described previously arises. That is, the source line of a memory cell initially programmed in divisional programming appears to rise.

The reason for this is as follows. Since all memory cells which are not initially programmed in divisional programming are erased, memory cell currents flow in all memory cells of these NAND cell units.

Consequently, even though the threshold voltage of a memory cell initially programmed in divisional programming is lower than the verify voltage (reference voltage) Vref, this memory cell is determined as a program pass in a program verify read.

This problem is attributed to the conventional circuit itself. That is, in the conventional circuit shown in FIG. 5, a sense amplifier circuit S/A once found to be sufficiently programmed is not subjected to program verify determination in the next cycle; the program verify determination result is not updated.

As one method of avoiding this problem, it is proposed to use a storing circuit for storing program data, a storing circuit for storing verification result data, and a comparator for comparing these data.

If, however, these two storing circuits and the comparator as described above are formed in the chip, the chip area increases to increase the chip cost. On the other hand, if these two storing circuits and the comparator are provided outside the chip, the load on the system outside the chip increases. Additionally, the program time cannot be shortened because comparison data are exchanged between the chip and the external system.

A column circuit in a conventional EEPROM in which two storing circuits and a comparator as described above are formed in a chip will be briefly described below with reference to FIG. 10.

In FIG. 10, reference symbol REG-NTOGL denotes output data from a register (not shown) storing program data; Output, program verification result data; and N-Input, data of comparison result of REG-NTOGL with Output.

First, the output data REG-NTOGL from the register storing program data is stored as data REG-NQ in a register (not shown) and also applied as the comparison result data N-Input to the gate of a transistor T15.

The comparison result data N-Input changes to level "L" when programming is to be performed and to level "H" when the erased state is to be maintained.

The comparison result data N-Input is at level "L" on a bit line BL to be programmed. Accordingly, an output T5 from an inverter including transistors T13 and T14 and the transistor T15 changes to level "H". The output T5 from this inverter is applied to an inverter T6. An output T4 from the inverter T6 is applied to a NOR gate T3 for bit line programming. A transistor T1 for bit line programming is driven by an output from the NOR gate T3 and applies a program voltage Vpp–Vth to the bit line to be programmed. Vth is the gate threshold voltage of the transistor T1.

On the other hand, the comparison result data N-Input is at level "H" on a bit line BL not to be programmed. Therefore, the transistor T1 for bit line programming is not driven and maintains the ground level, so no programming is performed.

After the programming, verify read is performed.

Consequently, the bit line BL through which the data of the programmed memory cell is read out changes to level "H", and the bit line BL through which the data of the erased memory cell is read out changes to level "L".

Conversely, the program result output data Output changes to level "L" on the bit line BL through which the data of the programmed memory cell is read out data of and to level "H" on the bit line BL through which the data of the erased memory cell is read out.

Next, the program result output data Output is compared with the output data REG-NTOGL from the register storing the program data, and the comparison result data N-Input is updated. In this manner, the program operation and the program verify read operation described above are repeated.

Unfortunately, the circuit as described above requires the registers for storing program data and comparison result data in addition to a sense amplifier circuit S/A. This increases the chip area. Especially in a NAND cell type EEPROM, adding two such registers to all of sense amplifier circuits S/A of one page or 528 bytes increases the chip area and the chip cost.

In the conventional NAND cell type EEPROM as described above, if a memory cell with a high program speed exists in a plurality of memory cells, the potential of a common source line of these memory cells rises when a verify read operation is performed after programming operation or when a page divisional program operation is performed. In addition, the potential of the common source line during the verify operation after programming operation rises to a different extent from that during a normal read operation. This results in incomplete programming.

Also, in the conventional NAND cell type EEPROM as described above, erroneous program sometimes occurs although the probability is low. Erroneous program means that when page programming is performed, data "0" is erroneously programmed in a memory cell which is intended to be kept erased in one selected page. This erroneous program occurs when the channel potential is not controlled as expected by capacitive coupling with a word line. Examples are a case wherein the initial charge potential (Vcc in FIG. 2B) of a bit line connected to a memory cell to be kept erased is insufficient, a case wherein the capacitive coupling ratio of a word line to a channel is small, and a case wherein the node of a channel has a leak path. In any of these cases, the channel potential does not sufficiently rise due to the capacitive coupling with a word line. Consequently, electrons are erroneously injected to cause erroneous program.

In the conventional NAND cell type EEPROM, this erroneous program cannot be detected even if program verify read operation is performed. This is so because a conventional sense amplifier circuit S/A is not so designed as to be able to detect such erroneous program.

This will be described in detail below with reference to FIG. 5.

A program operation and a verify read operation of this sense amplifier circuit S/A shown in FIG. 5 will be briefly described below. In accordance with program data "0" or "1", an I/O line supplies Vss or Vcc to a node Q of the latch circuit. A connection node of NMOS transistors M4 and M1 connected in series, which connects the node Q to a bit line BL, is a sense node $N_{sense}$. A charge PMOS transistor M2 and a discharge NMOS transistor M3 are connected to the sense node $N_{sense}$ and the sense node $N_{sense}$ is precharged to Vcc when programming is to be performed. When the NMOS transistors M4 and M1 are turned on, data in the node Q is supplied to the bit line BL.

By the aforementioned program operation, a selected memory cell connected to a bit line to which data "0" is supplied is programmed to become E-type. A memory cell connected to a program inhibiting bit line to which data "1" is supplied is stored in a D-type erased state.

In verify read operation, a verify voltage (reference voltage) for threshold detection is applied to word lines of a selected page. As in a normal read operation, whether a memory cell is conducting or not is detected. Since a memory cell in which "0" is programmed does not conduct, a bit line does not lower the sense node $N_{sense}$ when the NMOS transistor M1 is turned on. Therefore, the sense node $N_{sense}$ charged to Vcc by the PMOS transistor M2 during this period turns on a NMOS transistor M17. At this time, an NMOS transistor M5 is turned on by a control signal $\phi_{latch1}$ Therefore, the node /Q is grounded when the NMOS transistor M7 is turned on. Consequently, the latch circuit is forcibly inverted, and the loaded value Vss of the node Q is changed to Vcc. Meanwhile, since a program inhibited memory cell conducts, the sense node $N_{sense}$ is discharged through the bit line, and the NMOS transistor M7 is turned off. Accordingly, the latch circuit is not inverted, and the node Q maintains the loaded value Vcc.

If an insufficiently programmed memory cell exists in the selected page, a sense amplifier circuit S/A whose node Q is not inverted to Vcc in verify read operation remains. Therefore, the data program and verify read operations are repeated, and programming is complete if it is determined that the nodes Q of all the sense amplifier circuits S/A have changed to Vcc.

In the conventional sense amplifier circuit S/A shown in FIG. 5 with the above described program/verify read method, programming is complete when the node Q of the latch circuit changes to Vcc in both of a programmed memory cell (including an erroneously programmed memory cell which is supposed to be kept in a program inhibited state, i.e., an erased state) and a memory cell which is kept erased in accordance with a program inhibiting instruction. That is, the conventional circuit has no erroneous program detecting function.

In the conventional EEPROM as described above, erroneous program cannot be detected because the erroneous program is passed during verify read operation. This problem is conventionally solved by providing an error checking/correcting circuit (ECC circuit) inside or outside the EEPROM chip. However, error check requires an extra time, and the chip size increases if the ECC circuit is provided inside the chip. Even if the ECC circuit is provided outside the chip, the system cost increases.

BRIEF SUMMARY OF THE INVENTION

Accordingly, it is an object of the present invention to provide a semiconductor memory device and its program method by which even if a memory cell with a high program speed exists in a plurality of memory cells, it is possible to prevent incomplete programming by programming taking account of variations in a rise of the potential of a common source line of a plurality of memory cells during a verify read operation after programming operation, thereby improving the reliability of a program verify read operation and a page divisional program operation.

It is another object of the present invention to provide a semiconductor memory device and its program method by which a sense amplifier circuit S/A corresponding to a memory cell to be kept erased is identified, and erroneous program determination can be performed after the identified circuit is passed with respect to program data in a program verify read operation.

According to a first aspect of the present invention, there is provided a semiconductor memory device comprising a memory cell array having data lines and word lines crossing each other and having electrically programmable nonvolatile memory cells arranged at intersections of the data lines and word lines; sense amplifier circuits connected to the data lines and having a function of reading out and latching data of the memory cell array through sense nodes and a function of loading and latching program data of the memory cell array; data storing circuits for storing the program data loaded into the sense amplifier circuits; and reset circuits for resetting the sense amplifier circuits instructed to perform programming by the load data to the load data in accordance with the data stored in the data storing circuits.

Each of the sense amplifier circuits comprises a latch circuit for latching memory cell data read out to the sense node; a sensing NMOS transistor connected between a first storage node of a pair of complementary storage nodes of the latch circuit and a ground potential and having a gate connected to the sense node; a first data latching NMOS transistor connected in series with the sensing NMOS transistor between the first storage node of the latch circuit and the ground potential and turned on by a first data latch signal supplied to a gate thereof for a predetermined period; and a transfer gate NMOS transistor connected between the sense node and a second storage node of the pair of complementary storage nodes of the latch circuit, turned off when the memory cell data is read out, and turned on when the memory cell is programmed.

The sense amplifier circuit further comprises a second data latching NMOS transistor connected in series with the sensing NMOS transistor between the second storage node of the latch circuit and the ground potential and turned on by a second data latch signal for an inverse read operation supplied to a gate thereof.

A potential of the second storage node of the latch circuit in the sense amplifier circuit instructed to perform programming is reset to a ground potential before program verify read operation.

Each of the data storing circuits comprises a first NMOS transistor having a drain connected to the first storage node of the latch circuit, a gate to which a program data latch signal is input, and a source connected to a program data storage node; and a second NMOS transistor having a drain connected to the second storage node of the latch circuit and a gate connected to the program data storage node, and in which each of the reset circuits comprises a third NMOS transistor having a drain connected to a source of the second NMOS transistor, a gate to which a reset signal is input, and a source connected to a ground potential.

A potential of the program data storage node is charged in the data storing circuit when the corresponding sense amplifier circuit is instructed to perform programming by the load data.

The memory device further comprises one of a program data storing capacitor connected to the program data storage node and a program data latching flip-flop circuit connected to the program data storage node.

Each of the data storing circuits comprises a first NMOS transistor having a drain connected to the second storage node of the latch circuit, a gate to which a program data latch signal is input, and a source connected to a program data storage node; and a first PMOS transistor having a drain connected to the first storage node of the latch circuit and a gate connected to the program data storage node, and in which each of the reset circuits comprises a second PMOS transistor having a drain connected to a source of the first PMOS transistor, a gate to which a reset signal is input, and a source connected to a power supply potential.

A potential of the program data storage node is discharged in the data storing circuit when the corresponding sense amplifier circuit is instructed to perform programming by the load data.

A programming of a page of memory cells selected by a word line is performed by:

(a) loading program data into latch circuits of the sense amplifier circuits;

(b) identifying a sense amplifier circuit instructed to perform programming and storing an identification result in a data storing circuit corresponding to the identified sense amplifier circuit;

(c) performing a program operation;

(d) resetting data in the sense amplifier circuit instructed to perform programming to load program data in accordance with the identification result stored in the data storing circuit;

(e) performing a program verify read operation; and (f) determining whether latching data in all the sense amplifier circuits of one page indicate that all the memory cells of one page are completely programmed, ending the program operation if all the memory cells are completely programmed, and returning to step (c) if all the memory cells are not completely programmed.

Plural memory cells respectively connected each of the data lines are simultaneously selected, electric charges on corresponding data lines are discharged or not discharged in accordance with a threshold voltage of the plural memory cells when the plural memory cells are selected, and discharge paths of the plural memory cells are connected together.

According to a second aspect of the present invention, there is provided a semiconductor memory device comprising:

a memory cell array having data lines and word lines crossing each other and having electrically programmable nonvolatile memory cells arranged at intersections of the data lines and word lines;

sense amplifier circuits connected to the data lines and having a function of reading out and latching data of the memory cell array through sense nodes and a function of loading and latching program data of the memory cell array;

data storing circuits for storing the program data loaded into the sense amplifier circuits; and reset circuits, where a programming of one page of memory cells selected by the word line is divisionally performed by plural divisional programmings, for resetting the sense amplifier circuits which have been instructed to perform programming by the load data of first to (n−1)th (n is an integer equal to or more than two) divisional programmings at a time of n-th divisional programming to the load data in accordance with the data stored in the data storing circuits.

An inverse read operation in which a logic of the sense amplifier circuits is inverted as compared to a normal read operation is performed at a time of n-th divisional programming before or after n-th divisional program data are loaded into the sense amplifier circuits.

Data of the sense amplifier circuits are reset to the load data in accordance with the data stored in the data storing circuits before or after n-th divisional program data are loaded into the sense amplifier circuits and a program verify read operation is performed before a program operation is performed.

According to a third aspect of the present invention, there is provided a semiconductor memory device comprising:

a memory cell array having data lines and word lines crossing each other and having electrically programmable nonvolatile memory cells arranged at intersections of the data lines and word lines;

sense amplifier circuits connected to the data lines and having a function of reading out and latching data of the memory cell array through sense nodes and a function of loading and latching program data of the memory cell array; and data storing circuits for storing the program data loaded into the sense amplifier circuits;

wherein a program operation and a program verify read operation are repeatedly performed until first program pass is determined, then the sense amplifier circuits instructed to perform programming are reset to the load data in accordance with the data stored in the data storing circuits, and a program verify read operation is performed again.

The program operation and the program verify read operation are cyclically performed in a step-up programming method until first program pass is determined, with a program voltage being stepwise increased at each cycle of the program operation and the program verify read operation.

The program operation is further performed for a memory cell, identified as an insufficient programmed cell by the program verify read operation performed again, with the program voltage being reset to an initial voltage of the step-up programming method.

The program operation is further performed for a memory cell, identified as an insufficient programmed cell by a program verify read operation performed again, with the program voltage being reset to a voltage which is higher than an initial voltage of the step-up programming method by one or two steps.

According to a fourth aspect of the present invention, there is provided a semiconductor memory device comprising:

a memory cell array having data lines and word lines crossing each other and having electrically programmable nonvolatile memory cells arranged at intersections of the data lines and word lines; and sense amplifier circuits connected to the data lines and having a function of reading out and latching data of the memory cell array through sense nodes and a function of loading and latching program data of the memory cell array, wherein if it is determined that memory cells to be programmed have been sufficiently programmed after a program operation and a program verify read operation are cyclically performed, an inverse read operation in which a logic of the sense amplifier circuits is inverted as compared to a normal read operation and in which the word line is set to a voltage which is equal to or higher than a normal read voltage and not higher than a program verify read voltage is performed to reset the sense amplifier circuits to the load data, and a program verify read operation is performed again.

According to a fifth aspect of the present invention, there is provided a semiconductor memory device comprising:

a memory cell array having data lines and word. lines crossing each other and having electrically programmable nonvolatile memory cells arranged at intersections of the data lines and word lines; and sense amplifier circuits connected to the data lines and having a function of reading out and latching data of the memory cell array through sense nodes and a function of loading and latching program data of the memory cell array, wherein, after a program operation and before program verify read operation, an inverse read operation in which a logic of the sense amplifier circuits is inverted as compared to a normal read operation and in which the word line is set to a voltage which is equal to or higher than a normal read voltage and not higher than a program verify read voltage is performed to reset the sense amplifier circuits to the load data.

According to a sixth aspect of the present invention, there is provided a semiconductor memory device comprising:

a memory cell array having data lines and word lines crossing each other and having electrically programmable nonvolatile memory cells arranged at intersections of the data lines and word lines;

sense amplifier circuits connected to the data lines and having a function of reading out and latching data of the memory cell array through sense nodes and a function of loading and latching program data of the memory cell array;

data storing circuits for storing the program data loaded into the sense amplifier circuits; and an erroneous program detecting circuit for reading into the sense amplifier circuits information data indicating that an erroneous program occurred based on a logical combination of the data stored in the data storing circuits during a program operation and data appeared at the sense nodes by a normal read operation or a program verify read operation.

Each of the sense amplifier circuits has a latch circuit having complementary first and second storage nodes, the second storage node being selectively connected to the data line through the sense node; each of the data storing circuits comprises a memory MOS transistor of which gate is a program data storage node and which dynamically stores a potential corresponding to the program data loaded into the latch circuit and a programming MOS transistor connected between the program data storage node of the memory MOS transistor and one of the first and the second storage nodes of the latch circuit; and the erroneous program detecting circuit comprises an erroneous program checking MOS transistor connected to the memory MOS transistor in series between the second storage node of the latch circuit into which the program data is loaded and a ground potential and turned on after the program operation is ended and a sensing MOS transistor whose gate is controlled in accordance with a potential of the sense node.

The memory MOS transistor of the data storing circuit is an NMOS transistor, and the programming MOS transistor is connected between the second storage node of the latch circuit and the program data storage node of the memory MOS transistor.

The memory MOS transistor of the data storing circuit is a PMOS transistor, and the programming MOS transistor is connected between the first storage node of the latch circuit and the program data storage node of the memory MOS transistor.

The data storing circuit further comprises an NMOS transistor as a second memory MOS transistor storing initial program data loaded into the latch circuit, a gate of the NMOS transistor being the program data storage node which is common to a gate of the PMOS transistor as the memory MOS transistor, and which memory device further comprises a resetting MOS transistor connected in series with the NMOS transistor between the second storage node of the latch circuit and the ground potential and turned on by a reset signal before a program verify read operation is performed to reproduce initial program data in the latch circuit in accordance with a potential of the program data storage node.

A programming of a page of memory cells selected by a word line is performed by:

(a) loading data into latch circuits of the sense amplifier circuits;

(b) identifying a sense amplifier circuit instructed to keep erased by the load data and storing an identification result in a storing circuit corresponding to the identified sense amplifier circuit;

(c) performing a program operation;

(d) performing a program verify read operation;

(e) determining whether latching data in all the sense amplifier circuits of one page indicate that all the memory cells of one page are completely programmed, ending the program operation if all the memory cells are completely programmed, and repeatedly performing the program operation and the program verify read operation if all the memory cells are not completely programmed; and (f) determining whether the erroneous program occurred after ending of the program operation based on a logical combination of the identification result stored in the storing circuit and program verify read data read out by the sense amplifier circuit.

The memory device further comprises a flag output circuit for setting a flag when the information data indicating that an erroneous program occurred is read out to the sense amplifier circuit.

Each of the sense amplifier circuits has a latch circuit having complementary first and second storage nodes, the second storage node being selectively connected to the data line through the sense node; each of the data storing circuits comprises a first NMOS transistor of which drain is connected to the first storage node of the latch circuit, gate is supplied with a program data latch signal, and source is connected to a program data storage node and a second NMOS transistor of which drain is connected to the second storage node of the latch circuit and gate is connected to the program data storage node; and the erroneous program detecting circuit comprises a third NMOS transistor of which drain is connected to a source of the second NMOS transistor, gate is supplied with a reset signal, and source is connected to a ground potential.

After data read out from a programmed memory cell by a normal read operation is latched into the latch circuit through the sense node, the erroneous program detecting circuit reads out the information data indicating that an erroneous program occurred to the sense amplifier circuit by resetting the sense amplifier circuit which has been instructed to perform programming by the load data based on the data stored in the data storing circuit among the sense amplifier circuits latching data indicating that the corresponding memory cells are programmed.

The semiconductor memory device of the present invention can easily detect erroneous program by comprising a data storing circuit and an erroneous program detecting circuit. The data storing circuit stores program data to be loaded into a sense amplifier circuit S/A. The erroneous program detecting circuit detects erroneous program in accordance with the logic of data stored in the data storing circuit during a program operation and data obtained in a sense node when a verify read operation is performed after programming of a memory cell array is complete. When detecting erroneous program, the erroneous program detecting circuit inverts the stored data in the sense amplifier circuit S/A to inform the user of the erroneous program. The data storing circuit is used to store program data to be loaded. This stored data functions as identification data for identifying a sense amplifier circuit S/A to be kept erased.

More specifically, the sense amplifier circuit S/A comprises a latch circuit having one latch node selectively connected to a data line through a sense node. In a program operation, the latch node is given level "L" indicating programming or level "H" indicating program inhibition in accordance with program data. All latch nodes change to level "H" after programming is completed. The erroneous program detecting circuit inverts level "H" in the latch node of a sense amplifier circuit S/A in which erroneous program has been performed, in accordance with logic of the stored data in the data storing circuit and the readout data from the sense node when a program verify read operation is performed.

In the present invention, the data storing circuit can be made up of few elements by the use of a dynamic memory similar to a DRAM cell. The erroneous program detecting circuit for inverting the node of the sense amplifier circuit S/A in accordance with the logic of the stored data in the data storing circuit and the data in the sense node can also be simply constructed by adding an erroneous program checking MOS transistor in series to the data storing circuit. This MOS transistor is turned on by a check control clock after a program operation. Therefore, even the addition of the erroneous program detecting function of the present invention does not greatly increase the number of elements and the chip area.

Additional objects and advantages of the present invention will be set forth in the description which follows, and in part will be obvious from the description, or may be learned by practice of the present invention.

The objects and advantages of the present invention may be realized and obtained by means of the instrumentalities and combinations particularly pointed out hereinbefore.

BRIEF DESCRIPTION OF THE SEVERAL VIEWS OF THE DRAWING

The accompanying drawings, which are incorporated in and constitute a part of the specification, illustrate presently preferred embodiments of the present invention and, together with the general description given above and the detailed description of the preferred embodiments given below, serve to explain the principles of the present invention in which.

DETAILED DESCRIPTION OF THE INVENTION

A preferred embodiment of a semiconductor memory device and its program method according to the present invention will now be described with reference to the accompanying drawings.

First Embodiment

Figure 11:
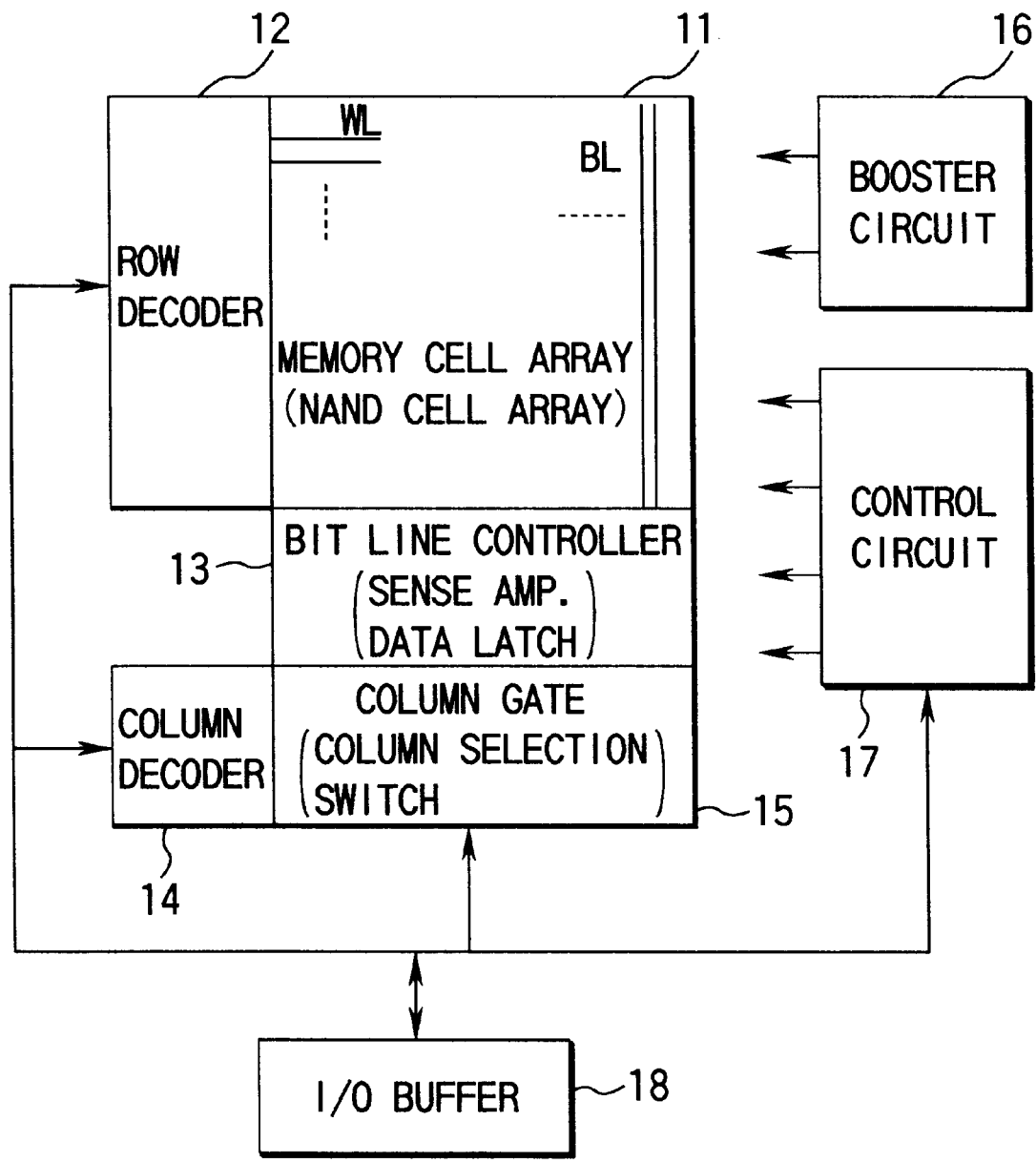
FIG. 11 is a block diagram showing a NAND cell type EEPROM according to a first embodiment of a semiconductor memory device of the present invention.

FIG. 11 shows the whole arrangement of a flush erasable NAND cell type EEPROM having a page program/page read function and a divisional program function according to the first embodiment of the semiconductor memory device of the present invention.

This EEPROM comprises a memory cell array 11, a row decoder 12, a bit line controller (a sense amplifier circuit S/A and a program data latch) 13, a column gate (column selection switch) 15, a column decoder 14, a data input/output (I/O) buffer 18, a booster circuit 16, and a control circuit 17. In the memory cell array 11, a plurality of NAND memory cell units form a matrix, and large numbers of bit lines BL and word lines WL extend in the column and row directions, respectively. The row decoder 12 selectively drives the word lines of the memory cell array 11 on the basis of externally input addresses.

The bit line controller 13 is connected to the bit lines of the memory cell array 11. The column gate 15 is connected to the bit line controller 13. The column decoder 14 controls the column gate 15 on the basis of externally input addresses and selects corresponding bit lines and sense amplifier circuits S/A. The data I/O buffer 18 is connected to the column gate 15. The booster circuit 16 supplies high voltages required for various operations, such as a program operation and an erase operation. The control circuit 17 controls the chip and interfaces with external devices.

In data program, erase, and read operations, the row decoder 12 selectively drives the word lines WL on the basis of address signals. A necessary voltage is supplied to the word line driver of the row decoder 12.

The bit line controller 13 includes a bit line driver for selectively supplying a necessary voltage to the bit lines BL in data program, erase, and read operations.

The control circuit 17 includes a sequence control means (e.g., a programmable logic array) for controlling erase/erase verify/program/program verify read/read operations for NAND memory cell units.

Figure 12:
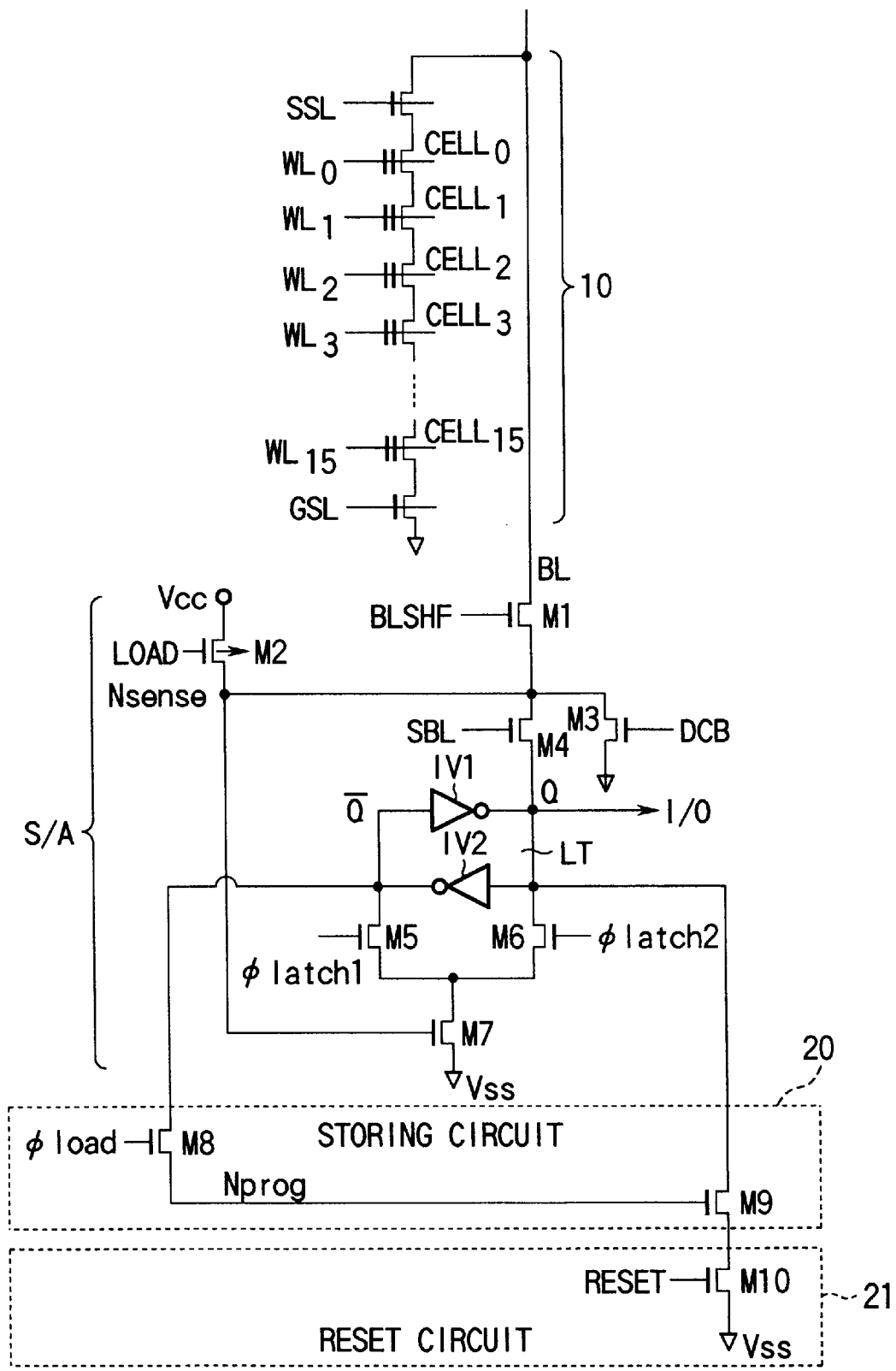
FIG. 12 is a circuit diagram showing the peripheral core circuit of a sense amplifier circuit S/A in the EEPROM shown in FIG. 11.

FIG. 12 shows an example of a peripheral core circuit of a sense amplifier circuit S/A in the EEPROM shown in FIG. 11. In FIG. 12, reference numeral 10 denotes a NAND memory cell unit in the memory cell array 11 shown in FIG. 11. Reference symbol S/A denotes a sense amplifier circuit S/A in the bit line controller 13 shown in FIG. 11. Reference numerals 20 and 21 denote a dynamic latch type storing circuit for storing a program instruction identification result and a reset circuit for resetting the data of the sense amplifier S/A to the loaded data in accordance with the data stored in the storing circuit 20 which are additionally connected to the sense amplifier circuit S/A.

LOAD, SBL, DCB, BLSHF, $\phi_{latch1}$, and $\phi_{latch2}$ denote control signals supplied to the sense amplifier circuit S/A. Also, $\phi_{load}$ and RESET denote control signals supplied to the storing circuit 20 and the reset circuit 21 added by the present invention; and $N_{prog}$, a program data storage node of the storing circuit 20.

Figure 1:
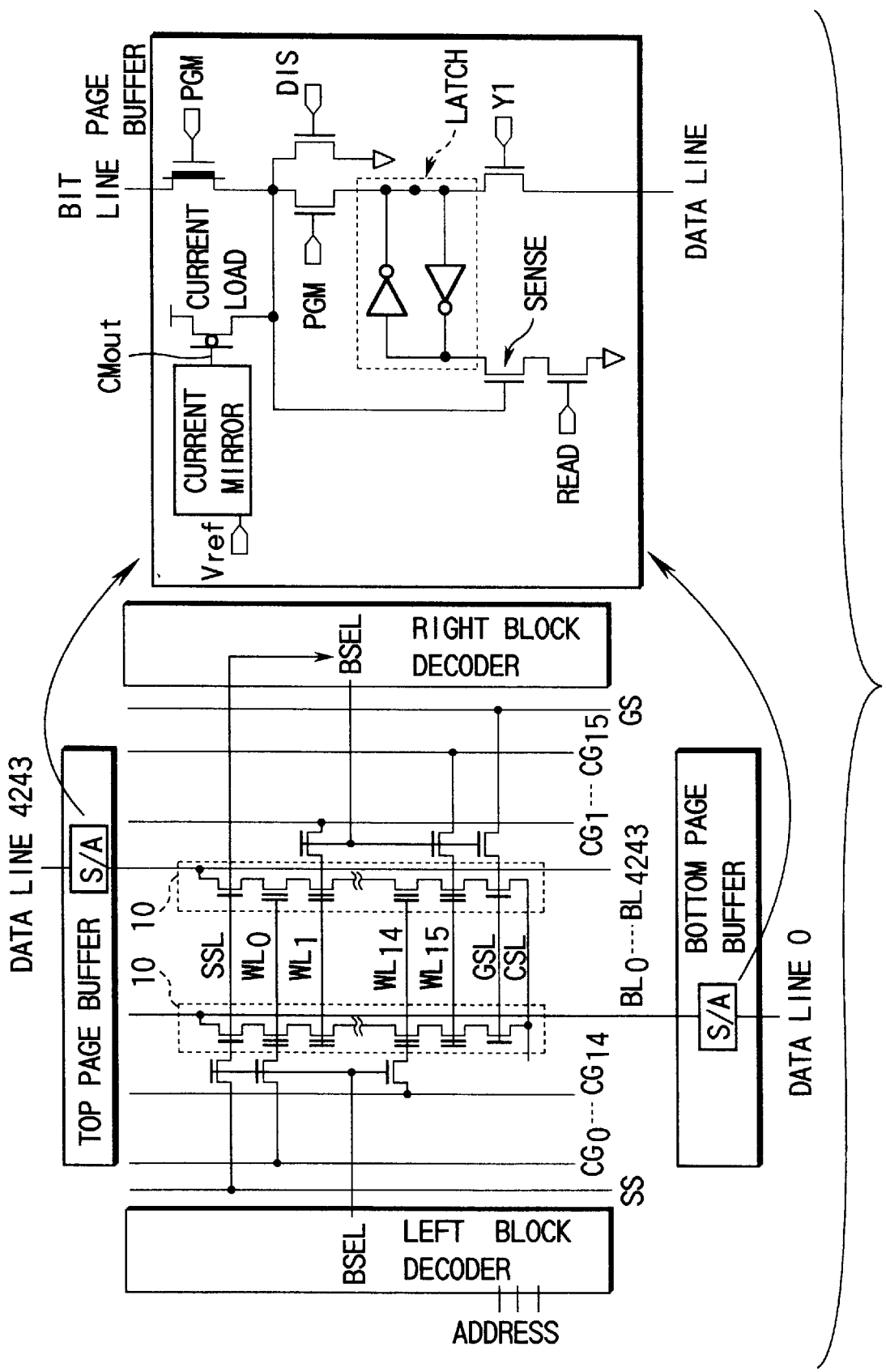
FIG. 1 is a schematic block diagram showing the whole arrangement of a memory cell array in a conventional NAND cell type EEPROM.
Figures 2A, 2B:
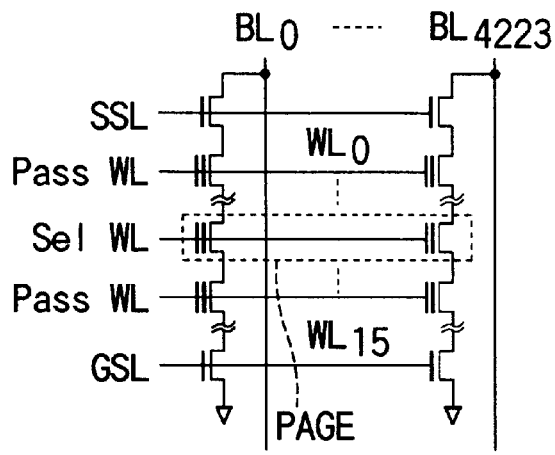
FIG. 2A is a view showing the arrangement of the memory cell array in the EEPROM shown in FIG. 1.
FIG. 2B is a view showing the bias states of erase, read, and program operations in the EEPROM shown in FIG. 1.
Figure 3:
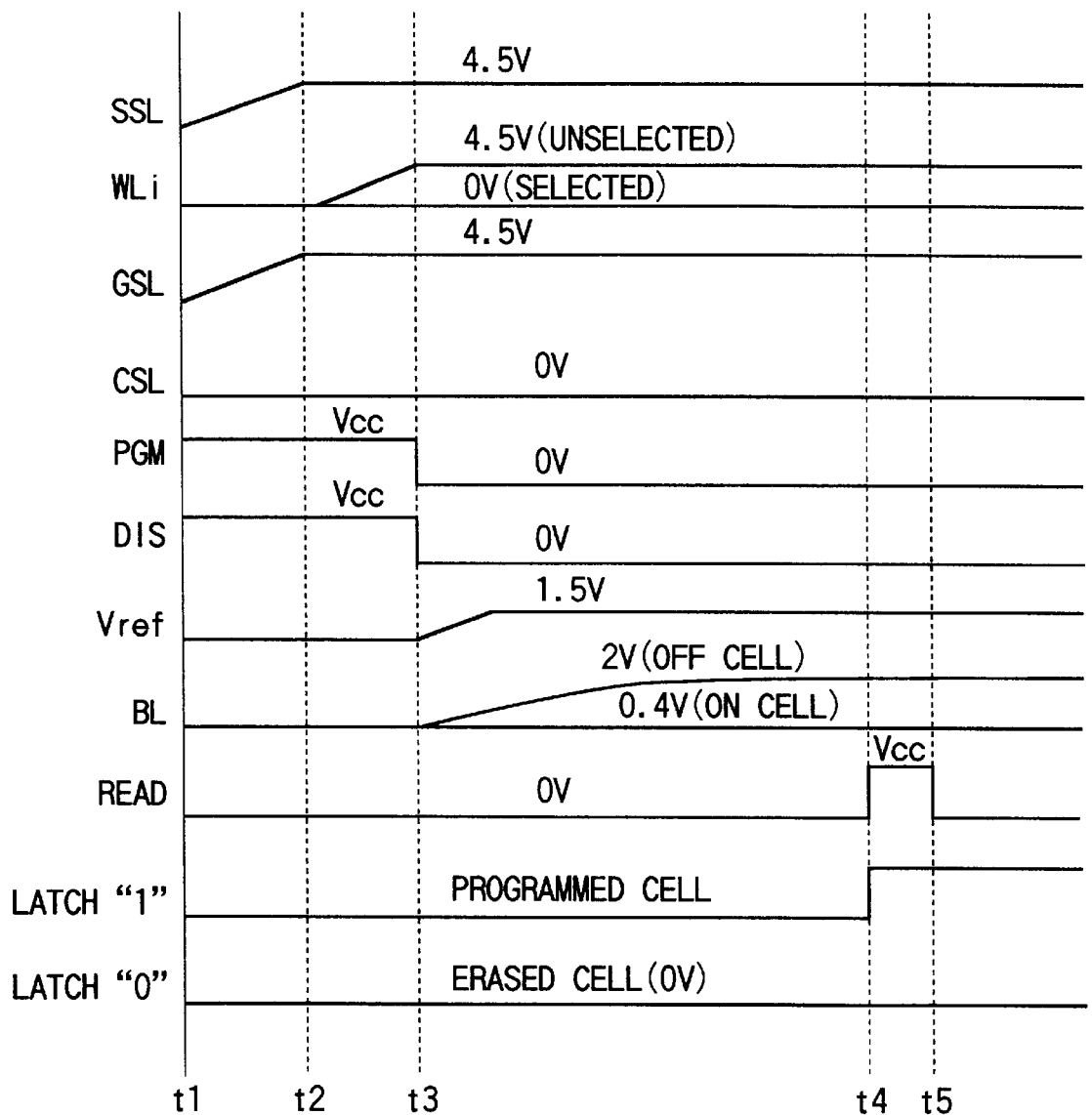
FIG. 3 is a timing chart showing principal signals in the EEPROM shown in FIG. 1 during a read operation.
Figure 4:
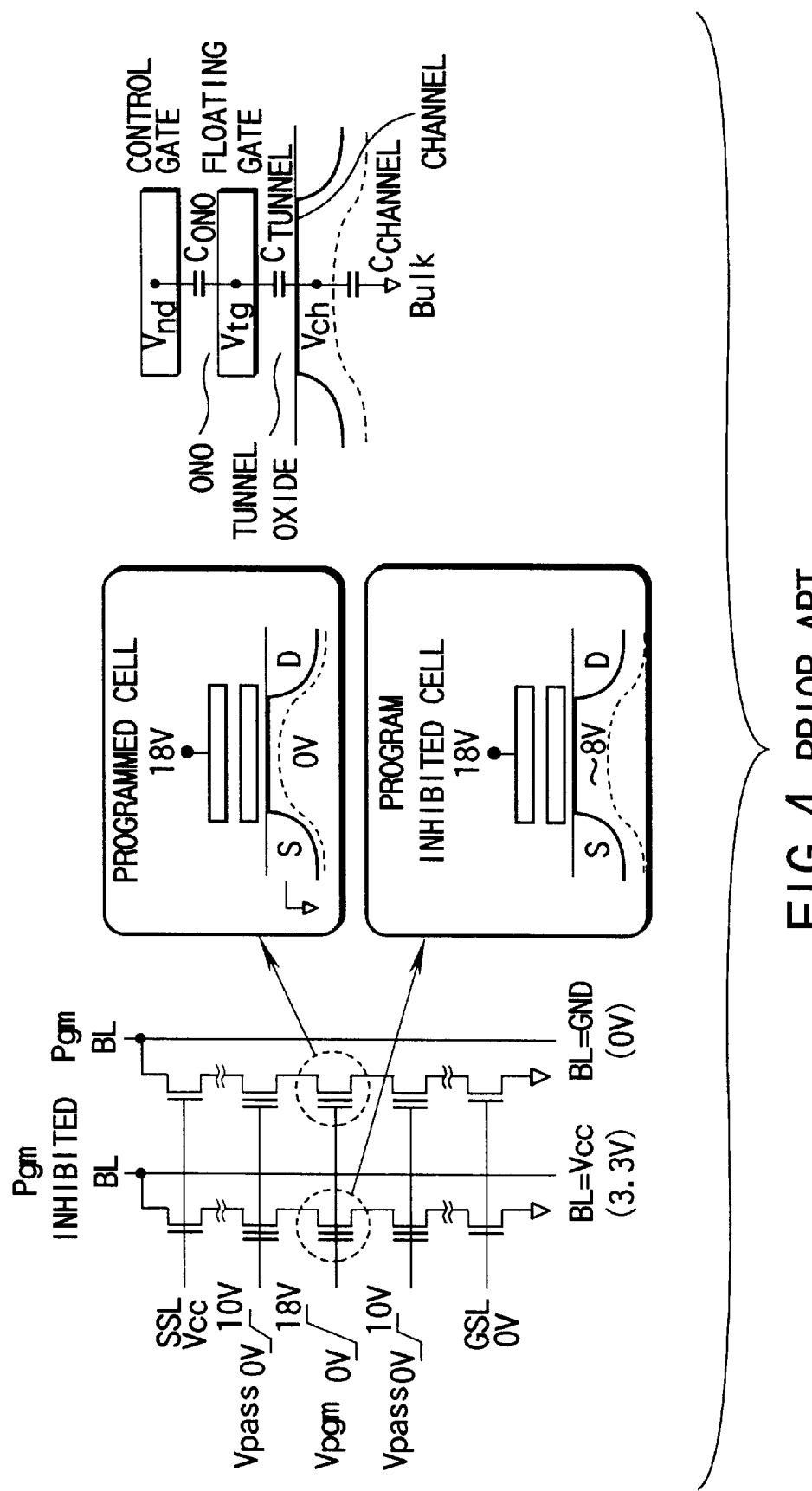
FIG. 4 is a view for explaining bias conditions of a program inhibiting voltage supplied to a channel of a selected cell in the EEPROM shown in FIG. 1.
Figure 5:
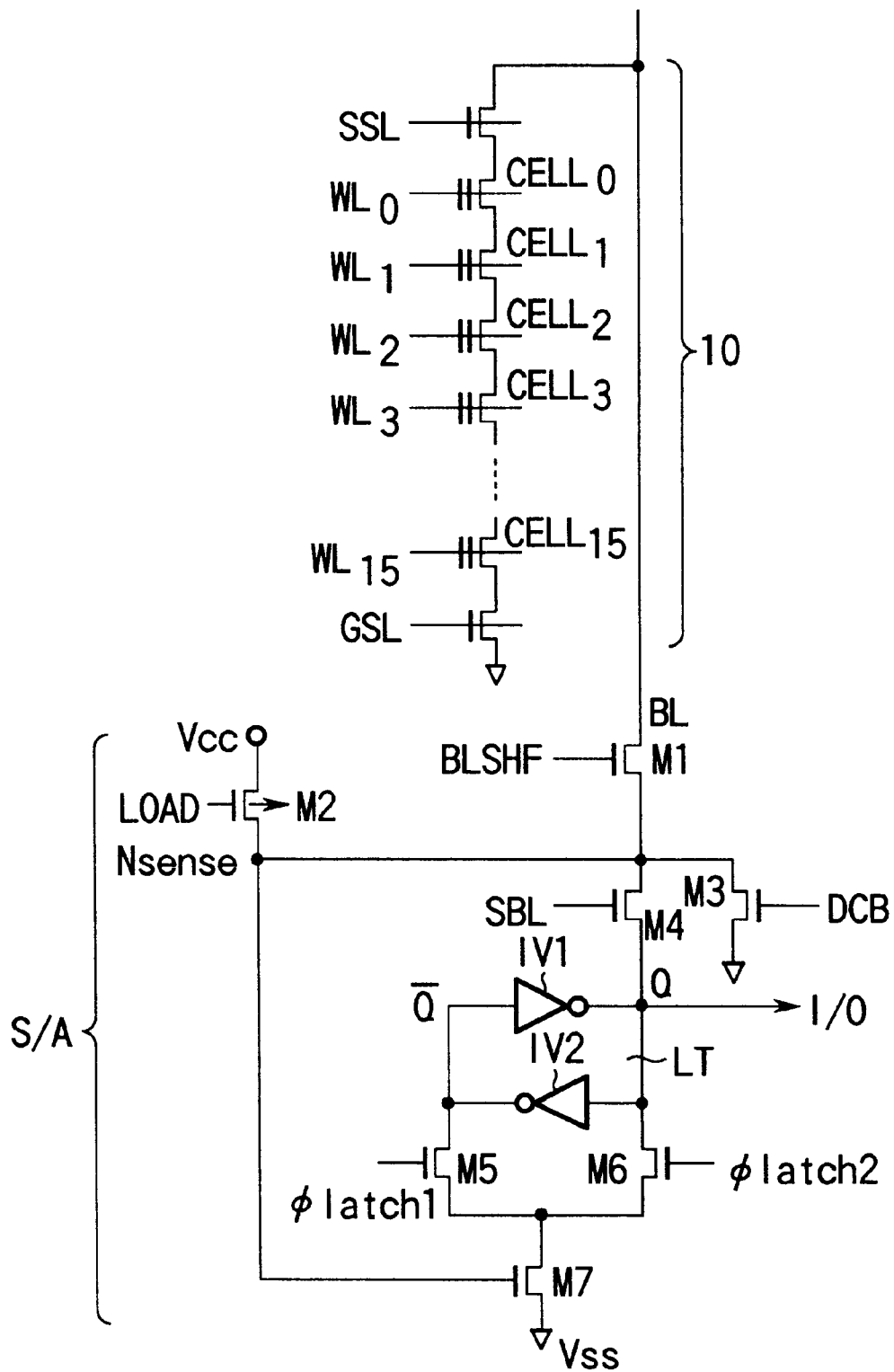
FIG. 5 is a circuit diagram of the peripheral core circuit of a sense amplifier circuit S/A in the EEPROM shown in FIG. 1.
Figure 6:
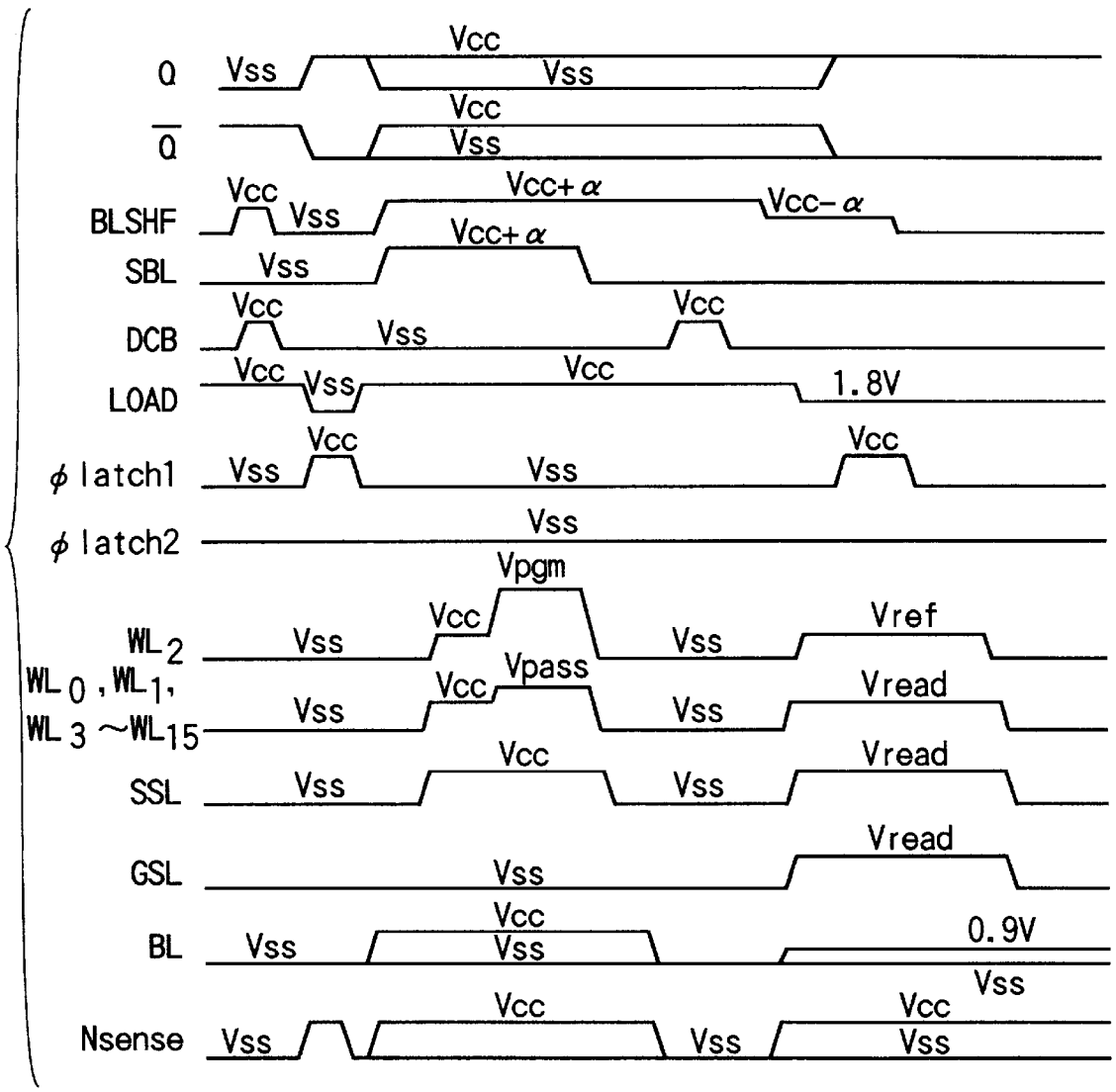
FIG. 6 is a timing chart showing examples of a program operation and a program verify read operation in the circuit shown in FIG. 5.
Figure 7:
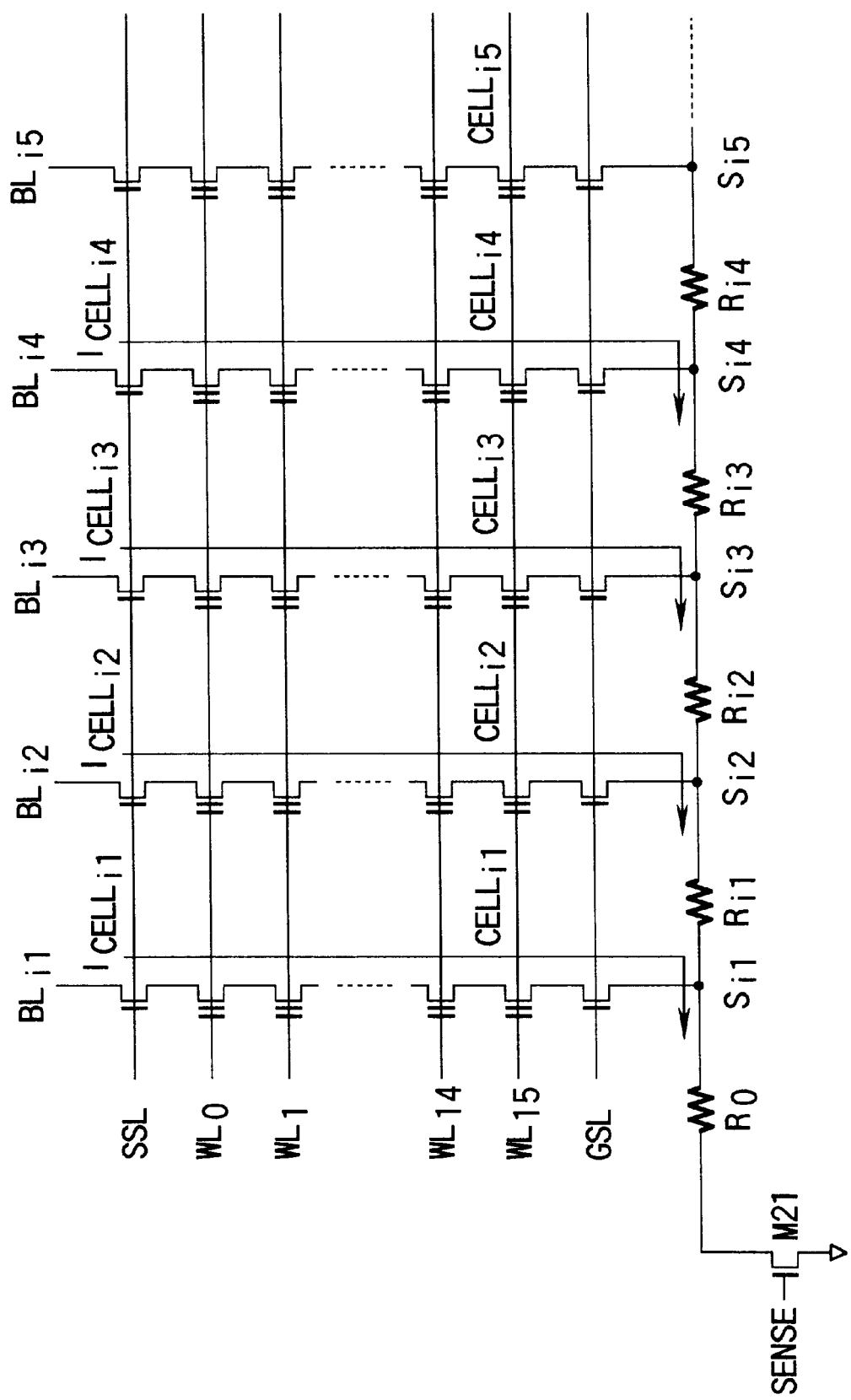
FIG. 7 is a circuit diagram showing a part of a memory cell array in the conventional EEPROM.
Figure 8:
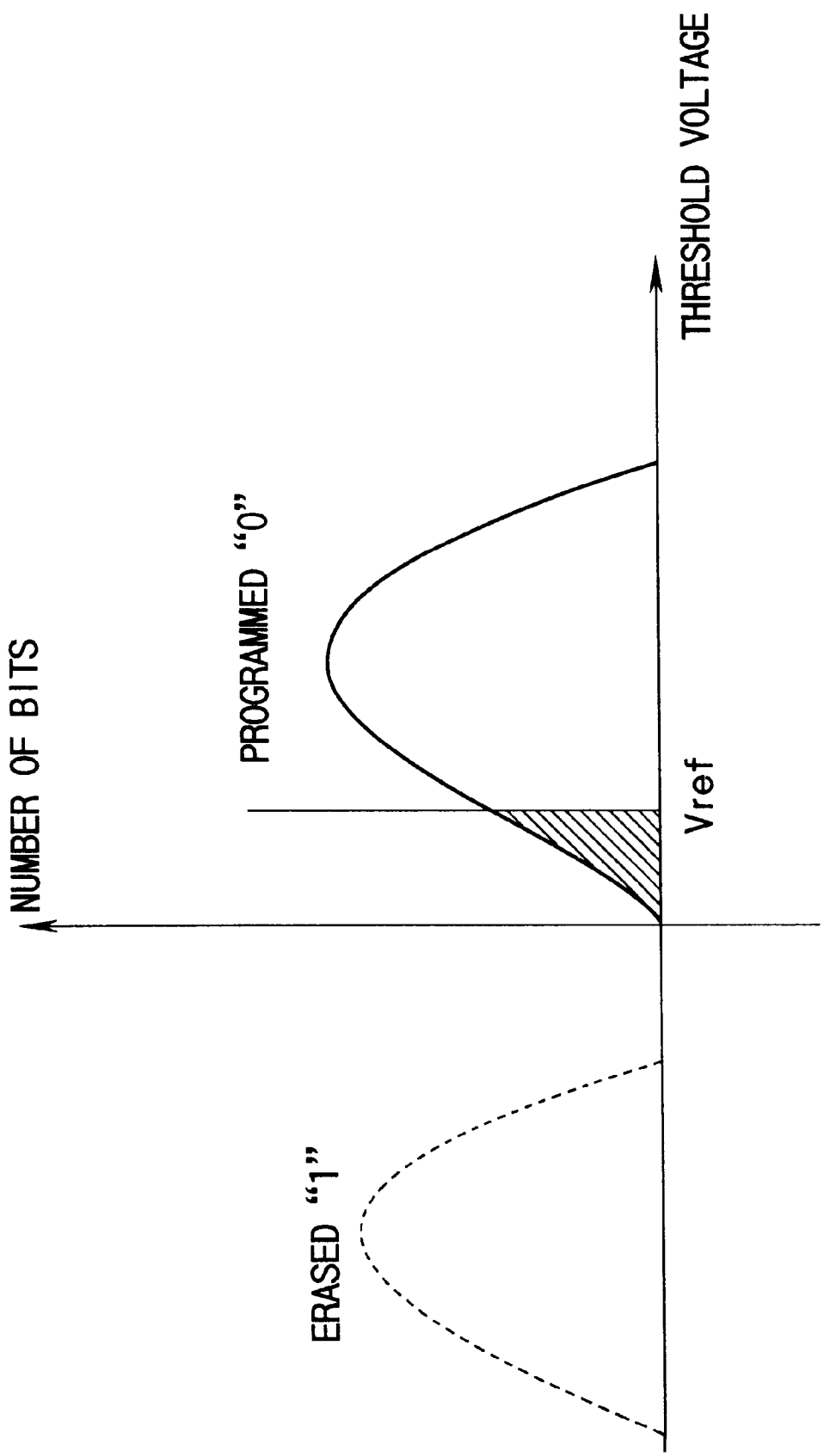
FIG. 8 is a view showing the distribution of threshold voltages of cell transistors to explain a problem in a program operation and a program verify read operation in the circuit shown in FIG. 7.
Figure 9:
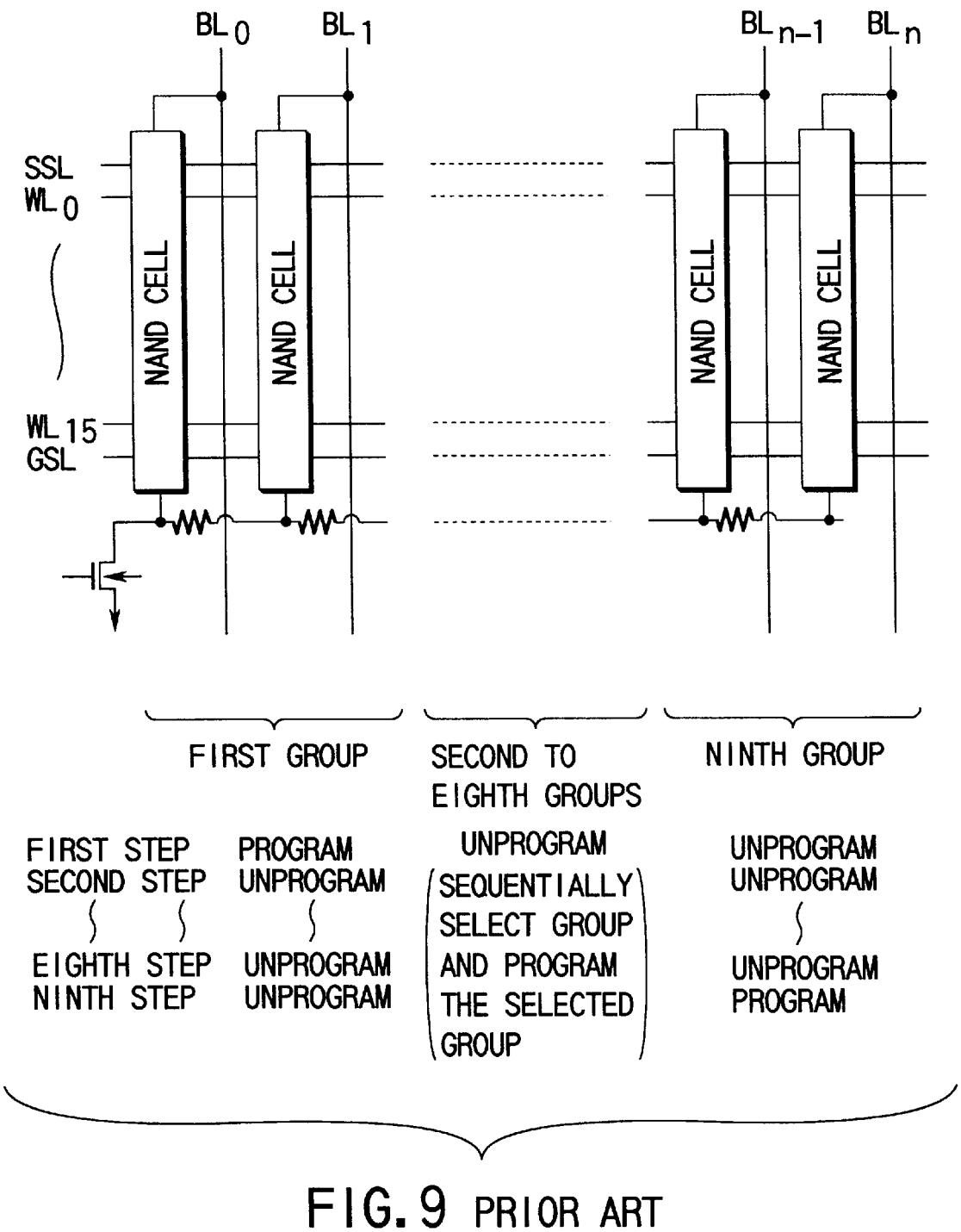
FIG. 9 is a circuit diagram showing a part of a memory cell array to explain a divisional program operation in the conventional EEPROM.
Figure 10:
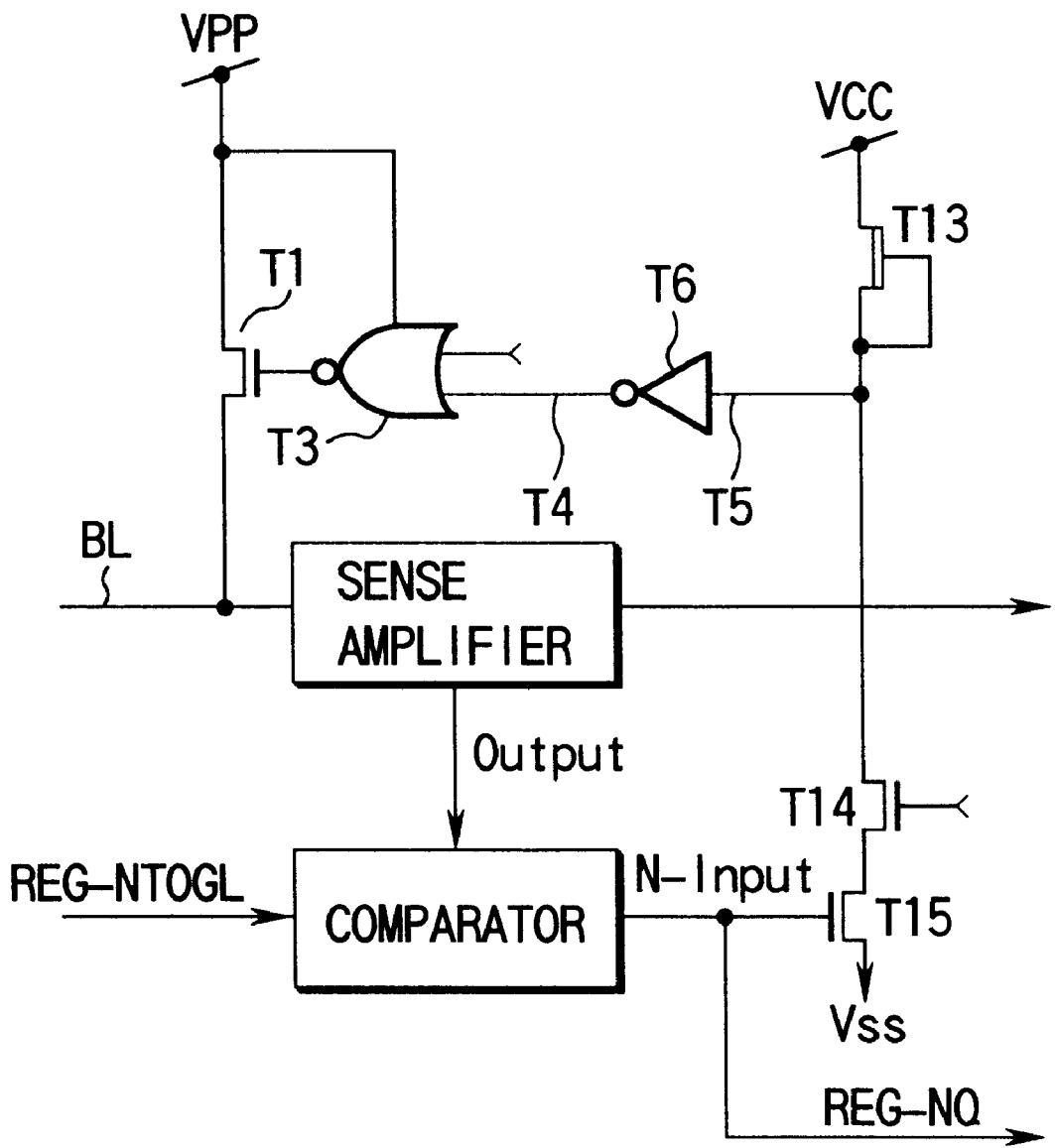
FIG. 10 is a circuit diagram showing another example of a sense amplifier circuit S/A in the conventional NAND cell type EEPROM.

The NAND memory cell unit 10 is the same as the conventional memory cell unit 10 shown in FIG. 5. That is, in this NAND memory cell unit 10, a plurality of cell transistors $CELL_0$ to $CELL_{15}$ made of n-channel MOSFETS each having a floating gate and a control gate are connected in series. A drain at one end of the NAND cell unit is connected to the bit line BL through a selection gate NMOS transistor. A source at the other end of the NAND cell unit is connected to a common source line through a selection gate NMOS transistor. These transistors are formed on the same well. The control electrodes of the memory cells $CELL_0$ to $CELL_{15}$ are connected to word lines $WL_0$ to $WL_{15}$ continuously extending in the row direction. The control electrode of the selection transistor on the bit line side is connected to a selection gate line SSL. The control electrode of the selection transistor on the source side is connected to a selection gate line GSL.

The sense amplifier circuit S/A is the same as the conventional sense amplifier circuit S/A described earlier with reference to FIG. 5. That is, this sense amplifier circuit S/A comprises an n-channel transistor M1 for bit line potential clamping, a p-channel transistor M2 as a constant-current source, a latch circuit LT, an n-channel transistor M3, a transfer gate NMOS transistor M4 for sense amplifier circuit S/A resetting, an NMOS transistor M5 for forcibly inverting the data in a sense amplifier, an NMOS transistor M7 for sensing, and an NMOS transistor M6 for inverse read latch control. The n-channel transistor M1 is inserted in series into the bit line BL and has a gate to which a control voltage BLSHF is applied. The p-channel transistor M2 charges the bit line BL for a predetermined period on the basis of a precharge control signal LOAD. The latch circuit LT latches memory cell data read out to a sense node $N_{sense}$ between the transistors M1 and M4. The n-channel transistor M3 discharges electric charge in the sense node $N_{sense}$ for a predetermined period on the basis of a discharge control signal DCB. The NMOS transistor M4 is inserted between the sense node $N_{sense}$ and a second storage node Q of the latch circuit LT and has a gate driven by a control signal SBL. The NMOS transistor M5 is connected between a first storage node /Q of the latch circuit LT and a ground potential and turned on by a first data latch control signal $\phi_{latch1}$ applied to its gate for a predetermined period. The NMOS transistor M7 is connected in series with the NMOS transistor M5 between the first storage node /Q of the latch circuit LT and the ground potential and has a gate connected to the sense node $N_{sense}$. The NMOS transistor M6 is connected in series with the NMOS transistor M7 between the second storage node Q of the latch circuit LT and the ground potential and turned on by a second data latch control signal (inverse read latch control signal) $\phi_{latch2}$ applied to its gate for a predetermined period.

The latch circuit LT comprises a flip-flop circuit in which the input nodes and output nodes of two CMOS inverter circuits IV1 and IV2 are cross-coupled (inversely connected in parallel).

In this arrangement, the input node (first storage node /Q) of the first CMOS inverter circuit IV1 is a sense amplifier inverting signal input node. The input node (second storage node Q) of the second CMOS inverter circuit IV2 is connected to an input/output circuit I/O through a data bus and functions as a reset node.

The storing circuit 20 comprises a first NMOS transistor M8 and a second NMOS transistor M9. The reset circuit 21 comprises a third NMOS transistor M10. The first NMOS transistor M8 has a drain connected to the first node /Q of the latch circuit LT, a gate to which the program data latch signal $\phi_{load}$ is input, and a source connected to the program data storage node $N_{prog}$. The second NMOS transistor M9 has a drain connected to the second node Q of the latch circuit LT and a gate connected to the program data storage node $N_{prog}$. The third NMOS transistor M10 has a drain connected to the source of the second NMOS transistor M9, a gate to which the reset signal RESET is input, and a source connected to the ground potential.

Figure 13:
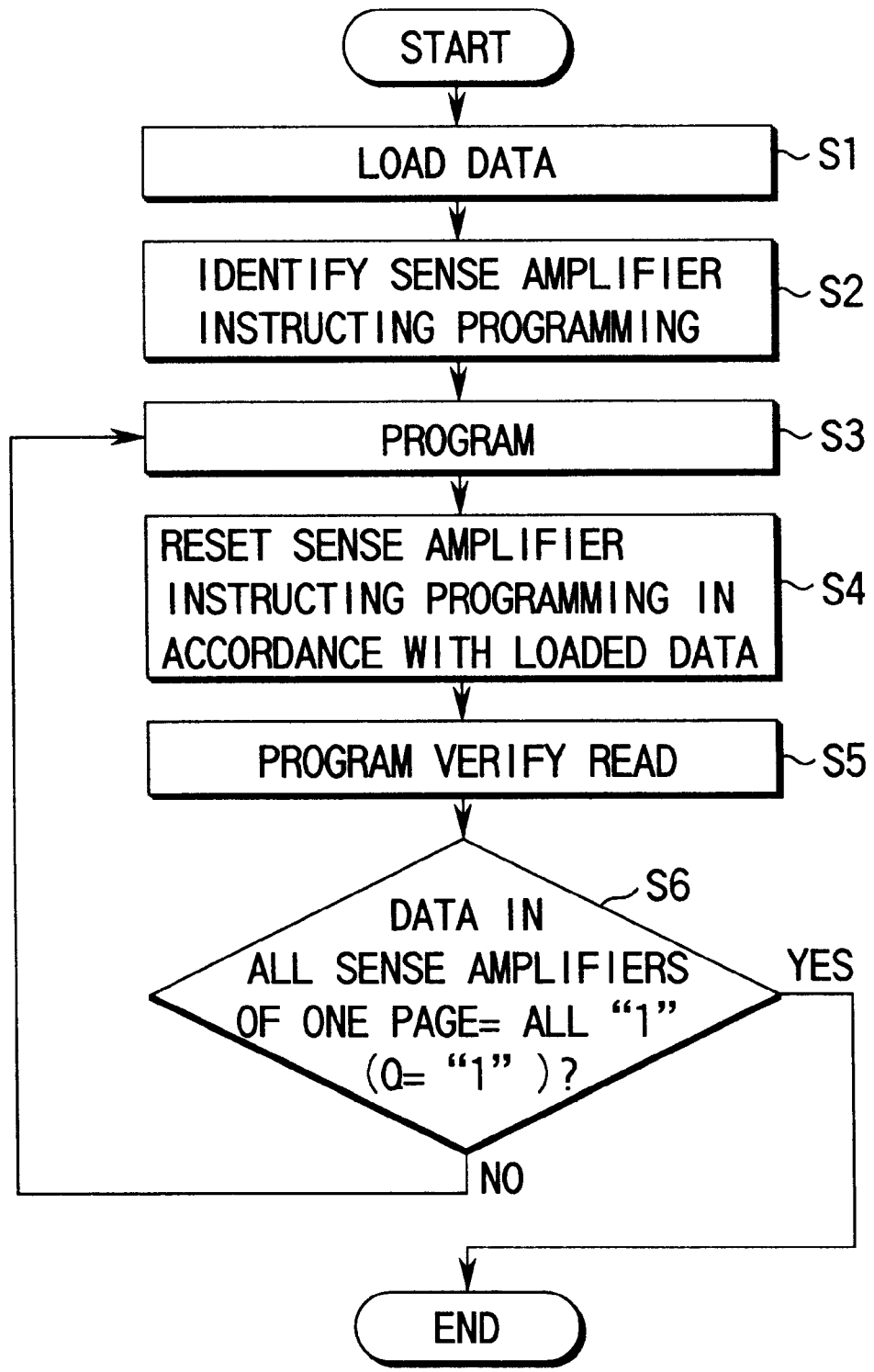
FIG. 13 is a flow chart showing a basic flow of control performed by a sequence control means to perform a program operation and a program verify read operation for a NAND memory cell unit shown in FIG. 12.

FIG. 13 is a flow chart showing a basic flow of control performed by the sequence control means to perform a program operation and a program verify read operation for the NAND memory cell unit shown in FIG. 12.

This sequence control means controls a program operation and a verify read operation after program operation for the sense amplifier circuits S/A in order of the following steps (S1 to S6).

In step S1, the sequence control means loads program data into the latch circuits LT of the sense amplifier circuits S/A in order to start programming.

In step S2, the sequence control means identifies a sense amplifier circuit S/A instructed to perform programming and stores the result of identification in the storing circuit 20 corresponding to the identified sense amplifier circuit S/A.

In step S3, the sequence control means performs program operation.

In step S4, the sequence control means resets data in the sense amplifier circuits S/A instructed to perform programming to the loaded data on the basis of the identification results stored in the storing circuits 20.

In step S5, the sequence control means performs a program verify read operation.

In step S6, the sequence control means determines whether data of all the sense amplifier circuits S/A of one page indicate that the cells are completely programmed. If YES in step S6, the sequence control means completes programming. If NO in step S6, the flow returns to step S3 to further executing the program operation.

Figure 14:
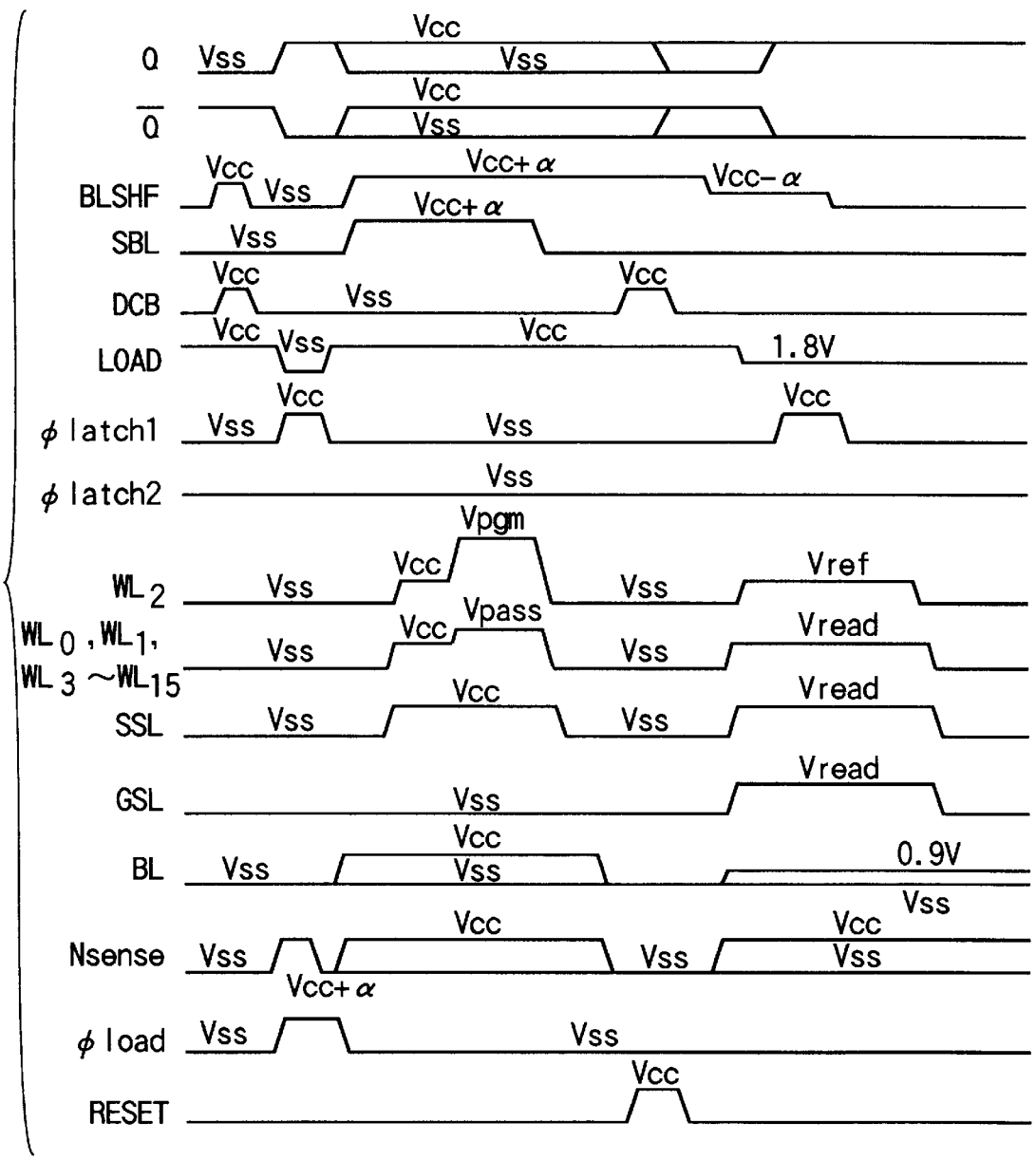
FIG. 14 is a timing chart showing an example of the program operation and the program verify read operation for the NAND memory cell unit shown in FIG. 12.

FIG. 14 is a timing chart of the program operation and the program verify read operation performed for the NAND memory cell unit 10 shown in FIG. 12.

The program and program verify read operations of the NAND memory cell unit will be described below with reference to FIGS. 13 and 14.

First, when a program command is externally applied to the chip, the programming is started. To reset the sense node $N_{sense}$, the bit line grounding control signal DCB changes to Vcc, and the sense node $N_{sense}$ is grounded. Prior to loading program data into the sense amplifier circuits S/A, the precharge control signal LOAD changes Vss, the data latch $\phi_{latch1}$ changes to Vcc, and data in the sense amplifier circuits S/A are reset. That is, in all the sense amplifier circuits S/A of one page, the nodes Q and /Q of the latch circuit LT are reset to Vcc and Vss, respectively (step Si).

Next, program data is loaded from the input/output circuit I/O and latched in the latch circuit LT of each sense amplifier circuit S/A. The nodes Q and /Q are set at Vcc and Vss, respectively, or vice verse in accordance with the loaded data. In a sense amplifier circuit S/A corresponding to a memory cell to be kept erased, the node Q changes to Vss. In a sense amplifier circuit S/A in which no programming is to be performed, the node Q changes to Vcc.

To identify sense amplifier circuits S/A instructed to perform programming, the program data latch signal $\phi_{load}$ changes to Vcc or Vcc+α to charge the program data storage node $N_{prog}$ to Vcc or Vcc−Vth only in the sense amplifier circuits S/A instructed to perform programming. In this manner, sense amplifier circuits S/A instructed to perform programming are identified. Note that Vth is the threshold voltage of the NMOS transistor M8 (step S2).

Next, similar to the operation of the conventional sense amplifier circuit S/A, bit lines are started to be charged on the basis of the data latched in the latch circuits LT. That is, the bit line to be programmed is kept grounded, and the bit line not to be programmed is charged to Vcc. When programming is performed through a selected word line, e.g., the word line $WL_2$, this word line $WL_2$ rises to a program voltage Vpgm (about 20 V), and the other word lines change to a Vpass voltage (about 10 V). By this operation, the memory cell $CELL_2$ is programmed (step S3).

After the program operation, the program verify read operation is started. First, sense amplifier circuits S/A instructed to program by the first load data are reset. That is, the program data storage node $N_{prog}$ corresponding to a sense amplifier circuit S/A instructed to perform programming is Vcc or Vcc−Vth.

Therefore, when the reset signal RESET is changed to Vcc, the nodes Q and /Q of the latch circuit LT of a sense amplifier circuit S/A instructed to perform programming change to Vss and Vcc, respectively.

Consequently, if it is determined that programming is completed in the immediately preceding programming cycle and if the nodes Q and /Q of the sense amplifier are Vcc and Vss, the latch circuit LT of the sense amplifier circuit S/A is inverted and the data are reset.

Accordingly, program determination for sense amplifier circuits S/A instructed to program by the first load data is performed by comparing the verify voltage (reference voltage) with the threshold voltage each time program verification operation is performed.

The rest of the program verify read operation is similar to that of the conventional sense amplifier circuit S/A. That is, the word line $WL_2$ used for programming changes to a verify voltage (reference voltage) Vref (approximately 0.5 V). The other word lines change to a read voltage Vread (approximately 4.5 V).

The control signal LOAD to be applied to the gate of the load transistor M2 is controlled to about 1.8 V to balance the load current with the memory cell current. In this state, a read operation is performed. For example, the cell current of an erased memory cell is at least about 2 μA so that the current of the load transistor is set to about 1.5 μA in accordance with the cell current.

Accordingly, no cell current flows in a programmed memory cell, i.e., in a memory cell whose threshold voltage is higher than the verify voltage (reference voltage) Vref (about 0.5 V), so the potential of the bit line BL rises.

If the bit line BL is charged to Vcc, the read time is prolonged. Therefore, the control signal BLSHF to be applied to the gate of the high-voltage MOS transistor M1 is clamped to, e.g., 1.8 V. Consequently, if the potential of the bit line BL rises to,.e.g., 0.9 V, the transistor M1 is cut off, and the sense node $N_{sense}$ changes to Vcc.

When the sense node $N_{sense}$ changes to Vcc, the data latch signal $\phi_{latch1}$ changes to Vcc. When the sense node $N_{sense}$ is Vcc, i.e., when a cell found to have a threshold voltage higher than the verify potential Vref is read out, the nodes /Q and Q change to Vss and Vcc, respectively, because the sense node $N_{sense}$ is Vcc.

In a sense amplifier circuit S/A not instructed to perform programming, the node Q is preset to Vcc.

Therefore, programming is complete when the potentials of the nodes Q in all the sense amplifier circuits S/A of one page change to Vcc ("1") (step S6).

If, however, a memory cell is insufficiently programmed in a sense amplifier circuit S/A instructed to perform programming, the sense node $N_{sense}$ remains Vss. Therefore, the latch circuit LT is not inverted, and the node Q maintains Vss.

In the EEPROM having the core circuit as shown in FIG. 12, therefore, before the program verify read operation is performed, data in a sense amplifier circuit S/A instructed to perform programming are reset to the loaded data on the basis of the identification result stored in the storing circuit 20. Consequently, it is possible to additionally program a memory cell found to be insufficiently programmed in a later program verify read operation.

Also, when page divisional programming is to be performed in the EEPROM capable of divisional programming as described above, data in a sense amplifier circuit S/A instructed to perform programming are reset to the loaded data in accordance with the loaded data on the basis of an identification result stored in the storing circuit. Consequently, even an already programmed memory cell can be further programmed if the memory cell is found to be insufficiently programmed in a later program verify read operation.

Figure 15:
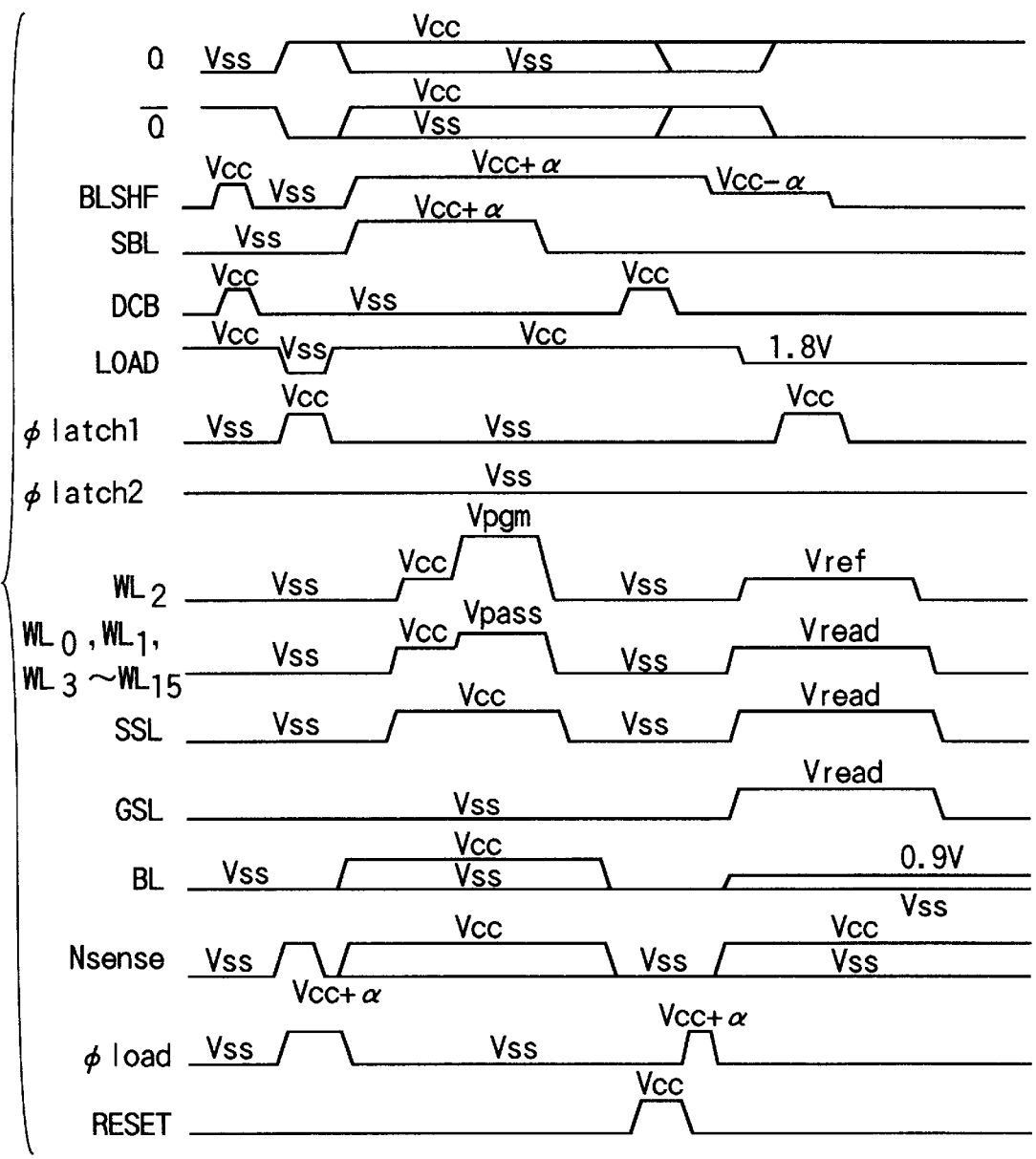
FIG. 15 is a timing chart showing another example of the program operation and the program verify read operation in the circuit shown in FIG. 12.

Note that as indicated by operating waveforms shown in FIG. 15, when a sense amplifier circuit S/A instructed to program by the first loaded data is reset before the program verify read operation, data in the program data storage node $N_{prog}$ can also be refreshed.

That is, the program data storage node $N_{prog}$ of a sense amplifier circuit S/A instructed to perform programming is Vcc or Vcc−Vth. Therefore, when the reset signal RESET is changed to Vcc, the nodes Q and /Q of the latch circuit LT of this sense amplifier circuit S/A instructed to perform programming change to Vss and Vcc, respectively. Subsequently, data in the program data storage node $N_{prog}$ is refreshed by changing the program data latch signal $\phi_{load}$ to Vcc or Vcc+α.

When the program operation time is prolonged, electric charge in the program data storage node $N_{prog}$ is discharged by, e.g., a junction leakage current or a subthreshold current of a transistor. Consequently, the node $N_{prog}$ changes from Vcc to Vss. If, on the other hand, the node $N_{prog}$ is charged, the node $N_{prog}$ changes from Vss to Vcc. The object of the above refresh is to prevent these changes.

In the above embodiment, the sequence controller is formed on the same chip as the memory. However, the present invention is also applicable to a case wherein program control is externally performed for the memory as described previously.

That is, a program control method of the semiconductor memory device according to the present invention comprises the step of identifying sense amplifier circuits S/A instructed to perform programming and storing the identification results in storing circuits, when program data is loaded into the sense amplifier circuits S/A to perform programming of memory cells of the semiconductor memory device described above, and the step of resetting data in the sense amplifier circuits S/A instructed to perform programming to the loaded data on the basis of the identification results stored in the storing circuits, Before program verify read operation is performed.

A program verify read operation when divisional programming is performed in this embodiment will be. described below.

Figure 16:
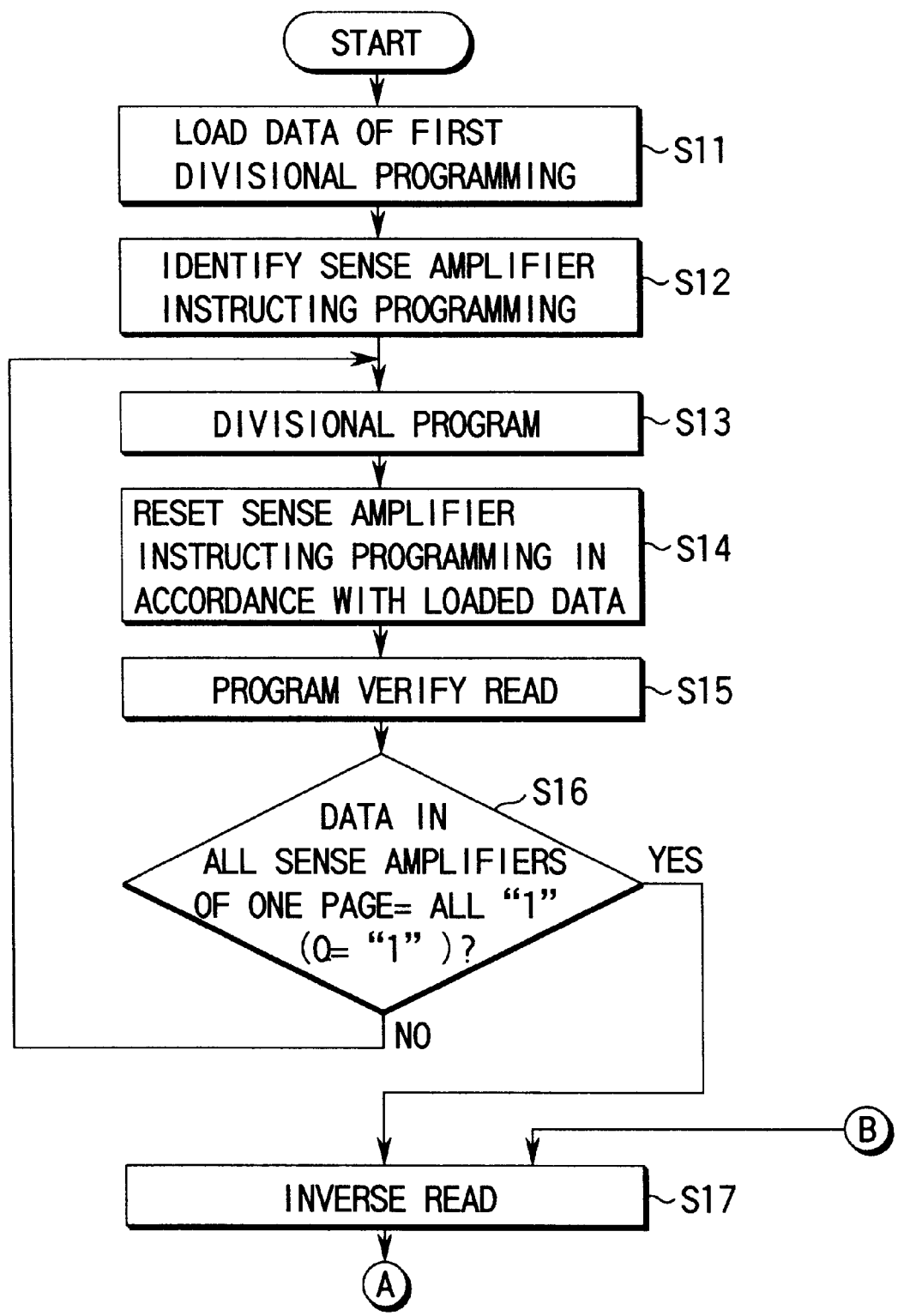
FIGS. 16 and 17 are flow charts showing a basic flow of control performed by the sequence control means to perform the program operation and the program verify read operation for the NAND memory cell unit shown in FIG. 12.
Figure 17:
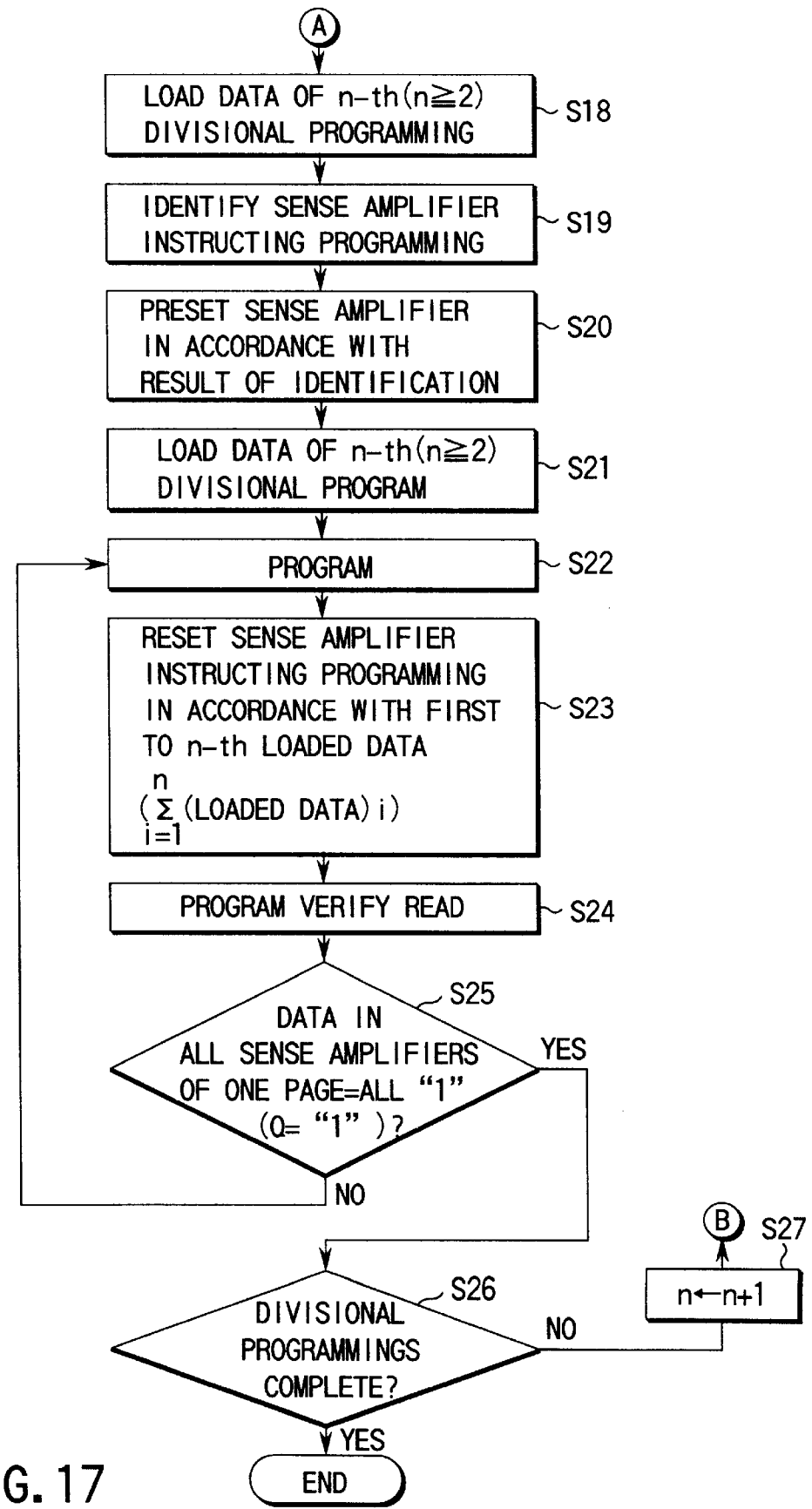

FIGS. 16 and 17 are flows charts showing a basic flow of control performed by the sequence control means to perform a divisional program operation and a program verify read operation for the NAND memory cell unit shown in FIG. 12.

In step S11, the sequence control means starts programming and loads first divisional program data into the latch circuits LT of the sense amplifier circuits S/A.

In step S12, the sequence control means identifies sense amplifier circuits S/A instructed to perform. programming and stores the identification results in the storing circuits 20 corresponding to the identified sense amplifier circuits S/A.

In step S13, the sequence control means performs the first divisional program operation.

In step S14, on the basis of the identification results stored in the storing circuits 20, the sequence control means resets data in the sense amplifier circuits S/A instructed to perform programming to the loaded program data.

In step S15, the sequence control means performs a program verify read operation.

In step S16, the sequence control means determines whether data of all the sense amplifier circuits S/A of one page indicate that all the memory cells are completely programmed. If YES in step S16, the sequence control means completes the first divisional program operation. If NO in step S16, the flow returns to step S13 to repeatedly execute the program operation.

In step S17, the sequence control means performs an inverse read operation. An inverse read operation is identical with a normal read operation except that $\phi_{latch2}$ is Vcc in the inverse read operation, whereas $\phi_{latch1}$ is Vcc in the normal read operation. The word line voltage is set to Vref as in the program verify read operation. Alternately, the word line voltage may be set to a normal read voltage (e.g., Vss) lower than Vref provided it is possible to read "1" or "0" data from the memory cell.

In step S18, the sequence control means loads nth (n≧2) divisional program data into the latch circuits LT of the sense amplifier circuits S/A.

In step S19, the sequence control means identifies sense amplifier circuits S/A instructed to perform programming and stores the identification results in the storing circuits 20 corresponding to the identified sense amplifier circuits S/A.

In step S20, the sequence control means presets data of the sense amplifier circuits S/A instructed to perform programming in accordance with the identification results stored in the storing circuits 20.

In step S21, the sequence control means reloads the nth (n≧2) divisional program data in the latch circuits LT of the sense amplifier circuits S/A.

In step S22, the sequence control means performs nth divisional program operation.

In step S23, on the basis of the identification results stored in the storing circuits 20, the sequence control means resets data in the sense amplifier circuits S/A instructed to perform programming to the loaded data (the first to nth loaded data $$\sum_{i=1}(\text{LOAD DATA})_i)1.$$

In step S24, the sequence control means performs a program verify read operation.

In step S25, the sequence control means determines whether data of all the sense amplifier circuits S/A of one page indicate that all the memory cells are completely programmed. If NO in step S25, the flow returns to step S22 to repeatedly execute the program operation. If YES in step S25, the sequence control means determines in step S26 whether the whole divisional program operation is complete. If NO in step S26, the sequence control means increments "n" in step S26, and the flow returns to step S17. If YES in step S26, the sequence control means ends programming.

Figure 18:
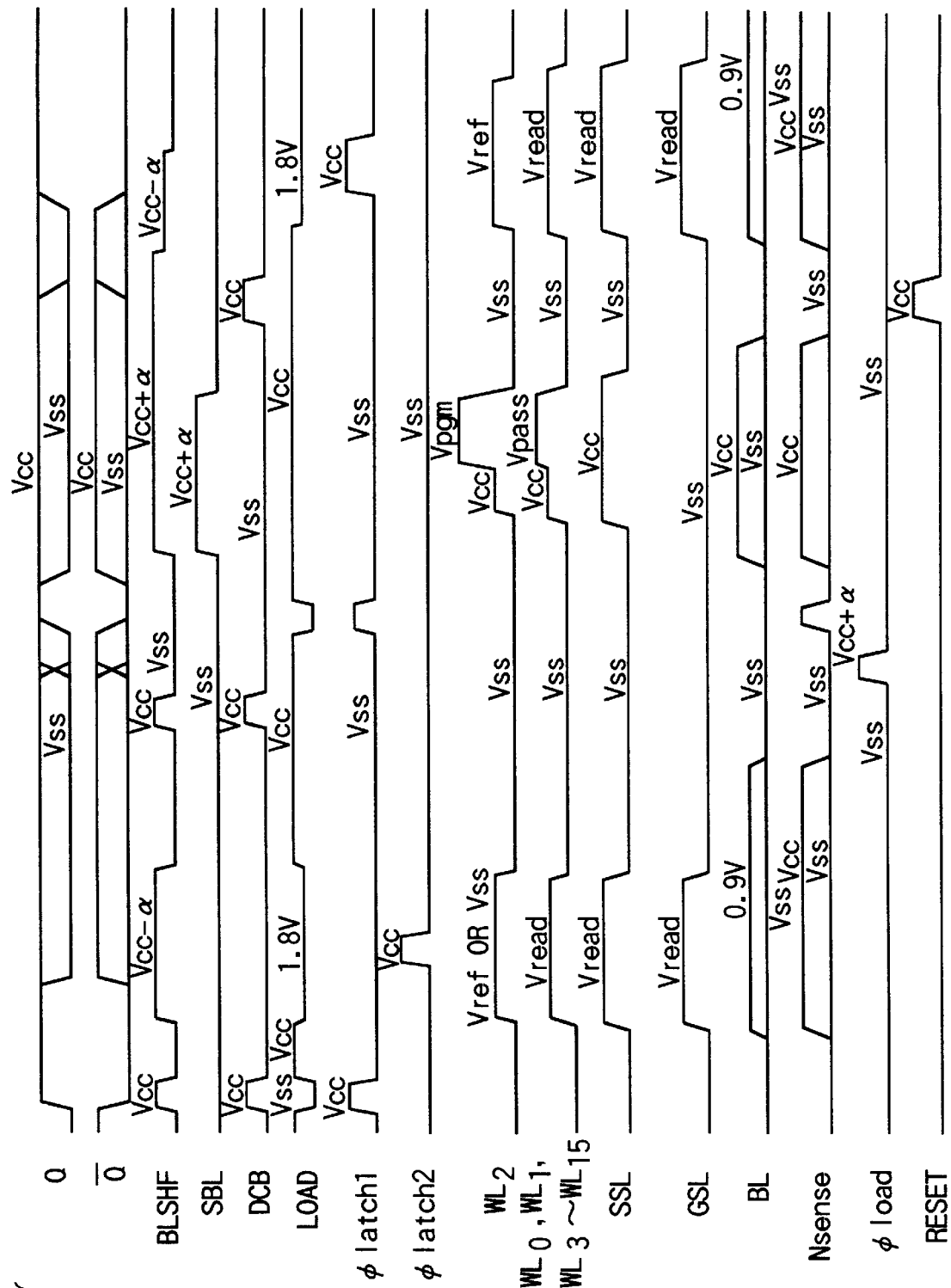
FIG. 18 is a timing chart showing an example of inverse read, divisional program, and program verify read operations performed in divisional programming for the NAND memory cell unit shown in FIG. 12.

FIG. 18 is a timing chart which corresponds to the flow charts shown in FIGS. 16 and 17, and shows inverse read, program, and program verify read operations performed in divisional programming for the. NAND cell type EEPROM.

An inverse read operation is performed before a divisional program operation. The inverse read operation may be performed during the first divisional program operation, while the inverse read operation must always be performed before in the second and subsequent divisional program operations.

First, the bit line grounding control signal DCB changes to Vcc, and the sense node $N_{sense}$ is grounded. Then, the control signals LOAD and $\phi_{latch1}$ change to Vss and Vcc, respectively, to reset data in the sense amplifier circuits S/A before an inverse read operation. That is, the nodes Q and /Q of the latch circuits LT of all the sense amplifier circuits S/A of one page are reset to Vcc and Vss, respectively.

An inverse read operation is then performed in the same manner as the program verify read operation except for some part. That is, the word line $WL_2$ used in divisional programming changes to the verify potential Vref (around 0.5 V). The other word lines change to the read voltage Vread (around 4.5 V). The control signal LOAD for the load transistor M2 is controlled to stay in the neighborhood of 1.8 V to balance the load current with the memory cell current. In this state, a read operation is performed. For example, the cell current of an erased memory cell is at least about 2 $\mu$A so that the current of the load transistor is set to about 1.5 $\mu$A in accordance with the cell current.

Accordingly, no cell current flows in a programmed memory cell, i.e., in a memory cell whose threshold voltage is higher than the verify voltage (reference voltage) Vref (about 0.5 V), so the potential of the bit line rises. If the bit line BL is charged to Vcc, the read time is prolonged. Therefore, the control signal BLSHF for the high-voltage MOS transistor M1 is clamped to, e.g., 1.8 V. Consequently, if the potential of the bit line BL rises to, e.g., 0.9 V, the transistor M1 is cut off, and the sense node $N_{sense}$ changes to Vcc.

When the sense node $N_{sense}$ changes to Vcc, the data latch signal $\phi_{latch2}$ changes to Vcc. The characteristic feature of the inverse read operation is that $\phi_{latch2}$, instead of $\phi_{latch1}$, changes to Vcc unlike in the normal read operation.

When the sense node $N_{sense}$ is Vcc, i.e., when a cell found to have a threshold voltage higher than the verify potential Vref is read out, the nodes Q and /Q change to Vss and Vcc, respectively, because the sense node $N_{sense}$ is Vcc. Note that in the inverse read operation, the present invention is also effective if the potential of the word line WL2 is set to another value, such as normal read voltage Vss, instead of verify voltage Vref.

After the bit line is reset, the next program data of divisional programming is loaded from the input/output circuit I/O and latched in the latch circuit of each sense amplifier circuit S/A. The nodes Q and /Q are set at Vcc and Vss, respectively, or vice verse in accordance with the loaded data. In a sense amplifier circuit S/A used for programming a memory cell, the node Q changes to Vss. In a sense amplifier circuit S/A not for programming a memory cell, the node Q changes to Vcc. In divisional programming, data is loaded only into the sense amplifier circuits S/A in which divisional programming is to be performed.

To identify sense amplifier circuits S/A instructed to perform programming, the program data latch signal $\phi_{load}$ changes to Vcc or Vcc +α to charge the program data storage node $N_{prog}$ to Vcc or Vcc−Vth only in the sense amplifier circuits S/A instructed to perform programming. In this manner, sense amplifier circuits S/A instructed to perform programming are identified.

By this operation, the node Q changes to Vss in the sense amplifier circuits S/A instructed to perform programming during the first to the last divisional program operations and sense amplifier circuits S/A instructed to perform programming in the present divisional program operation.

If programming is immediately performed, the sense amplifier circuits S/A used for programming memory cells in the first to the last divisional program operations are used again for programming because the node Q is Vss in these sense amplifier circuits S/A. This poses a problem of overprogramming. To avoid this problem, the control signals LOAD and $\phi_{latch1}$ change to Vss and Vcc, respectively, to preset data of the sense amplifier circuits S/A.

Subsequently, data of the next divisional programming is loaded from the input/output circuit into the latch circuits LT. Next, similar to the operation of the conventional sense amplifier circuit S/A, bit lines are started to be charged on the basis of the data latched in the latch circuits LT.

After the program operation, the program verify read operation is started. First, sense amplifier circuits S/A instructed to perform programming during the first to the last divisional program operations and sense amplifier circuits S/A instructed to perform programming by loaded data in the present divisional program operation are reset. That is, the node $N_{prog}$ of a sense amplifier circuit S/A instructed to perform programming during the first to the last divisional program operations or a sense amplifier circuit S/A instructed to perform programming by the loaded data in the present divisional program operation is Vcc or Vcc−Vth. Hence, when the reset signal RESET is changed to Vcc, the nodes Q and /Q of the latch circuit LT of a sense amplifier circuit S/A instructed to perform programming change to Vss and Vcc, respectively.

Consequently, the latch circuits LT of the sense amplifier circuits S/A for which it is determined that programming is sufficiently performed by the preceding divisional program operations or program operations and of which nodes Q and /Q are Vcc and Vss, respectively, are inverted and reset.

Figure 19:
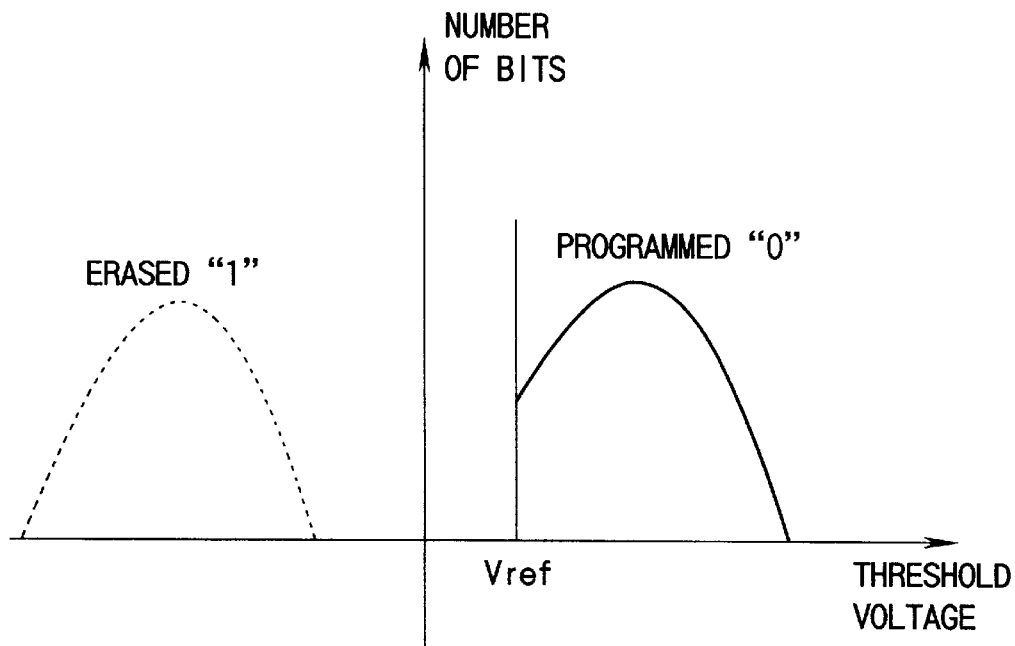
FIG. 19 is a graph showing the distribution of threshold voltages of cell transistors to explain the effect of the present invention in the EEPROM shown in FIG. 12.

Accordingly, for sense amplifier circuits S/A instructed to perform programming during the first to the last divisional program operations and sense amplifier circuits S/A instructed to perform programming by the present loaded data, it is determined by comparing the verify voltage with the threshold voltage each time a program verify read operation is performed whether or not the memory cell is sufficiently programmed. Consequently, as shown in FIG. 19, the distribution of memory cell threshold voltages after programming has no threshold voltages lower than the verify voltage (reference voltage) Vref. This improves the reliability of programmed data after programming.

Figure 20A:
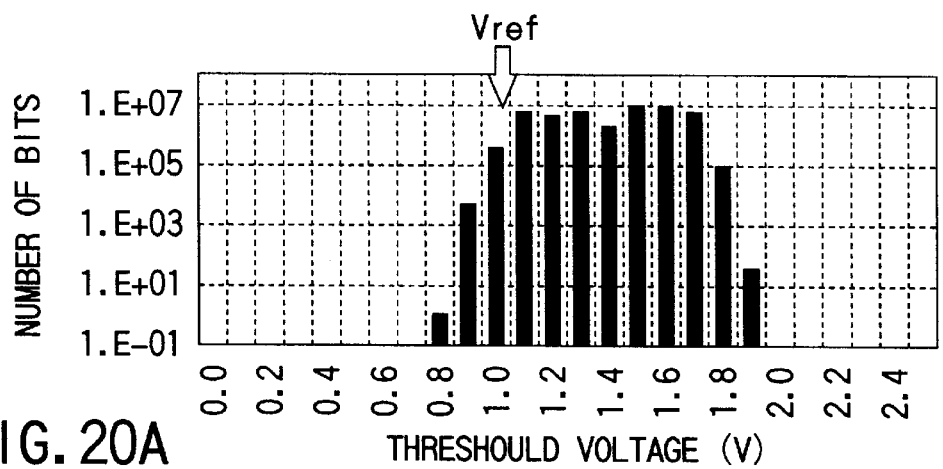
FIGS. 20A and 20B are graphs showing actual measurement results of threshold distributions in prior art and the present invention.
Figure 20B:
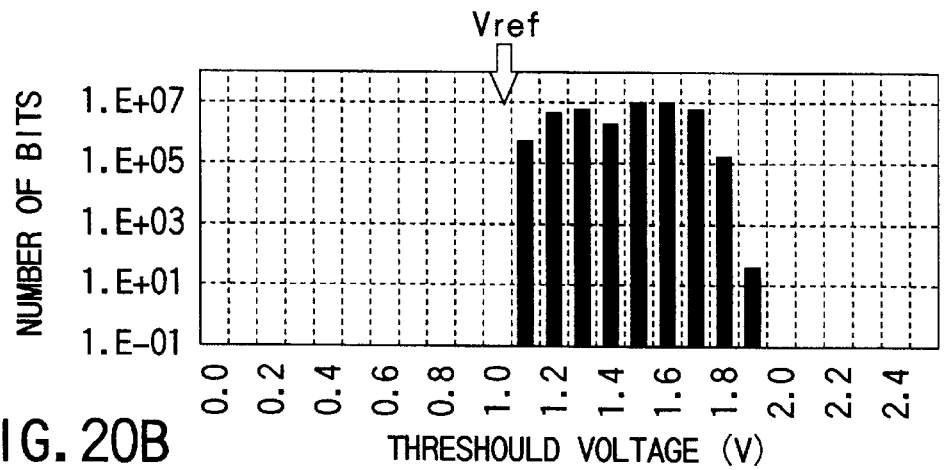

FIGS. 20A and 20B show actually measured values of threshold distributions after conventional program verify read operation and program verify read operation of the present invention. The measurements are performed for a 64-Mbit NAND cell type EEPROM, and Vref is set at 1 V. As shown in FIG. 20A, a distribution foot of threshold voltages lower than Vref is produced after conventional program verify read operation. In the present invention, as shown in FIG. 20B, the threshold voltage distribution ranges between 1.1 and 1.9 V.

Figure 21:
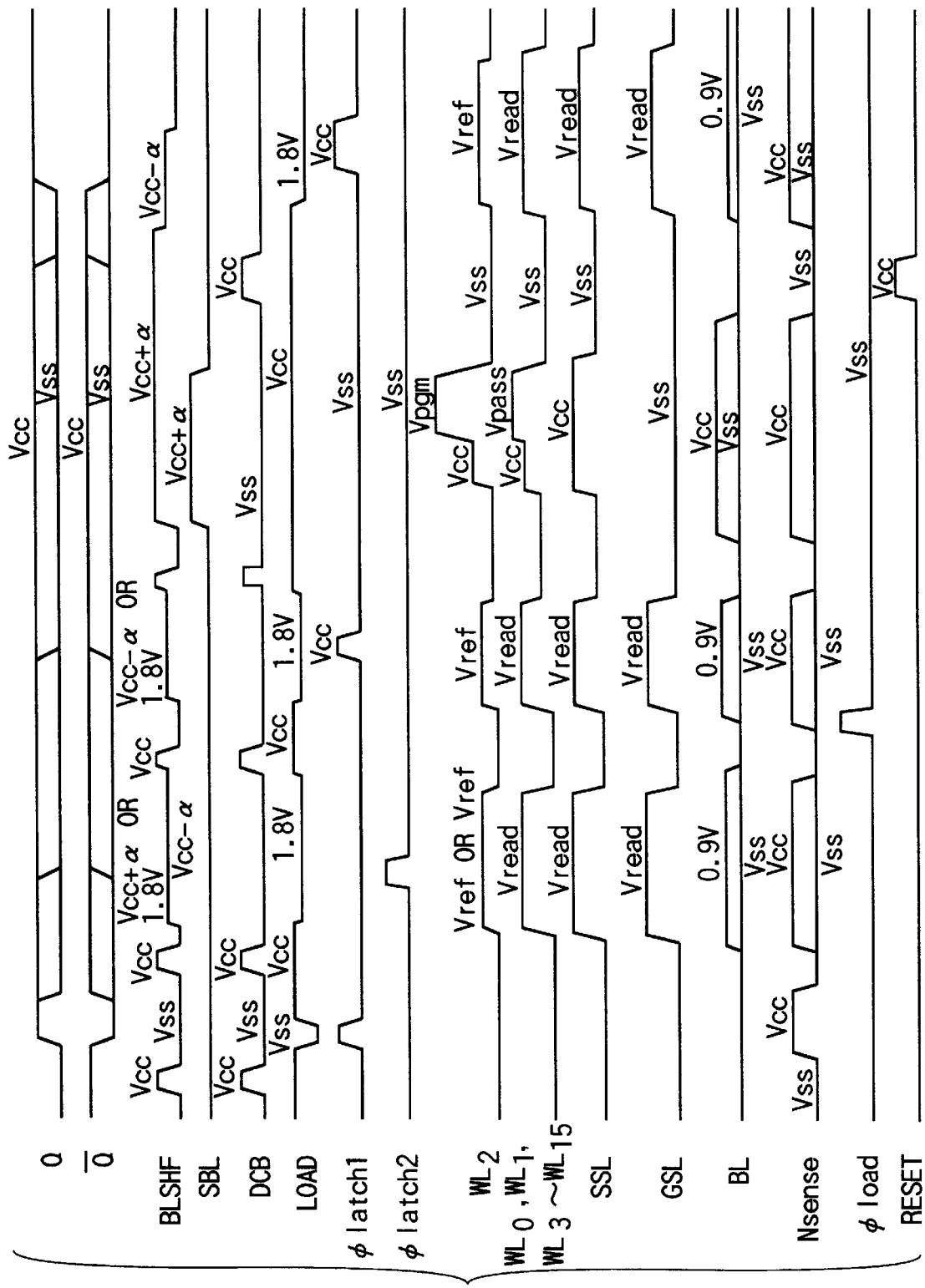
FIG. 21 is a timing chart showing another example of the inverse read, divisional program, and program verify read operations performed in divisional programming for the NAND memory cell unit shown in FIG. 12.

In divisional programming, the present invention is also effective when divisional program data is loaded from the input/output circuit I/O, an inverse read operation is performed, and Vcc is latched in the nodes $N_{prog}$ of sense amplifier circuits S/A instructed to perform programming during the first to the last divisional program operations and sense amplifier circuits S/A instructing to perform programming by loaded data in the next (present) divisional program operation. FIG. 21 shows a timing chart of this divisional programming.

First, a program operation is started when a program command or divisional program command is externally input to the chip. To reset a bit line, the bit line grounding control signal DCB changes to Vcc, and the bit line is grounded. After that, prior to loading program data into the sense amplifier circuits S/A, the control signals LOAD and $\phi_{latch1}$ change to Vss and Vcc, respectively, to reset data in the sense amplifier circuits S/A. That is, the nodes Q and /Q of the latch circuits LT of all the sense amplifier circuits S/A of one page are reset to Vcc and Vss, respectively.

Next, program data is loaded from the input/output circuit I/O and latched in the latch circuit LT of each sense amplifier circuit S/A. The nodes Q and /Q are set at Vcc and Vss, respectively, or vice verse in accordance with the loaded data. In a sense amplifier circuit S/A corresponding to a memory cell to be programmed, the node Q changes to Vss. In a sense amplifier circuit S/A corresponding to a memory cell to be kept erased, the node Q changes to Vcc.

Subsequently, an inverse read operation is performed for data in the memory cells programmed by the first to the last divisional program operations. First, the bit line grounding control signal DCB changes to Vcc to ground the sense node. However, some sense amplifier circuits S/A are not preset because program data of the next divisional program operation is already input.

An inverse read operation is then performed. That is, the word line $WL_2$ used for the divisional program operation changes to the verify potential Vref (about 0.5 V). The other word lines change to the read voltage Vread (about 4.5 V). The control signal LOAD for the load transistor M2 is controlled to stay in the vicinity of 1.8 V to balance the load current with the memory cell current. In this state, a read operation is performed.

For example, the cell current of an erased memory cell is at least about 2 $\mu$A so that the current of the load transistor is set to about 1.5 $\mu$A in accordance with the cell current. Accordingly, no cell current flows in a programmed memory cell, i.e., in a memory cell whose threshold voltage is higher than the verify voltage (reference voltage) Vref (about 0.5 V), so the potential of the bit line rises.

If the bit line BL is charged to Vcc, the read time is prolonged. Therefore, the control signal BLSHF for the high-voltage MOS transistor M1 is clamped to, e.g., 1.8 V. Consequently, if the potential of the bit line BL rises to, e.g., 0.9 V, the transistor M1 is cut off, and the sense node $N_{sense}$ changes to Vcc.

When the sense node $N_{sense}$ changes to Vcc, the data latch signal $\phi_{latch2}$ changes to Vcc. The characteristic feature of an inverse read operation is that $\phi_{latch2}$, instead of $\phi_{latch1}$, changes to Vcc unlike in a normal read operation.

When the sense node $N_{sense}$ is Vcc, i.e., when data is read out from a cell found to have a threshold voltage higher than the verify potential Vref, the nodes Q and /Q change to Vss and Vcc, respectively, because the sense node $N_{sense}$ is Vcc. The next divisional program data is already input to some sense amplifier circuits S/A. In this inverse read operation, only the nodes Q and /Q change to Vss and Vcc, respectively, in the sense amplifier circuits S/A of cells found to have a threshold voltage higher than Vref by the first to the last divisional program operations. Therefore, the next divisional program data is not destroyed and kept stored in some sense amplifier circuits S/A. Note that in the inverse read operation, the present invention is also effective if the potential of the word line $WL_2$ is set to another value, such as normal read voltage Vss, instead of verify voltage Vref.

To identify sense amplifier circuits S/A instructed to perform programming, the program data latch signal $\phi$load-changes to Vcc or Vcc +$\alpha$ to charge the program data storage node $N_{prog}$ to Vcc or Vcc−Vth only in the sense amplifier circuits S/A instructed to perform programming. In this manner, sense amplifier circuits S/A instructed to perform programming are identified.

If a program operation is performed under this situation, sense amplifier circuits S/A instructed to perform programming by the first to the last divisional program operations perform programming again because the node Q is Vss. This poses a problem of over-programming. To avoid this problem, as described previously, the next divisional program data can be loaded again from the input/output circuit I/O into the sense amplifier circuits S/A. Instead, it is also possible to perform a program verify read operation to invert latch circuits of sense amplifier circuits S/A which are instructed to perform programming by the first to the last program operations.

Next, similar to the operation of the conventional sense amplifier circuit S/A, bit lines are started to be charged on the basis of the data latched in the latch circuits LT. After the program operation, the program verify read operation is started. First, sense amplifier circuits S/A instructed to perform programming by the first to the last divisional program operations and sense amplifier circuits S/A instructed to perform programming by loaded data in the present divisional program operation are reset.

That is, the node $N_{prog}$ of a sense amplifier circuit S/A instructed to perform programming by the first to the last divisional program operations or a sense amplifier circuit S/A instructed to perform programming by the present divisional program operation is Vcc or Vcc−Vth. Therefore, when the reset signal RESET is changed to Vcc, the nodes Q and /Q of the latch circuit LT of a sense amplifier circuit S/A instructed to perform programming or instructed to perform programming change to Vss and Vcc, respectively.

Consequently, the latch circuits LT of the sense amplifier circuits S/A for which it is determined that programming is sufficiently performed by the preceding divisional program operations or program operations and of which nodes Q and /Q are Vcc and Vss, respectively, are inverted and reset.

Accordingly, for sense amplifier circuits S/A instructed to perform programming during the first to the last divisional program operations and sense amplifier circuits S/A instructed to perform programming by the present loaded data, it is determined by comparing the verify voltage with the threshold voltage each time a program verify read operation is performed whether or not the memory cell is sufficiently programmed.

Modifications of the flow chart shown in FIGS. 16 and 17 are described.

FIG. 16 shows that the inverse read operation (step S16) is performed prior to or after loading the divisional program data to the sense amplifiers. However, it is possible to reset the data of the sense amplifier circuits S/A, which are instructed to perform programming by the first to the last divisional program operations or are instructed to perform programming by the present loaded data, by setting the reset signal RESET to Vcc, instead of performing the inverse read operation. In this case, it is possible to reliability and quickly set the node Q of the sense amplifier circuits S/A, which are instructed to perform programming by the first to the last divisional program operations, to Vss since a possibility of erroneous reading is decreased compared to the inverse read operation.

Figure 22:
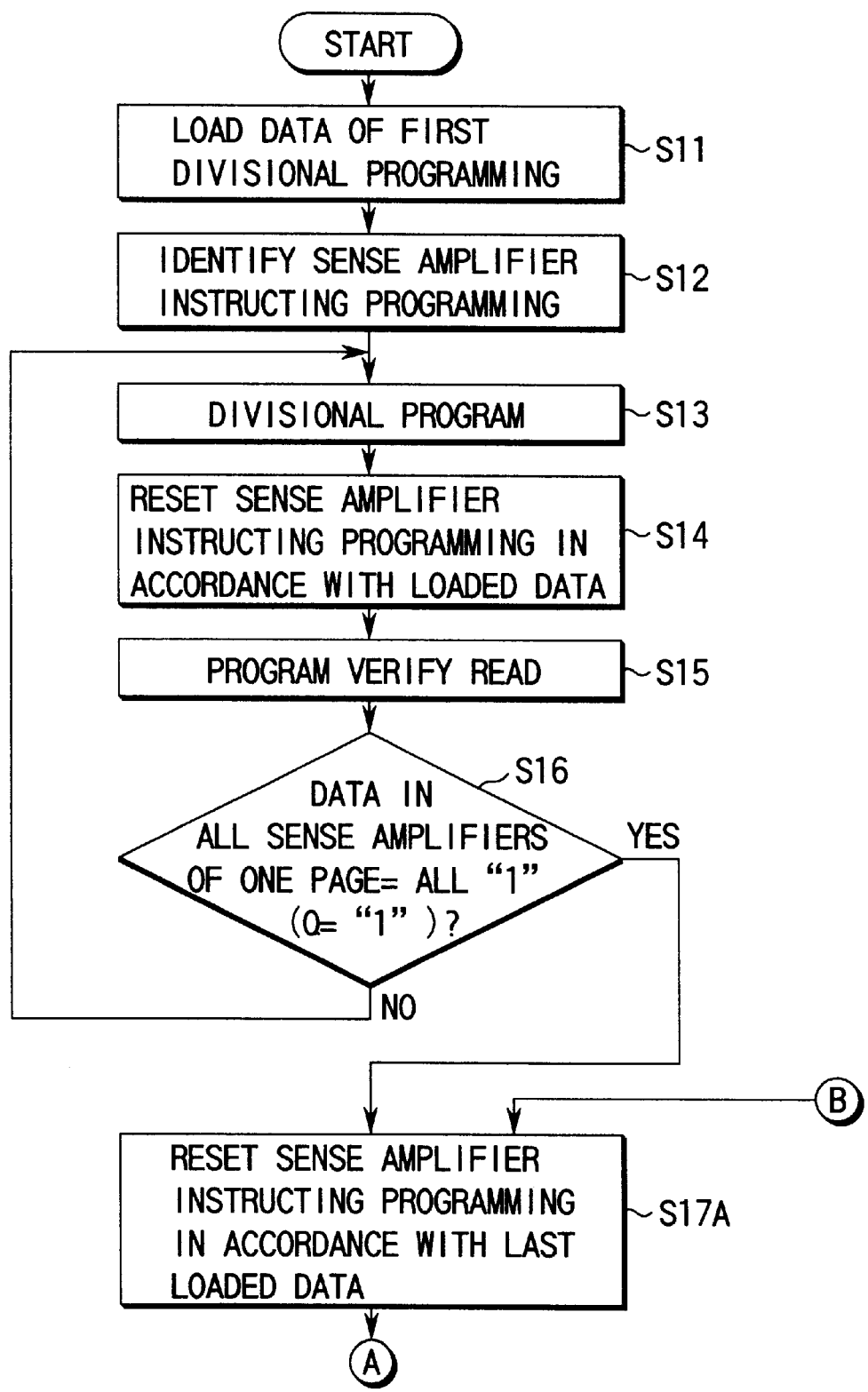
FIG. 22 is a flow chart showing another example of a flow of control performed by the sequence control means to perform the program operation and the program verify read operation for the NAND memory cell unit shown in FIG. 12.

That is, as shown in FIG. 22, the inverse read operation (step S17) is omitted and instead step S17A is performed in which the latch circuits of the sense amplifier circuits S/A are reset based on the divisional program data loaded in the first. to the last divisional program operations. After it is determined at step S16 that data of all the sense amplifier circuits S/A of one page indicate that all the memory 4=cells are completely programmed, the sense amplifier circuits S/A are reset based on the divisional program data loaded in the first to the last divisional program operations. After step S17A, step S18 (FIG. 17) is performed.

Figure 23:
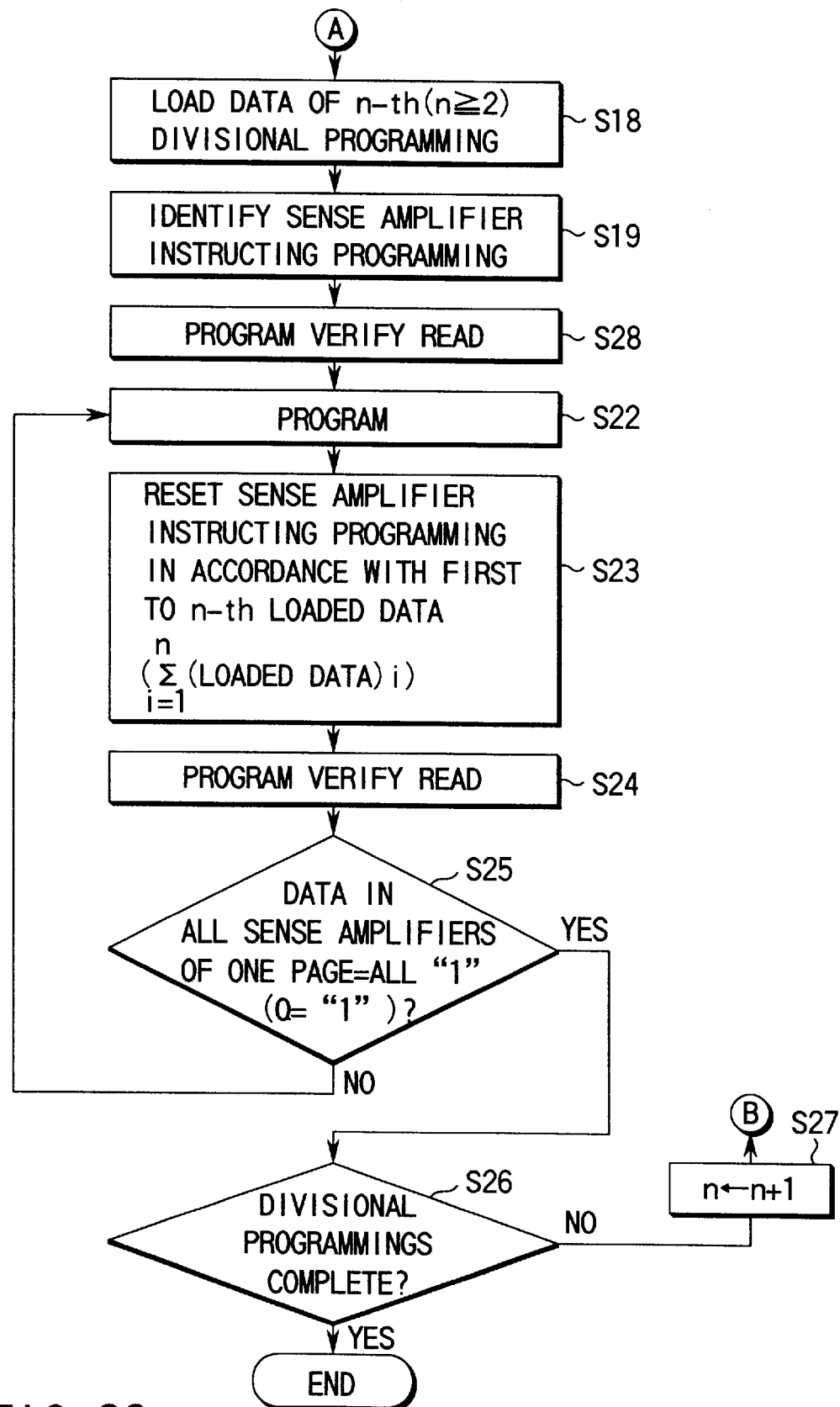
FIG. 23 is a flow chart showing a further example of a flow of control performed by the sequence control means to perform the program operation and the program verify read operation for the NAND memory cell unit shown in FIG. 12.

FIG. 23 shows a modification of FIG. 17. In FIG. 23, steps S20 and S21 of FIG. 17 are omitted and instead step S28 is performed in which a program verify read operation is performed. In this modification, the flow chart of FIG. 23 can follow the flow chart of FIG. 16 or 23.

Figure 24:
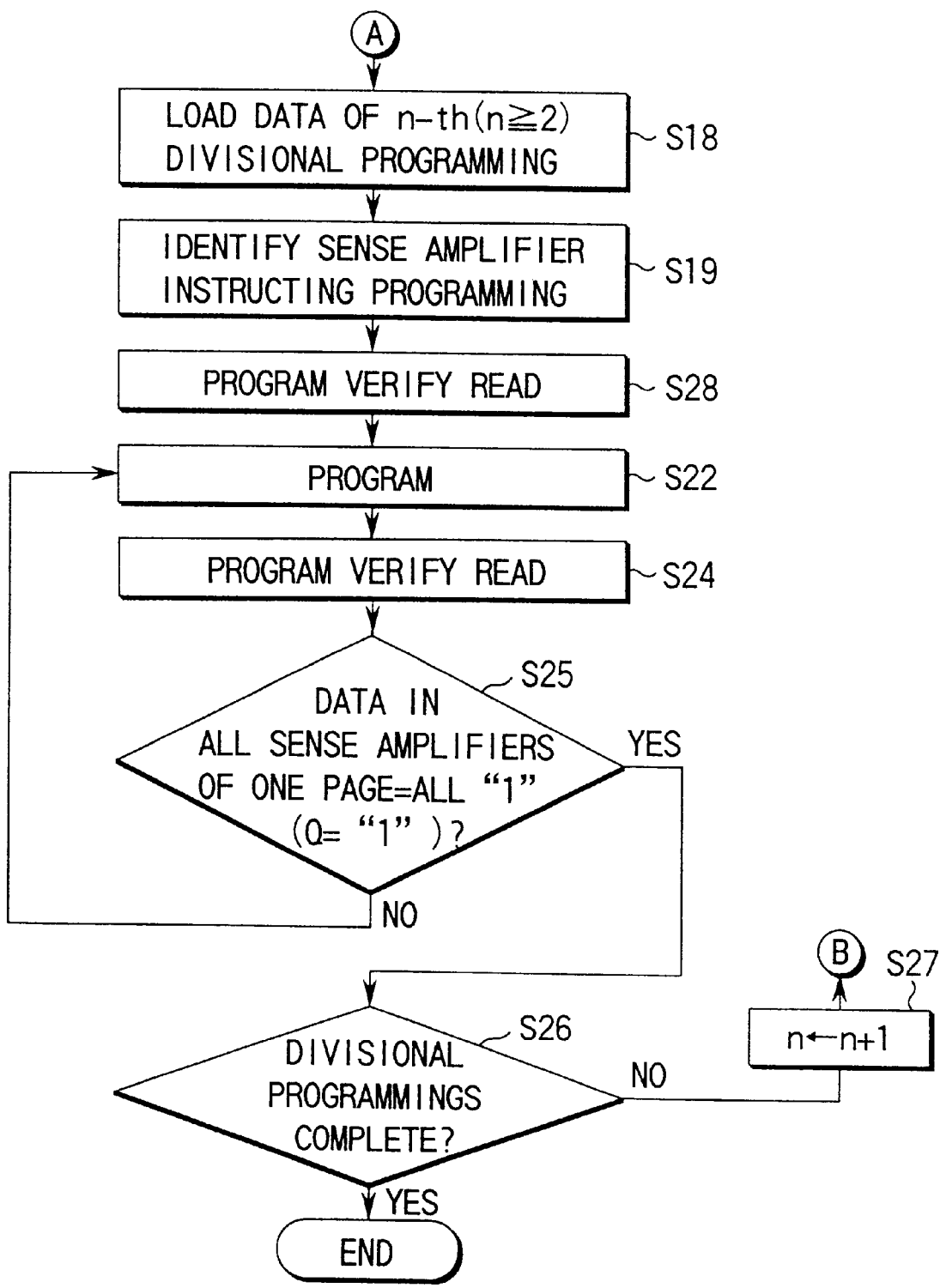
FIG. 24 is a flow chart showing a still another example of a flow of control performed by the sequence control means to perform the program operation and the program verify read operation for the NAND memory cell unit shown in FIG. 12.

FIG. 24 shows a modification of FIG. 23. In FIG. 24, step of resetting sense amplifier (step S23) of FIG. 23 is omitted. In this modification, the flow chart of FIG. 24 can follow a modified flow chart of FIG. 16 in which step of resetting sense amplifier (step S14) is omitted or another modified flow chart of FIG. 16 in which step of resetting sense amplifier (step S14) is omitted and inverse read operation (step S17) is replaced by the normal read operation with setting the word line potential to a normal read voltage which is lower than the verify voltage.

In the semiconductor memory device capable of divisional programming as described above, memory cells simultaneously selected by a word line are divisionally programmed in units of a plurality of bytes. The semiconductor memory device programming method according to the present invention capable of such divisional programming comprises the step of identifying sense amplifier circuits S/A instructed to perform programming and storing identification results in storing circuits when program data is loaded into the sense amplifier circuits S/A, and the step of resetting data in the sense amplifier circuits S/A instructed to perform programming by the first to the last divisional program operations and the sense amplifier circuits S/A instructing to perform programming by loaded data in the next(present) divisional program operation to the loaded data on the basis of the identification results in the storing circuits before the program verify read operation is performed at the divisional programming.

Figure 25:
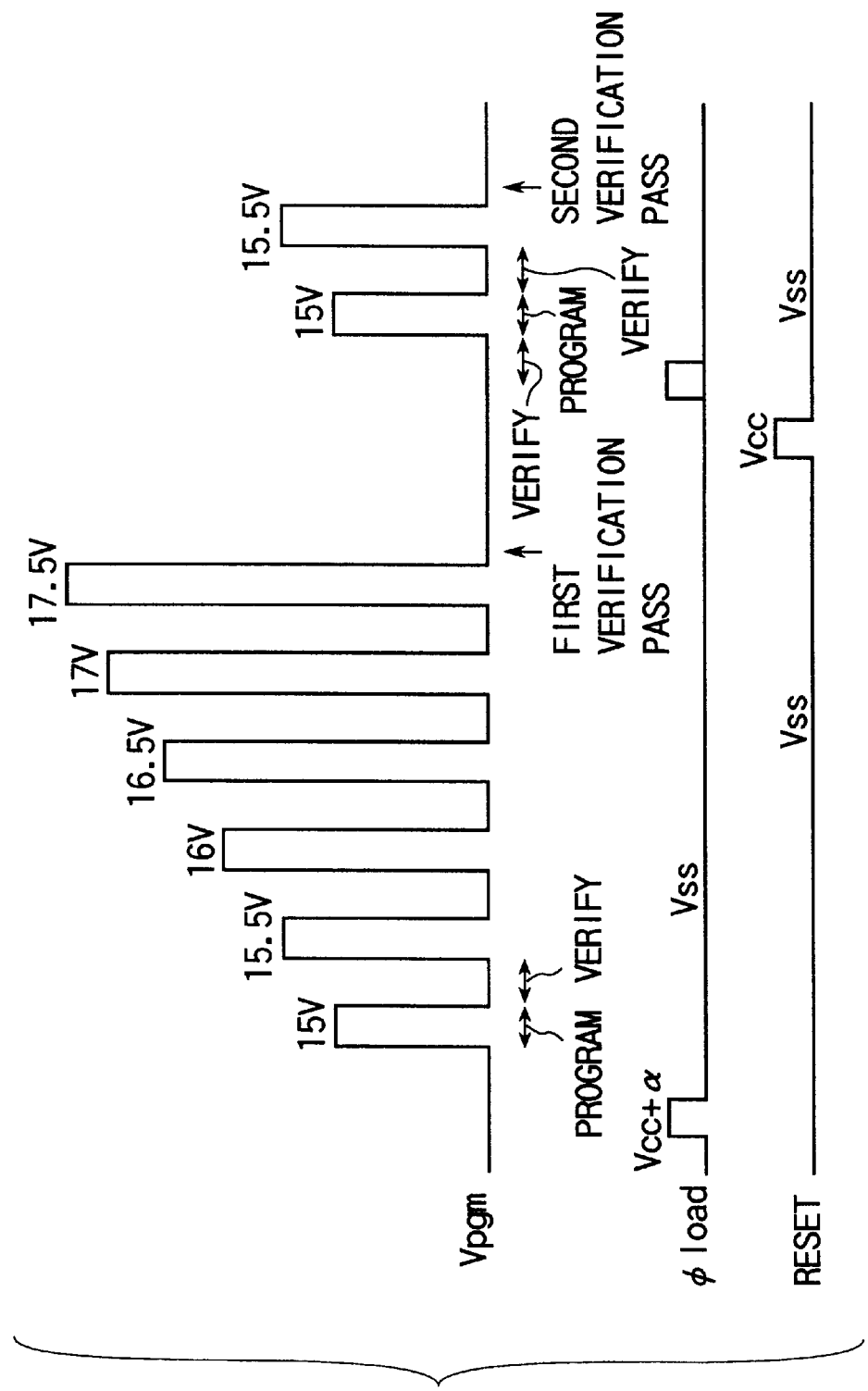
FIG. 25 is a timing chart showing an example of operation when the present invention is applied to a NAND cell type EEPROM of step-up program type.

A step-up programming in the NAND cell type EEPROM according to the present invention will be described below with reference to FIGS. 25, 26! and 27.

Step-up programming is a method of increasing the program voltage Vpgm step by step in each program/program verify read operation cycles. In this method, unlike in the method using a fixed program voltage, a memory cell having a high coupling ratio and hence easily programmable is programmed with a low voltage, and a memory cell having a low coupling ratio and hence hardly programmable is programmed with a high voltage. Consequently, the program time can be shortened. Also, the electric field applied to a memory cell upon programming can be kept lower than that in the method using a fixed program voltage.

First, when a program command is externally applied to the chip, programming is started. Program data is loaded into the sense amplifier circuits S/A (step S31 in FIG. 26). To identify sense amplifier circuits S/A instructed to perform programming, the program data latch signal $\phi_{load}$ changes to Vcc or Vcc+α to charge the program data storage node $N_{prog}$ to Vcc or Vcc−Vth only in the sense amplifier circuits S/A instructed to perform programming. In this manner, sense amplifier circuits S/A instructed to perform programming are identified (step S32). The operations until this point are the same as the operations shown in FIGS. 14 and 15.

Next, similar to the operation of the conventional sense amplifier circuit S/A, on the basis of the data latched in the latch circuits LT, the program voltage is increased step by step while a program/program verify read operation cycle is repeated (steps S33 to S35).

That is, the program voltage Vpgm is started from, e.g., 15 V and increased by 0.5 V each time the cycle is repeated. In a program verify read operation is performed at, e.g., 17.5 V, first program verification (first programming) is passed (step S36).

Next, sense amplifier circuits S/A instructed to perform programming by the loaded data are reset (step S37). That is, the node $N_{prog}$ corresponding to a sense amplifier circuit S/A instructed to perform programming is Vcc or Vcc−Vth. When the reset signal RESET is changed to Vcc, the nodes Q and /Q of the latch circuit LT of a sense amplifier circuit S/A instructed to perform programming change to Vss and Vcc, respectively.

Consequently, the latch circuits LT of the sense amplifier circuits S/A for which it is determined that programming is sufficiently performed by the preceding divisional program operations or program operations and of which nodes Q and /Q are Vcc and Vss, respectively, are inverted and reset. Accordingly, for sense amplifier circuits S/A instructed to perform programming by the first loaded data, it is determined by comparing again the verify voltage with the threshold voltage in a program verify read operation after first program verification is passed (steps S39–S40).

A memory cell found to be insufficiently programmed by the program verify read operation is further programmed (step S38). At this time, the program voltage Vpgm is again started from a low voltage, e.g., 15 V to avoid over-programming.

That is, if a memory cell once passed through program verify read operation with a low program voltage, e.g., 15 V is found to be insufficiently programmed by the later program verify read operation and further programmed with a high program voltage, e.g., 17.5 V, the memory cell is over-programmed because this program voltage is too high for this memory cell having a high coupling ratio.

A programming is complete when second program verification (second programming) is passed (step S41) in a program verify read operation is performed with a program voltage of, e.g., 15.5 V.

Figure 28:
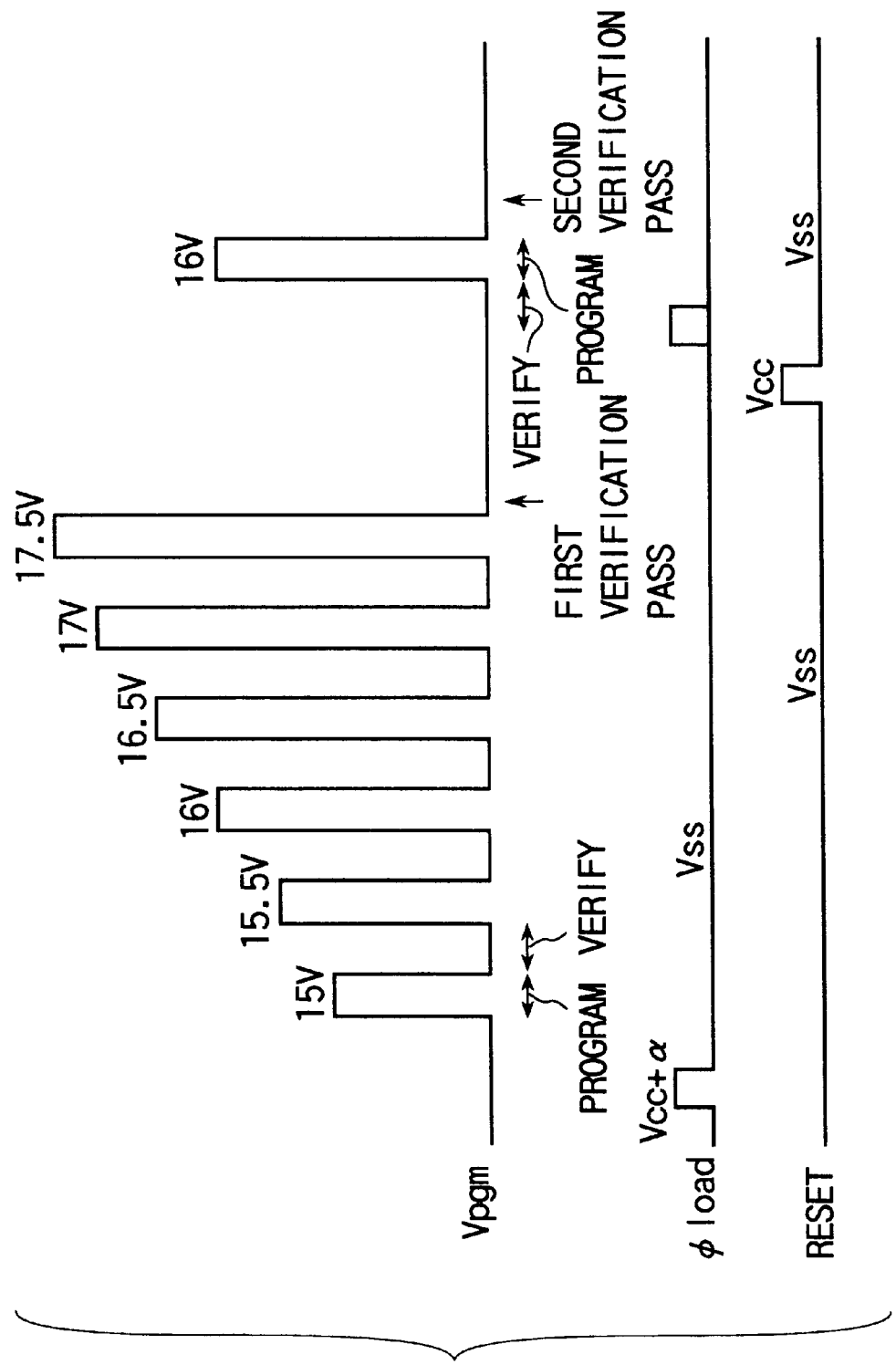
FIG. 28 is a timing chart showing another example of operation when the present invention is applied to the NAND cell type EEPROM of step-up program type.

As shown in FIG. 28, to shorten the program time it is also possible to set the start voltage of additional programming after the first verification pass to be higher by one or two steps than the initial program start voltage.

More specifically, when the initial program start voltage is 15 V, for example, the additional program start voltage is set at 16 V, a voltage two steps higher than 15 V. This is because electrons are injected into the floating gate of a memory cell in the first programming, so no over-programming results even if additional programming is performed with a voltage about IV higher than in the initial programming.

Figure 26:
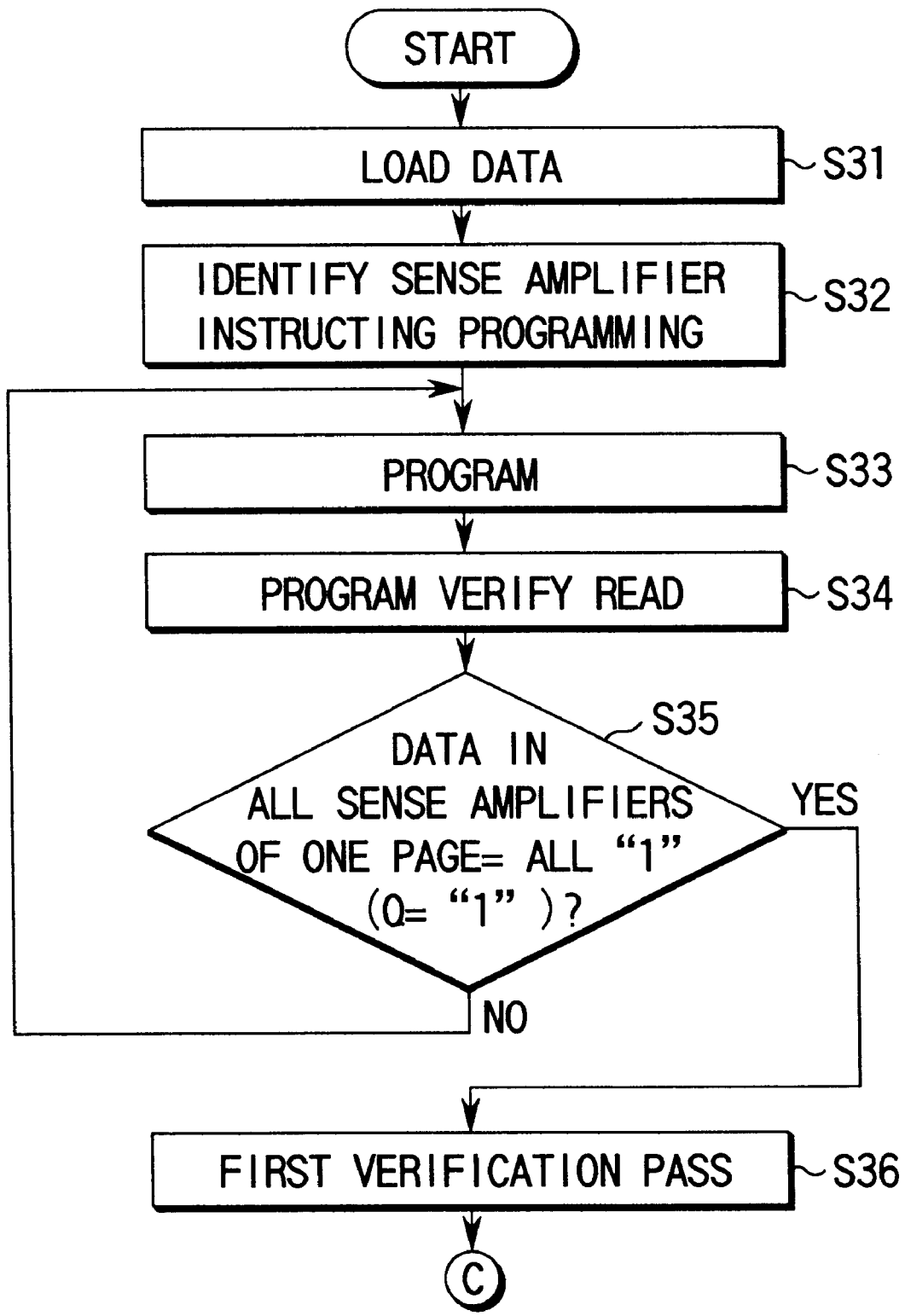
FIGS. 26 and 27 are flow charts showing a basic flow of operation when the present invention is applied to the NAND cell type EEPROM of step-up program type.
Figure 27:
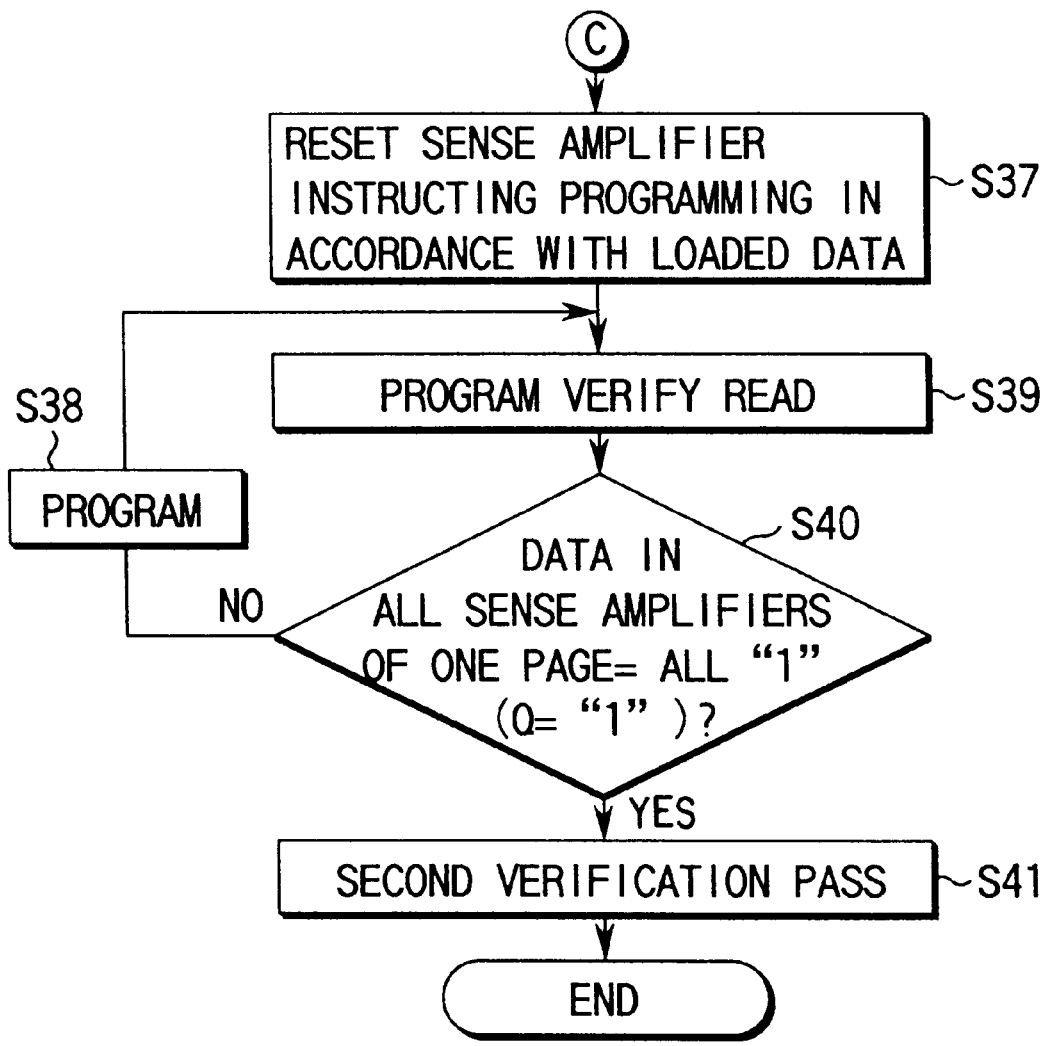

Note that the flow charts shown in FIGS. 26 and 27 are also effective in a program time multiplication method, in which the program time is doubled (twice, four times, eight times, . . . ) while the program voltage is fixed, as well as in step-up programming.

Figure 29:
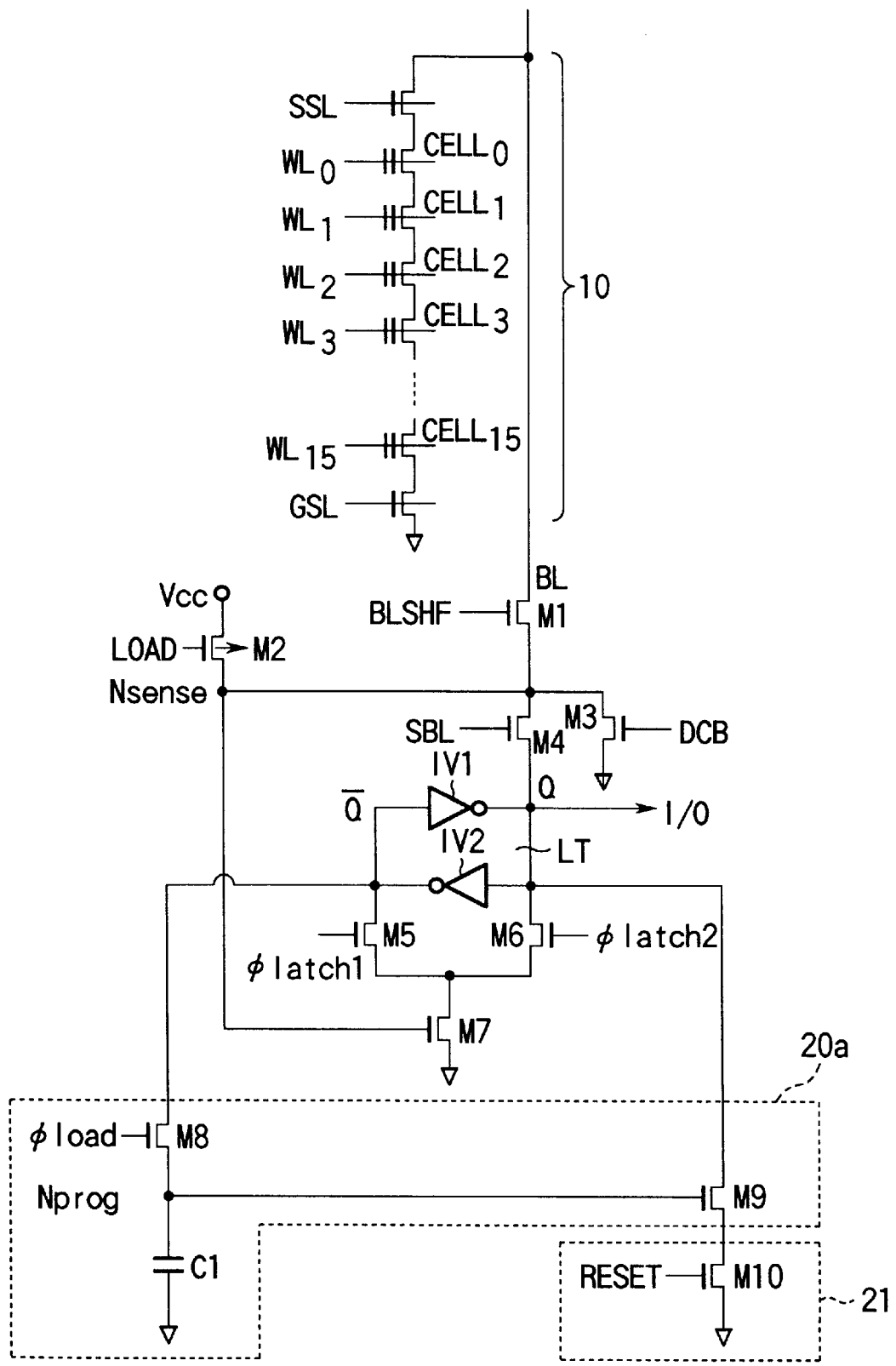
FIG. 29 is a circuit diagram showing a modification of the peripheral core circuit of the sense amplifier circuit S/A shown in FIG. 12.
Figure 30:
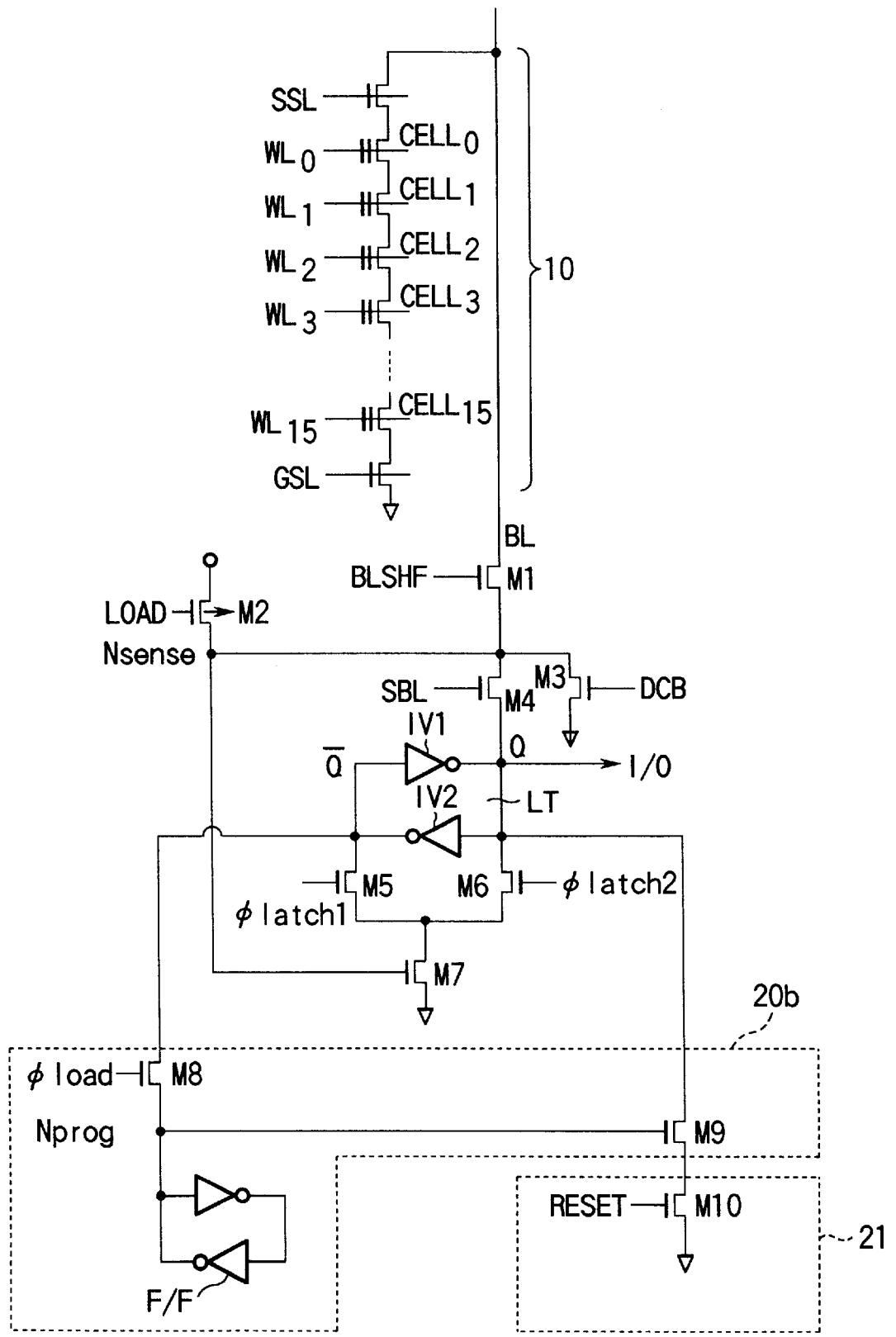
FIG. 30 is a circuit diagram showing another modification of the peripheral core circuit of the sense amplifier circuit S/A shown in FIG. 12.
Figure 31:
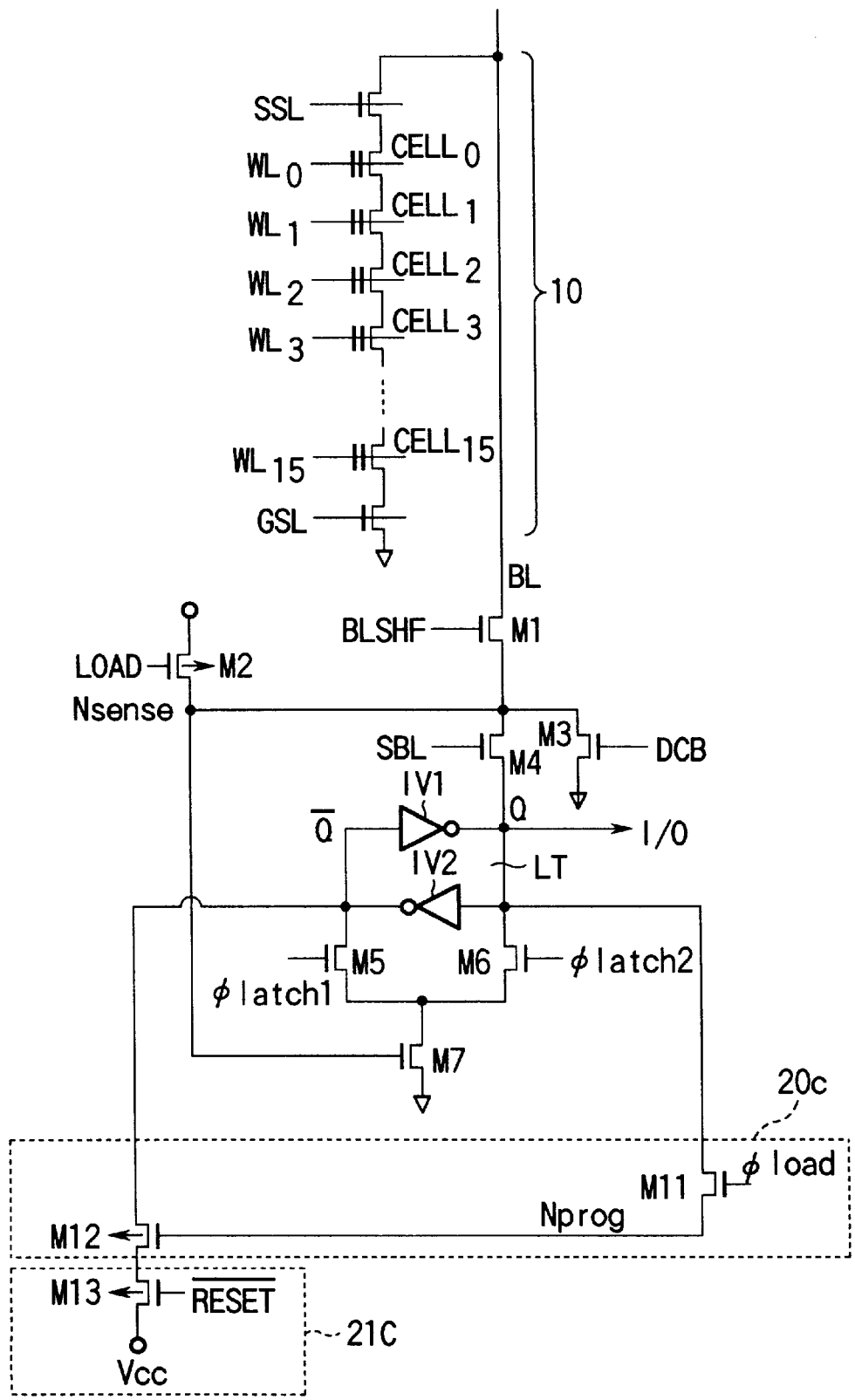
FIG. 31 is a circuit diagram showing still another modification of the peripheral core circuit of the sense amplifier circuit S/A shown in FIG. 12.

As modifications, the core circuit of the present invention is not limited to the circuit shown in FIG. 12 but also applicable to arrangements shown in FIGS. 29 and 31. Referring to FIG. 29, a core circuit includes a storing circuit 20a in which a capacitor C1 for storing program data is added to the program data storage node $N_{prog}$. Referring to FIG. 30, a core circuit includes a storing circuit 20b in which a flip-flop circuit F/F for latching storage data is added to the program data storage node $N_{prog}$.

Furthermore, the present invention is applicable to an arrangement shown in FIG. 31. A storing circuit 20c and reset circuit 21c shown in FIG. 31 include an NMOS transistor M11 and PMOS transistors M12 and M13, instead of the NMOS transistors M8, M9, and M10 of the storing circuit 20 and the reset circuit 21 shown in FIG. 12. In this arrangement, an inversion signal /RESET of a reset signal RESET is applied to the gate of the PMOS transistor M13.

When the storing circuit 20c and the reset circuit 21c with this arrangement are used, a sense amplifier circuit S/A instructed to perform programming by the first loaded data so operates as to reset the potential of the node Q to Vcc before each program verify read operation.

According to the first embodiment of the present invention as described above, data in a sense amplifier circuit S/A instructed to perform programming by loaded data is reset Before program verify read operation. Therefore, even a memory cell once passed through the program verify read operation is further programmed if the memory cell is found to be insufficiently programmed by a later program verify read operation. Consequently, the reliability of program data can be improved.

Also, when page divisional programming is performed, even a memory cell already programmed is further programmed if the memory cell is found to be insufficiently programmed by a later program verify read operation. This also improves the reliability.

In the above embodiment, the storing circuit 20 for storing data for identifying a sense amplifier circuit S/A instructed to perform programming is added to the sense amplifier circuit S/A. Before program verify read operation, the sense amplifier circuit S/A instructed to perform programming is reset on the basis of the identification data in the storing circuit. Therefore, even a memory cell once passed through a program verify read operation is further programmed if the memory cell is found to be insufficiently programmed by a later program verify read operation. This improves the reliability of program data. However, additional programming need to be performed only for cells having threshold voltages lower than Vref after programming. Accordingly, the storing circuit 20 can be omitted by using the latch circuit LT of the sense amplifier circuit S/A instead of the storing circuit 20. This modification will be described below.

The circuit diagram of this modification is the same as the prior art shown in FIG. 5.

The threshold voltage of the cell once passed through a program verify read operation seems to be slightly lowered when the other cells are programmed. However, it is higher than that of the memory cell to be kept erased. Therefore, if an inverse read operation is performed with setting the word line to a second verify level which is lower than the program verify level and higher than the read level, it is possible to read the data pattern to be programmed into the memory cells of one page connected to the word line from the memory cells and to load them to the latch circuits LT. Since "H" level data is read out to the sense node $N_{sense}$ in the read operation for the memory cell having a high threshold voltage, the node Q changes to a low level Vss if the control signal $\phi_{latch2}$ is a high level Vcc. Thus, it is possible to reset the latch circuit LT to the first loaded data.

Figure 32:
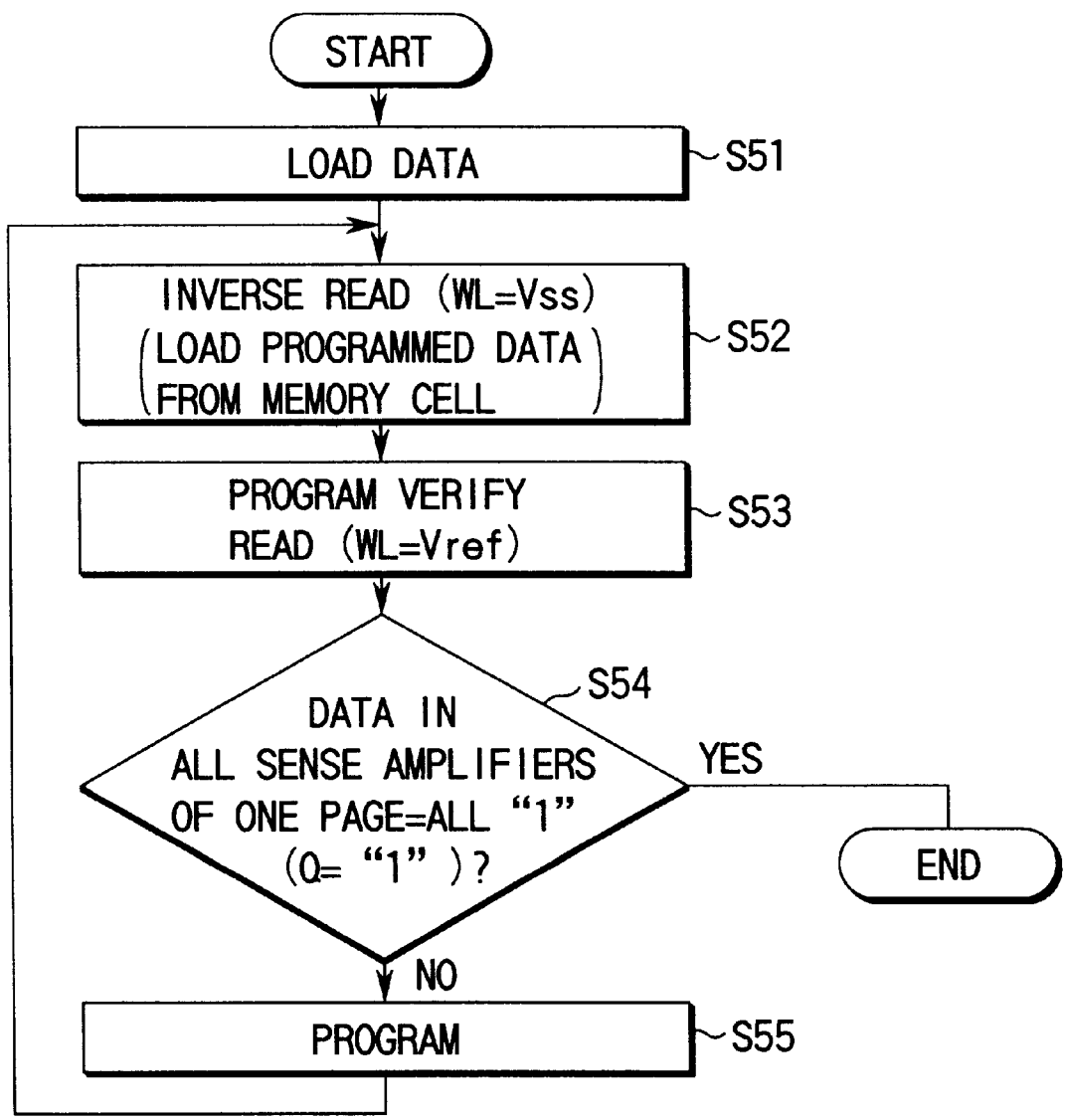
FIG. 32 is a flow chart showing a basic flow of a program operation and a program verify read operation in a modification of the present invention.

FIG. 32 shows a basic flow of control performed by the sequence control means to perform a program operation and a program verify read operation.

In step S51, the sequence control means loads program data in the latch circuits LT of the sense amplifier circuits S/A.

In step S52, the sequence control means performs an inverse read operation with setting the word line to a level (e.g., Vss) lower than the program verify level Vref. If it is determined that the memory cell has been sufficiently programmed and the nodes Q and /Q of the corresponding latch circuit are set to Vcc and Vss, the latch circuit LT is inverted. The data of the latch circuit corresponding to the memory cell to be further programmed is reset to the load data. Since the read operation is performed with setting the word line to a level lower than Vref, such as Vss, the memory cell is turned off even if its threshold voltage seems to be lower than Vref, the memory cell can be determined as the memory cell storing "0" data.

In step S53, the sequence control means performs a program verify read operation. At this time, the word lines are Vref. Since it is not preferable to further program the memory cell which is sufficiently programmed, a read operation is performed with setting the word line to a verify voltage Vref and setting the control signal $\phi_{latch1}$ to "H" level so that the latch circuit of the sense amplifier circuit S/A corresponding to the memory cell having a threshold voltage higher than Vref can be inverted again. Therefore, the nodes Q and /Q of the latch circuit of the sense amplifier circuit S/A corresponding to the sufficiently programmed memory cell are Vcc and Vss, respectively. The latch circuit of the sense amplifier circuit S/A corresponding to the erased memory is not inverted so that the nodes Q and /Q of the latch circuit are kept Vcc and Vss, respectively.

In step S54, the sequence control means determines whether data of all the sense amplifier circuits S/A of one page indicate that all the memory cells are completely programmed. If YES in step S54, the sequence control means completes programming. If NO in step S54, the flow returns to step S52 after performing a program operation (step S55).

It is to be noted that it is not necessary to perform steps S52, S53 and S54 before the program step S55 is performed first time.

As described, when an inverse read operation is performed with setting the word line to Vss and a program verify read operation is performed with setting the word line to Vref as in this modification, the sense amplifier can be reset to the state at the time of an inverse read operation when the program data is initially loaded. In the subsequent program verify read operation, it is determined whether or not the memory cell corresponding to the sense amplifier has been sufficiently programmed. Therefore, only the memory cell having a threshold voltage lower than Vref is further programmed. This obviates the need for the storing circuit 20 and achieves the same effect as in the above embodiment. State another way, it is possible to detect a memory cell having a threshold voltage lower than Vref after the program pass since the data pattern of the same word line is changed. Based on this detection, the initial load data can be read out to the sense amplifier. Additional programming is performed using this initial load data, thereby making the threshold level distribution of the memory cells narrow and improving the reliability and the reading performance of the memory cell.

Figure 33:
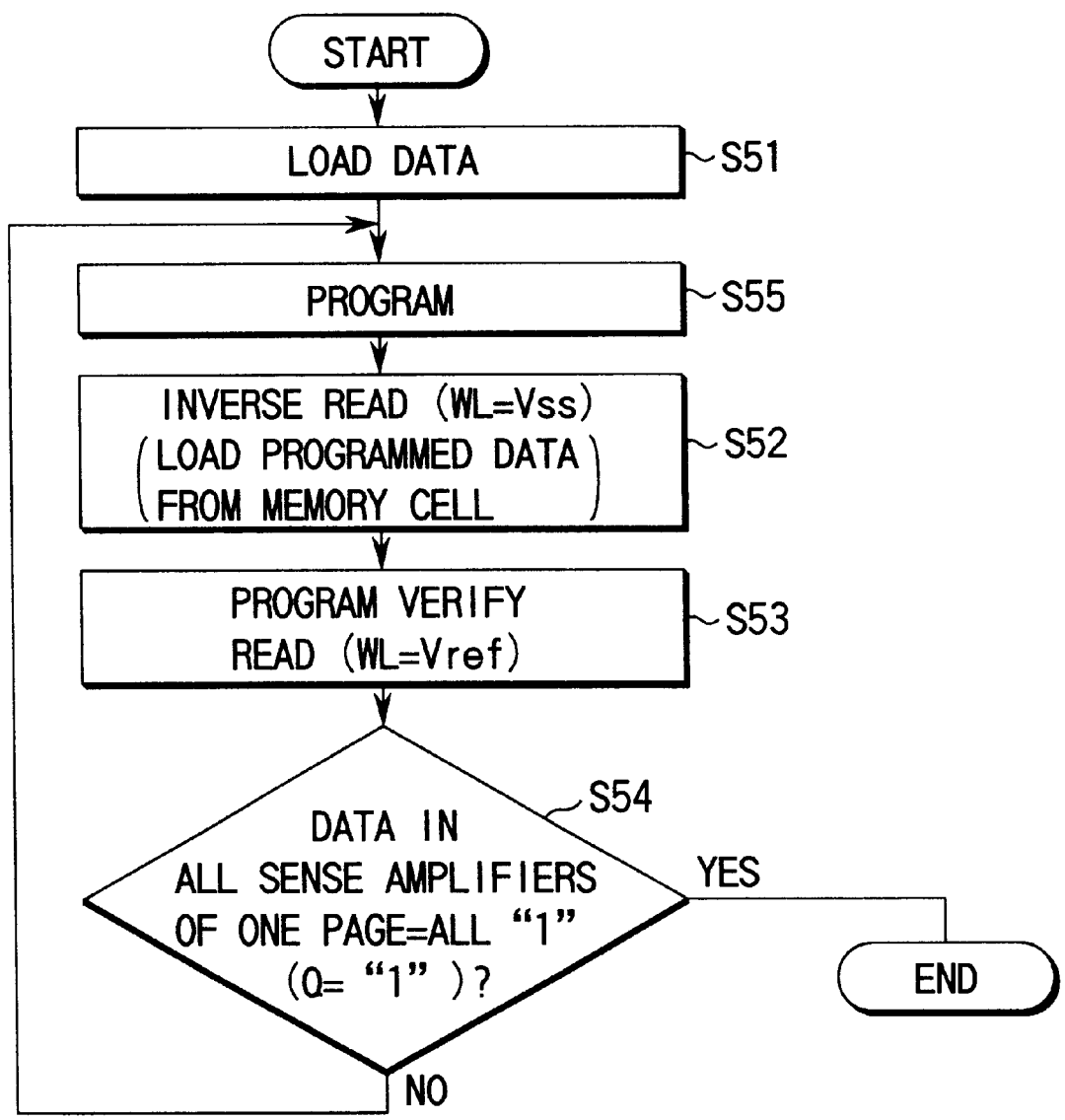
FIG. 33 is a flow chart showing a basic flow of a program operation and a program verify read operation in another modification of the present invention.

The flow chat shown in FIG. 32 can be modified by changing the execution timing of the program operation (step S55) as shown in FIG. 33.

Figure 34:
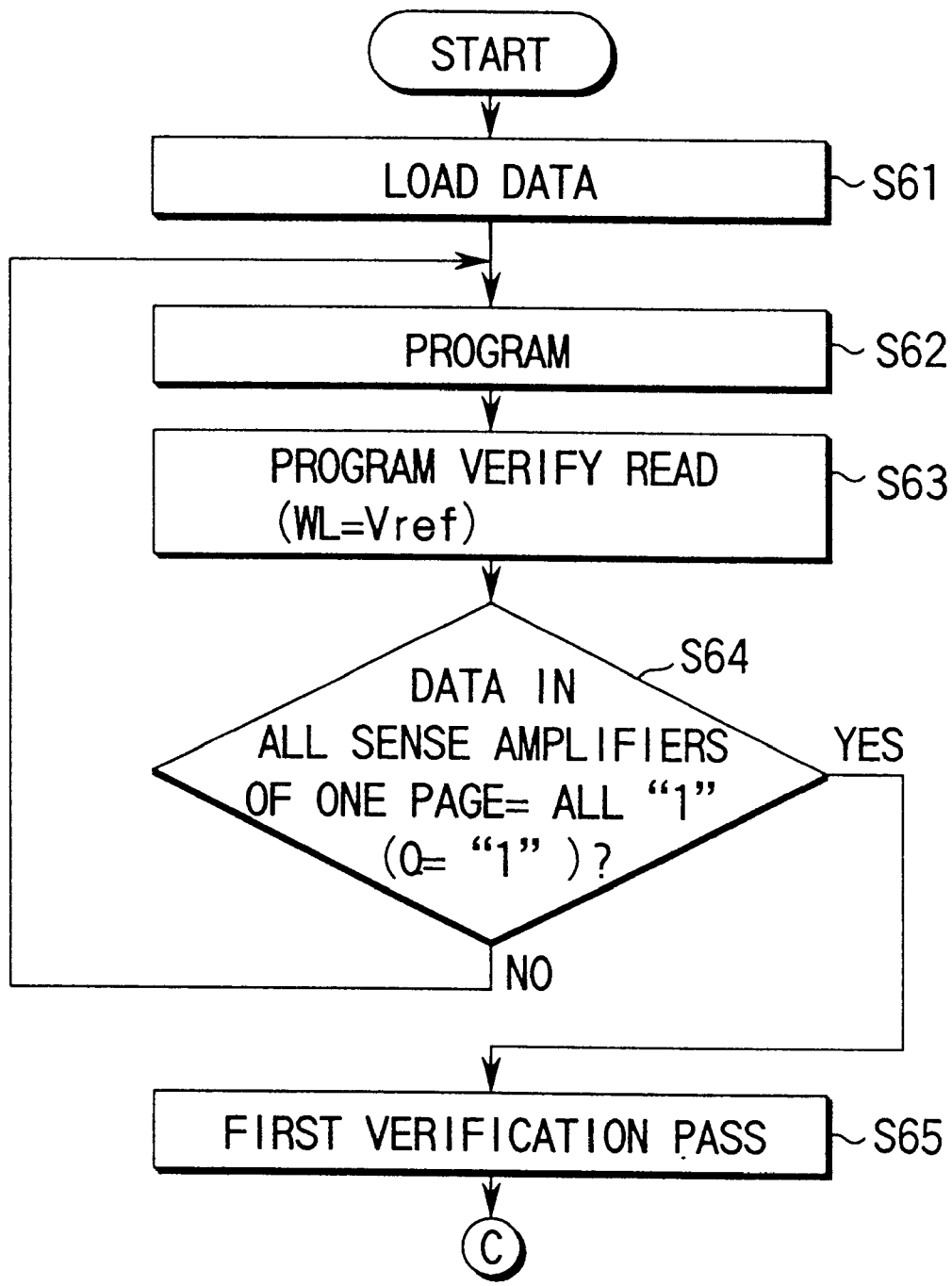
FIGS. 34 and 35 are flow charts showing a basic flow of a program operation and a program verify read operation in still another modification of the present invention.
Figure 35:
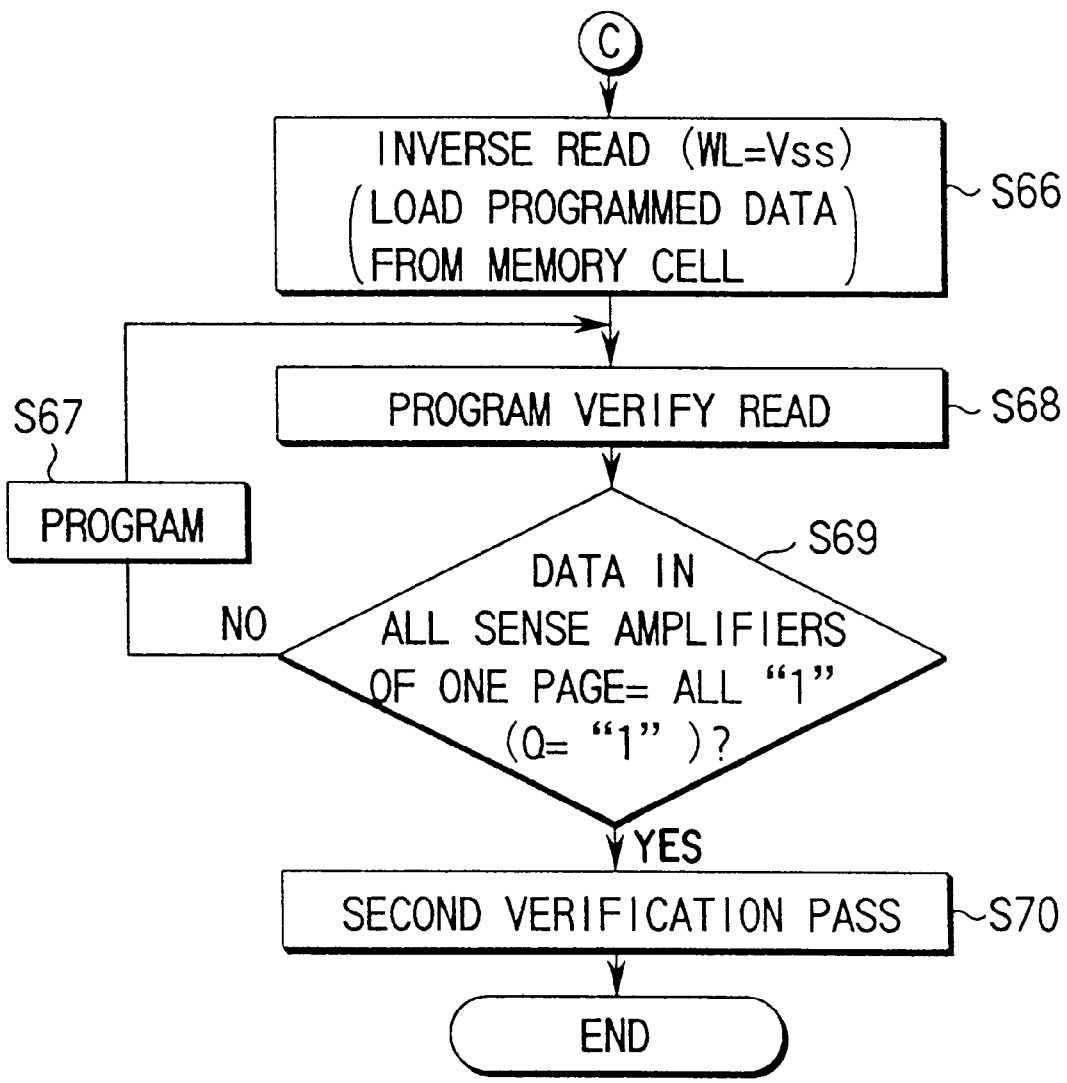

Further, in the flow charts shown in FIGS. 32 and 33, an inverse read operation and a verify read operation are performed in each cycle of a program operation. However, an inverse read operation can also be performed once after it is detected that data of all the sense amplifier circuits S/A of one page indicate that all the memory cells are completely programmed. This flow chart is shown in FIGS. 34 and 35.

In step S61, the program data is loaded into the latch circuits LT of the sense amplifier circuits S/A.

In step S62, the program operation is performed. In step S63, the program verify read operation is performed. In step S64, it is determined whether data of all the sense amplifier circuits S/A of one page indicate that all the memory cells are completely programmed. If YES in step S64, first program verification (first programming) is passed (step S65). If NO in step S64, a program operation is performed again (step S62).

Next, the inverse read operation is performed in step S66 with setting the word line to a level lower than Vref, such as Vss. Consequently, the latch circuits LT of the sense amplifier circuits S/A for which it is determined that programming is sufficiently performed and of which nodes Q and /Q are Vcc and Vss, respectively, are inverted. Therefore, it is possible to reset data of the sense amplifier corresponding to a memory cells to be programmed to the load data.

In step S68, the program verify read operation is performed.

In step S69, it is determined whether data of all the sense amplifier circuits S/A of one page indicate that all the memory cells are completely programmed. If YES in step S69, second program verification (second programming) is passed (step S70). If NO in step S69, a program operation is performed (step S67) and the flow returns to step S68.

Other embodiments of the present invention will be described below. In the following embodiments, the same reference numerals and symbols as in the first embodiment denote the same parts, and a detailed description thereof will be omitted.

Second Embodiment

Figure 36:
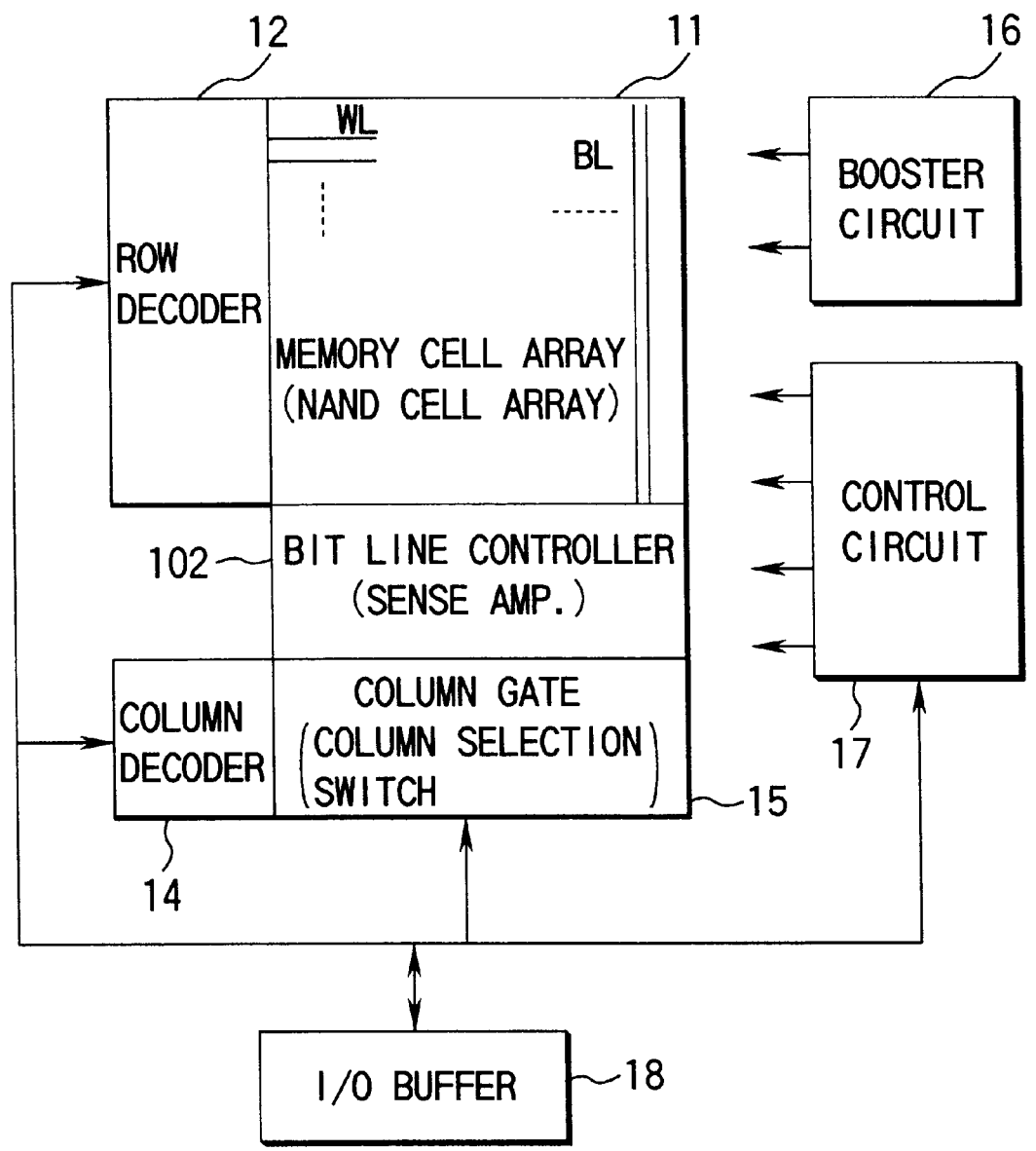
FIG. 36 is a block diagram showing the whole arrangement of a NAND cell type EEPROM according to a second embodiment of the present invention.

FIG. 36 shows the whole arrangement of a flush erasable NAND cell type EEPROM having a page program/read function and divisional program function according to the second embodiment of the present invention. FIG. 36 is the same as the NAND cell type EEPROM of the first embodiment shown in FIG. 11 except for a bit line controller 102. That is, the EEPROM of the second embodiment comprises a memory cell array 11, a row decoder 12, the bit line controller 102, a column gate 15, a column decoder 14, a data input/output (I/O) buffer 18, a booster circuit 16, and a control circuit 17. In the memory cell array 11, a plurality of memory cells building NAND cell units form a matrix, a plurality of bit lines BL as data lines extend in the column direction, and a plurality of word lines WL extend in the row direction. The row decoder 12 selectively drives the word lines of the memory cell array 11 on the basis of externally input addresses. The bit line controller 102 is connected to the bit lines BL of the memory cell array 11. The column gate 15 is connected to the bit line controller 102. The column decoder 14 controls the column gate 15 on the basis of externally input addresses and selects corresponding bit lines and sense amplifier circuits S/A. The data I/O buffer 18 is connected to the column gate 15. The booster circuit 16 supplies high voltages required for a program operation and an erase operation. The control circuit 17 controls the chip by generating data program, erase, and read control signals for the memory cell array 11 and interfaces with external devices.

In a program operation, erase operation, and read operation, the row decoder 12 selectively drives the word lines WL on the basis of address signals. A necessary voltage is supplied to the word line driver of the row decoder 12. The bit line controller 102 has a function of sensing bit line data in a read operation, a data latch function of storing externally loaded data in a program operation, and a function of selectively supplying a necessary voltage to the bit lines BL in program and erase operations.

The control circuit 17 includes a sequence control means (e.g., a programmable logic array) for controlling erase/erase verify, program/program verify, and read operations for NAND cell units.

Figure 37:
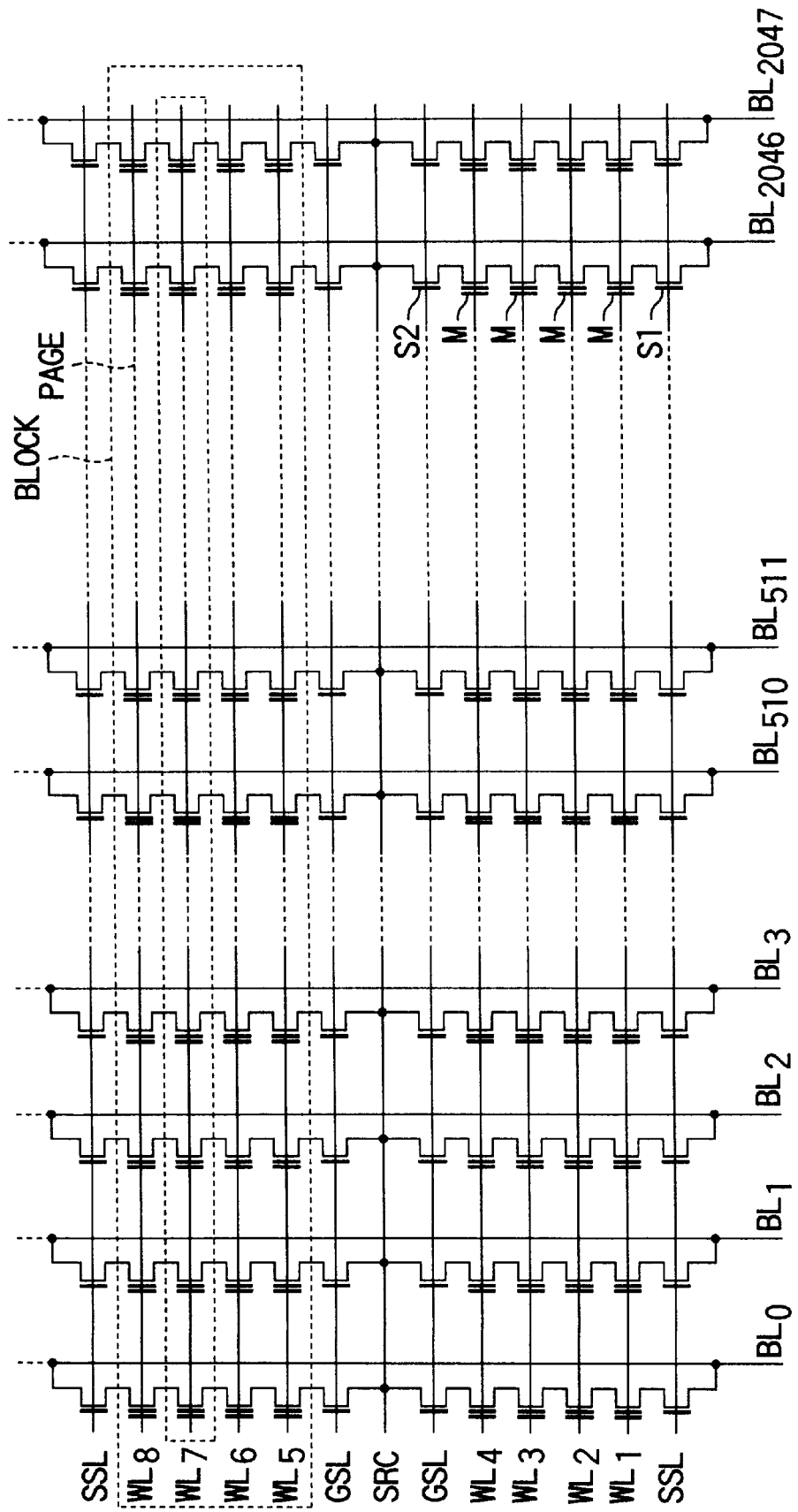
FIG. 37 is a circuit diagram showing the arrangement of a memory cell array in the EEPROM of the second embodiment.

FIG. 37 shows the arrangement of the memory cell array 11. Referring to FIG. 37, four memory cells M are connected in series to form one NAND cell unit. Generally, one NAND cell unit is made up of 8, 16, or 32 memory cells. Each memory cell M has a well-known FETMOS structure formed by stacking a floating gate and a control gate. A plurality of NAND cell units arrayed in the word line direction form one block. A row of memory cells along one word line in each block form one page. In an erase operation, one block is an erase unit. In program and read operations, one page is a program/read unit. Note that the memory cell array of the first embodiment shown in FIG. 11 may have the same arrangement shown in FIG. 37.

Figure 38:
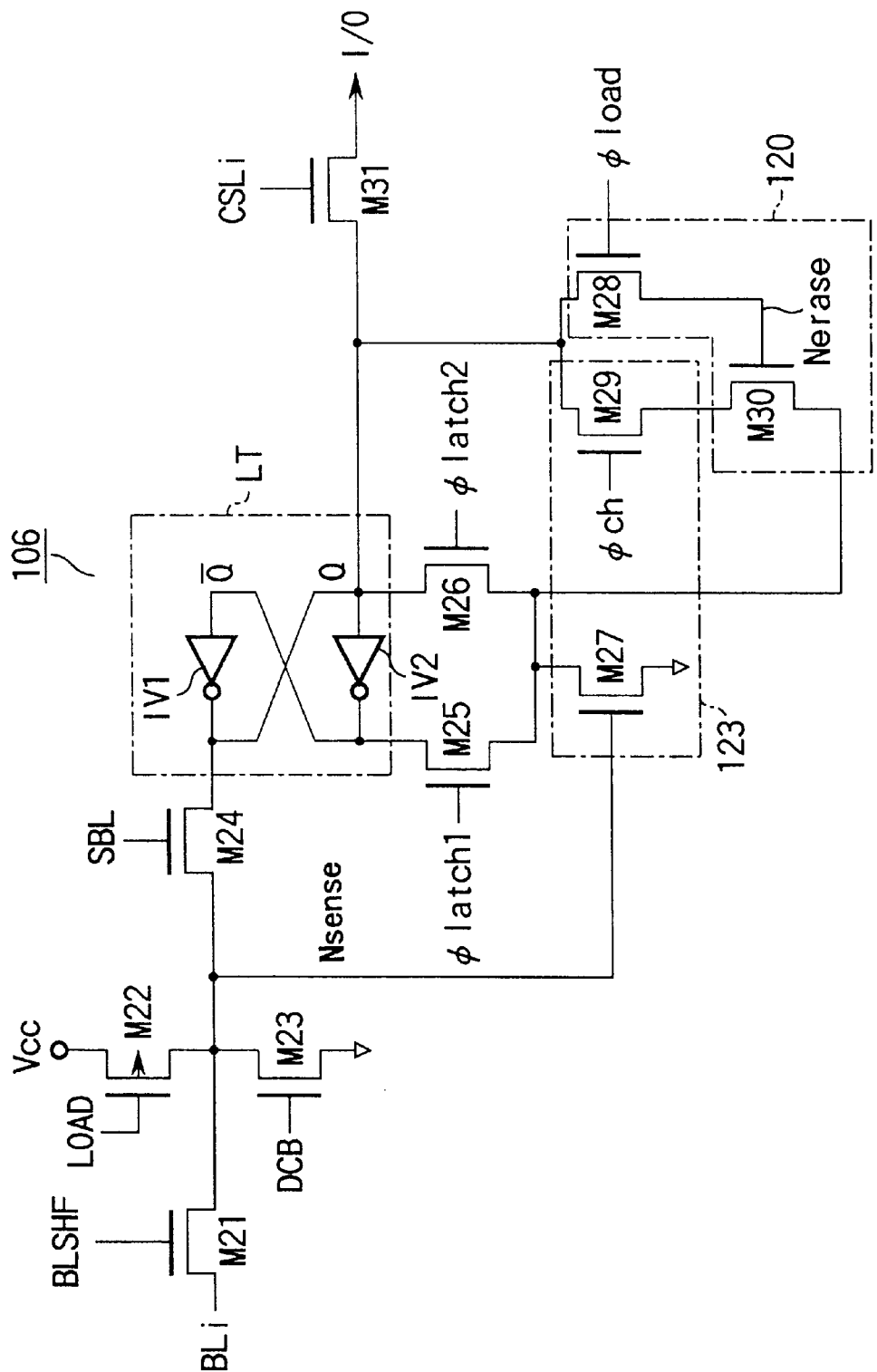
FIG. 38 is a circuit diagram showing the arrangement of a sense amplifier circuit S/A connected to one bit line in the second embodiment.

FIG. 38 shows the arrangement of the sense amplifier circuit S/A 106 connected to one bit line $Bl_i$ in the bit line controller 102 shown in FIG. 36. This sense amplifier circuit S/A 106 comprises a latch circuit LT comprised of two CMOS inverters IV1 and IV2 whose input and output terminals are cross-coupled. A second storage node Q of the latch circuit LT is connected to an I/O line through a column selection NMOS transistor M31 and also connected to the bit line BLi through a transfer gate NMOS transistor M24 for. resetting the sense amplifier circuit S/A and an NMOS transistor M21 for clamping the bit line potential. The connection node of the NMOS transistors M21 and M24 is a sense node $N_{sense}$. The sense node $N_{sense}$ is connected to a PMOS transistor M22 as a constant current source and an NMOS transistor M23. The PMOS transistor M22 charges the sense node $N_{sense}$ for a predetermined period on the basis of a precharge control signal LOAD. The NMOS transistor M23 is controlled by a discharge control signal DCB for discharging electric charge in the sense node $N_{sense}$. The first and second storage nodes /Q and Q of the. latch circuit LT are connected to timing control NMOS transistors M25 and M26, respectively. In a read operation and an inverted read operation, these NMOS transistors M25 and M26 are turned on to connect the corresponding nodes to a sensing NMOS transistor M27 under the control of control signals $\phi_{latch1}$ and $\phi_{latch2}$ respectively.

The second storage node Q to which program data of the latch circuit LT is loaded is connected to a data storing circuit 120 for storing the loaded data. The data storing circuit 120 comprises an NMOS transistor M30 as a memory MOS transistor and a programming NMOS transistor M28. The NMOS transistor M28 is inserted between the gate of the NMOS transistor M30 and the second storage node Q of the latch circuit LT and controlled by a control signal $\phi_{load}$. Thus, the data storing circuit 120 is a dynamic memory using the gate of the memory transistor M30 as a storage node $N_{erase}$.

The drain of the NMOS transistor M30 is connected to the second storage node Q of the latch circuit LT through a checking NMOS transistor M29 controlled by an erroneous program checking signal $\phi_{ch}$. The source of the NMOS transistor M30 is grounded through the common source of the timing control NMOS transistors M25 and M26 of the latch circuit LT and through the sensing NMOS transistor M27 controlled by the potential of the sense node $N_{sense}$. The sensing NMOS transistor M27 is also used to reset the latch circuit LT and invert the latched data therein together with the NMOS transistors M25 and M26. In accordance with AND logic of the potential of the storage node $N_{erase}$ of the data storing circuit 120 and the potential of the sense node $N_{sense}$, these NMOS transistors M29 and M27 ground the second storage node Q of the latch circuit LT to invert its data only when erroneous program occurs. That is, these NMOS transistors M29 and M27 build an erroneous program detecting circuit 123 for informing erroneous program.

Figure 39:
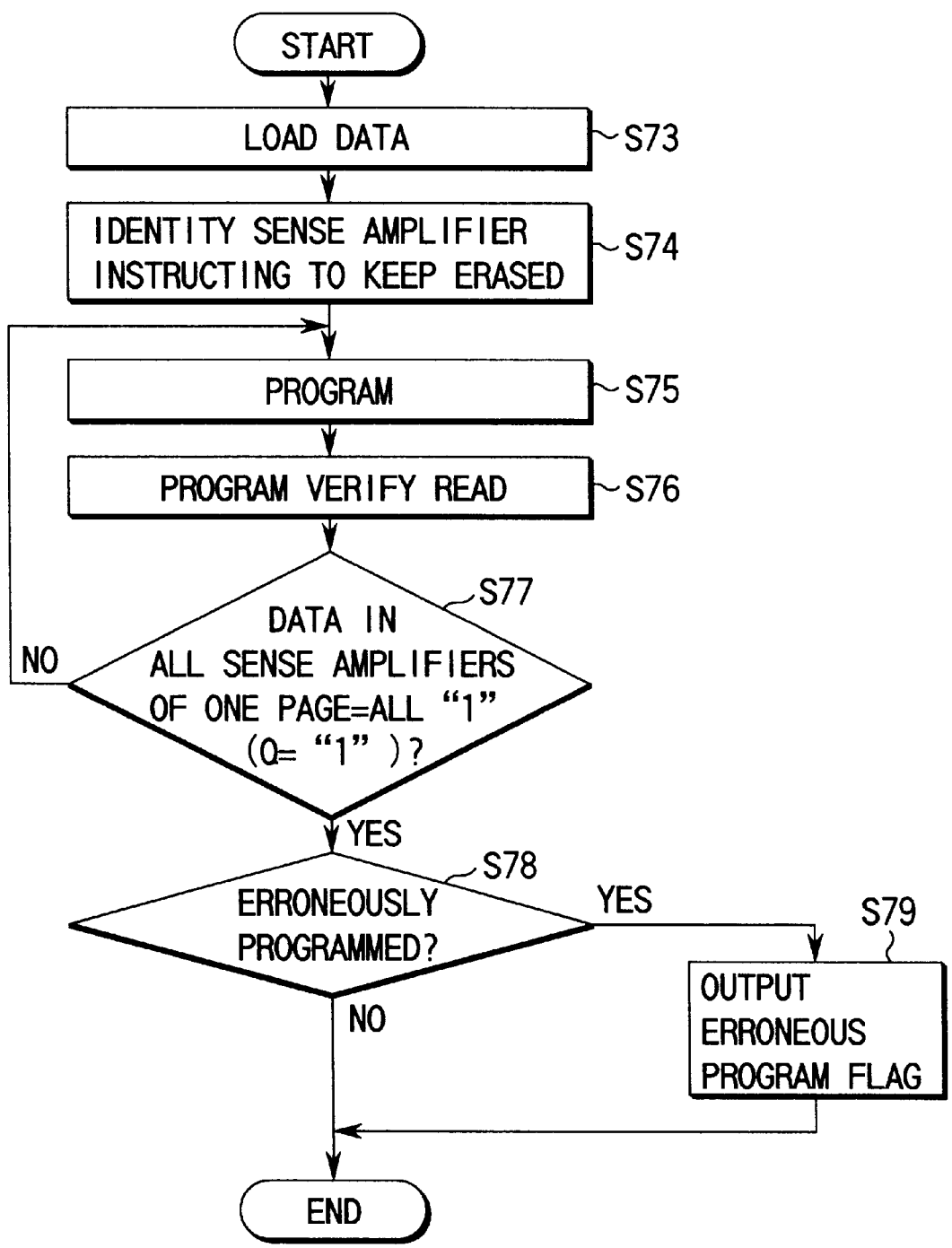
FIG. 39 is a flow chart showing a control flow of a program operation in the EEPROM of the second embodiment.

FIG. 39 is a flow chart showing an outline of sequence control for a program operation and a program verify read operation of the NAND cell type EEPROM according to this embodiment. This sequence control is performed by the control circuit 17 shown in FIG. 36. Program and program verify read operations will be briefly described below with reference to this flow chart.

In step S73, the control circuit 17 starts a program operation and loads program data of one page into the bit line controller 102.

In step S74, the control circuit 17 identifies sense amplifier circuits S/A 106 to be kept erased and stores the identification results in the data storing circuits 120. More specifically, the control circuit 17 stores the program data stored in the latch circuits LT in the data storing circuits 120.

In step S75, the control circuit 17 performs a program operation in accordance with the program data loaded into the latch circuits LT.

In step S76, the control circuit 17 performs a program verify read operation.

In step S77, the control circuit 17 determines whether all data of one page is completely programmed.

If YES in step S77, the control circuit 17 ends a program operation. If NO in step S77, the flow returns to step S75 to perform a program operation.

After the program operation, the control circuit 17 determines in step S78 whether erroneous program has occurred. More specifically, the control circuit 17 determines the presence/absence of erroneous program in accordance with AND logic of the data in the sense node and the data stored in the data storing circuit 120 in the read operation after the program operation or in the verify read operation.

If erroneous program is detected by forced inversion of data in the sense amplifier circuit S/A 106, the control circuit 17 outputs an erroneous program detection flag in step S77.

Figure 40:
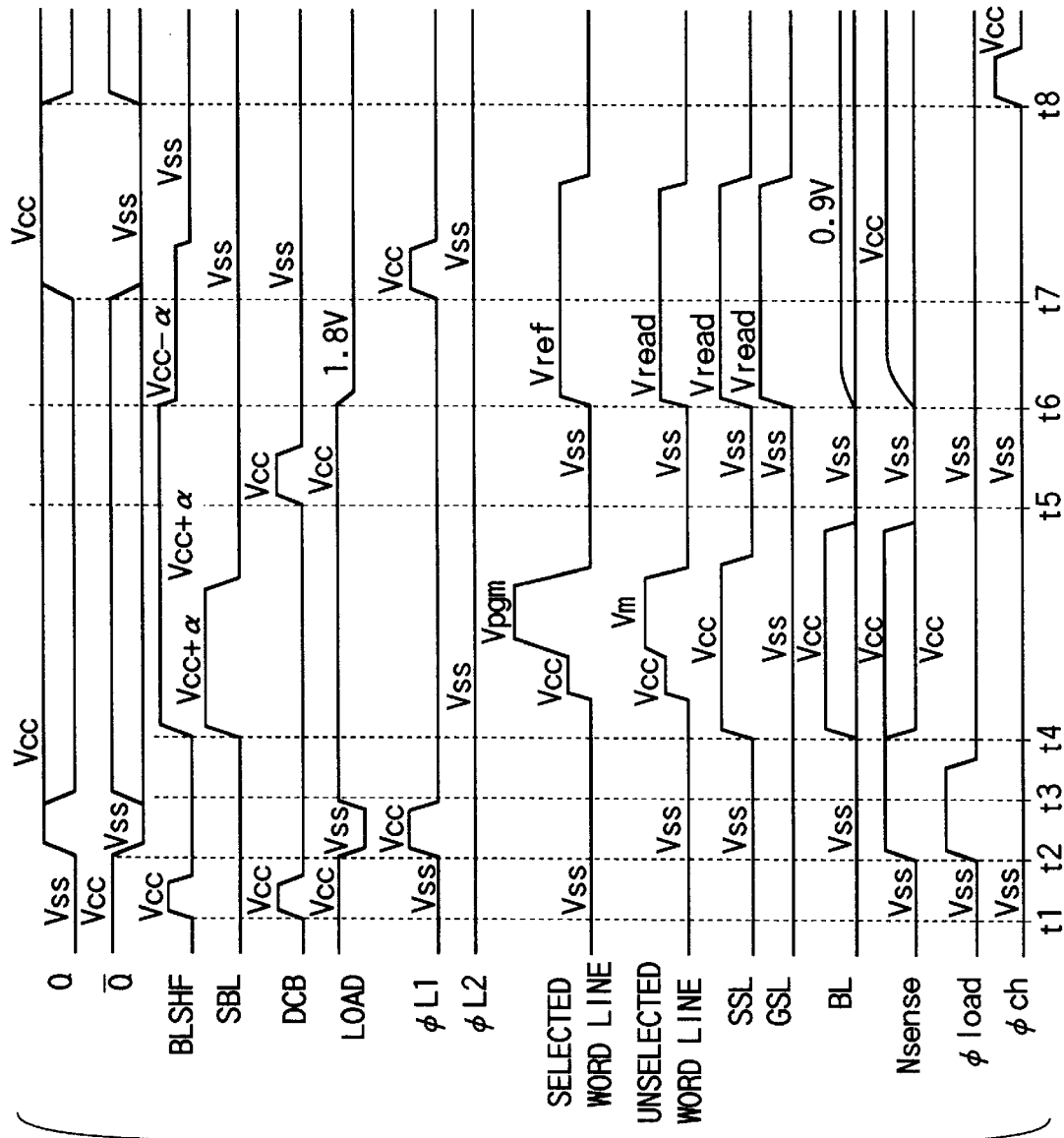
FIG. 40 is a timing chart showing the operation waveforms in programming, program verify read, and erroneous program detection operations with regard to the sense amplifier circuit S/A in the second embodiment.

Focusing attention on the operation of the sense amplifier circuit S/A 106 shown in FIG. 38, the program operation and the program verify read operation will be described in detail below with reference to a timing chart in FIG. 40. When a program command is externally input to the chip, programming is started. First, to reset the sense node $N_{sense}$, the control signal DCB changes to Vcc, and the MOS transistor M23 is turned on to ground the sense node $N_{sense}$ (t1). At the same time, a control signal BLSHF changes to Vcc, and the MOS transistor M21 is turned on to ground the bit line BL$_i$.

After that, prior to loading program data into the sense amplifier circuits S/A 106, the data latch control signal $\phi_{latch1}$ changes to Vcc, and the precharge control signal LOAD changes to Vss. Consequently, the MOS transistors M25 and M27 are turned on to ground the first storage node /Q of the latch circuit LT and preset the data (t2). That is, in all the sense amplifier circuits S/A of one page, the second and first storage nodes Q and /Q of the latch circuit LT change to Vcc and Vss, respectively.

Next, program data is loaded from an I/O line and latched in the latch circuits LT of the sense amplifier circuits S/A 106. The storage nodes Q and /Q are set to "H" and "L", respectively, or vice versa in accordance with the loaded data (t3). More specifically, in a sense amplifier circuit S/A 106 corresponding to a memory cell to be programmed, "L" (=Vss) is given to the second storage node Q. In a sense amplifier circuit S/A 106 corresponding to a program inhibited memory cell, "H" (=Vcc) is given to the second storage node Q.

Prior to this data loading, the program control signal $\phi_{load}$ of the data storing circuit 120 changes to Vcc (or Vcc+Vth; Vth is the threshold voltage of the programming MOS transistor M28) to latch Vcc or Vss in the second storage node Q. This potential is transferred to the storage node $N_{erase}$ through the MOS transistor M28. Consequently, the potential of "H" (=Vcc−Vth (or Vcc)) or "L" (=Vss) is dynamically stored. This potential is identification data of a sense amplifier circuit S/A 106 corresponding to a memory cell to be kept erased.

Subsequently, similar to the conventional program operation, the control signals BLSHF and SLB change to "H" to start charging the bit line BL$_i$ on the basis of the data latched in the latch circuit LT (t4). That is, the bit line to be programmed is kept Vss, and each program inhibited bit line is charged to Vcc. A word line is selected, and the selected word line rises to a program voltage Vpgm (about 20 V). The other unselected word lines change to an intermediate voltage Vm (=Vpass: about 10 V). By this operation, memory cells of one page arranged along the selected word line are programmed.

After program operation, the program verify read operation is started.

This program verify read operation is similar to that of the conventional sense amplifier circuit S/A. First, by changing the control signal DCB to Vcc, the MOS transistor M23 is turned on to ground the sense node $N_{sense}$ (t5). Subsequently, a verify voltage (reference voltage) Vref (around 0.5 V) is applied to the selected word line, and a read voltage Vread (around 4.5 V) is applied to the unselected word lines and control gate lines SSL and GSL, thereby performing a verify read operation (t6). More specifically, the control signal BLSHF set at a boosting voltage Vcc+α is clamped to Vcc−α, and the precharge control signal LOAD is clamped to about 1.8 V. In this manner, the memory cell current flowing through the MOS transistor M21 and the current in the MOS transistor M22 for charging the sense node $N_{sense}$ are balanced to perform the read operation. For example, the cell current in an erased memory cell is at least approximately 2 μA. Therefore, the current in the MOS transistor M22 is set at about 1.5 μA in accordance with the cell current. If a memory cell to be programmed is sufficiently programmed with the threshold voltage Vref or higher and the potential of the bit line to be programmed rises to, e.g., 0.9 V, the MOS transistor M21 is cut off, and the sense node $N_{sense}$ changes to Vcc.

When the sense node $N_{sense}$ thus changes to "H" (=Vcc), the latch control signal $\phi_{latch1}$ changes to Vcc, and the MOS transistor M25 is turned on (t7). When the sense node $N_{sense}$ is Vcc (i.e., in a sense amplifier circuit S/A 106 connected to a memory cell whose threshold voltage is higher than the verify voltage Vref), the MOS transistor M27 is turned on. Consequently, the first storage node /Q changes to Vss, and the second storage node Q changes to Vcc. Accordingly, when a sense amplifier circuit S/A 106 in which Vss is loaded into the first storage node /Q and corresponding to a memory cell to be programmed normally performs programming, the latch data is inverted. If, on the other hand, the memory cell is insufficiently programmed, the sense node $N_{sense}$ remains "L" (=Vss) in verify read operation. Therefore, no data inversion occurs in the latch circuit LT, and the second storage node Q stores Vss. In a sense amplifier circuit S/A 106 connected to a program inhibited memory cell, no data inversion occurs because the second storage node Q is Vcc and the first storage node /Q is originally Vss.

While insufficiently programmed memory cells remain, i.e., while sense amplifier circuits S/A 106 in which no data inversion has occurred in the latch circuit LT remain, the programming operation and the verify read operation are repeatedly performed. The program operation is complete when it is determined that the potential of the second storage node Q has changed to Vcc in all the sense amplifier circuits S/A 106 of one page.

After the program operation, erroneous program is detected by changing the checking signal $\phi_{ch}$ to Vcc (t8). As described above, the storage node $N_{erase}$ of the data storing circuit 120 is Vss (therefore, the memory transistor M30 is OFF) in a sense amplifier circuit S/A 106 for performing programming and Vcc (or Vcc−Vth) (therefore, the memory transistor M30 is ON) in a program inhibited sense amplifier circuit S/A 106. In a sense amplifier circuit S/A 106 in which erroneous program has occurred, the sense node $N_{sense}$ changes to Vcc in the verify read operation, and the NMOS transistor M27 is turned on accordingly. Therefore, when the NMOS transistor M29 is turned on by the checking signal $\phi_{ch}$, the second storage node Q of the latch circuit LT is grounded through the MOS transistors M29, M30, and M27, and the data is inverted.

In contrast, in a sense amplifier circuit S/A 106 in which programming has been correctly performed, the memory transistor M30 is OFF, so no data inversion occurs in the latch circuit LT. Also, in a sense amplifier circuit S/A 106 which has been instructed to inhibit programming and yet has not performed programming in accordance with the instruction, the sense node $N_{sense}$ is Vss, and the NMOS transistor M27 is OFF. Therefore, no data inversion occurs in the latch circuit LT. It is possible to read out the data to the sense node $N_{sense}$ by a normal read operation with setting the word line to a voltage lower than Vref, such as Vss in stead of by a verify read operation.

As described above, when the checking signal $\phi_{ch}$ is changed to Vcc after a program operation, the potential of the second storage node Q, which is "H" in all the sense amplifier circuits S/A 106 because the program operation is complete, is discharged through the MOS transistors M29, M30, and M27 which are simultaneously turned on only in a sense amplifier circuit S/A 106 being erroneously programmed. Consequently, the data is inverted. This data inversion functions as an erroneous program detection signal in a one-page program operation.

Figure 41:
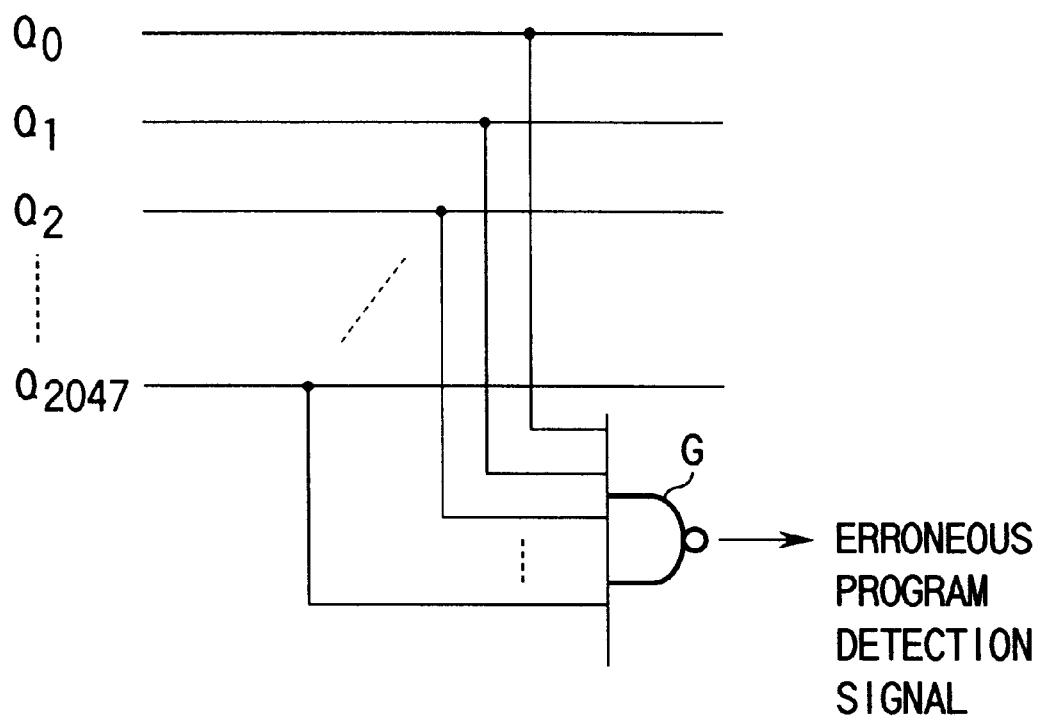
FIG. 41 is a circuit diagram showing a. circuit for outputting an erroneous program determination signal in the second embodiment.

Erroneous program detection can be done by providing a detecting circuit in the EEPROM chip. This detecting circuit reads out data from sense amplifier circuits S/A 106 of one page by column scan through the column gate 15, and outputs a pass or fail flag. In a simpler form, as shown in FIG. 41, a NAND gate G whose inputs are connected to first nodes $Q_0$ to $Q_{2047}$ of sense amplifier circuits S/A of one page is provided in the chip. When coincidence detection of the first nodes $Q_0$ to $Q_{2047}$ is performed, it is possible to output an erroneous program detection signal which is "H", only when erroneous program occurs. By outputting the result of this erroneous program detection to the outside of the chip, the user can be informed of the occurrence of the erroneous program. This logic gate circuit for combining the logic levels of the data at the respective storage nodes of the sense amplifier circuits S/A of one page can also be preferably used as a determination circuit as shown in step S77 in FIG. 39 for determining whether all data of one page is completely programmed in the EEPROM program operation.

EEPROM data read and erase operations in this embodiment are the same as the conventional operations. That is, a data read operation is basically identical with the programming verify read operation with reference to FIG. 40 except that 0 V is applied to the selected word line. A read operation is also performed in units of pages. A data erase operation is performed by applying 0 V to all word lines in units of blocks, applying an erase voltage to the bulk (the substrate and well), and emitting electrons from the floating gates of all memory cells in each block. An erase verify read operation is identical with the program verify read operation except for the reference voltage for a selected word line.

Figure 42:
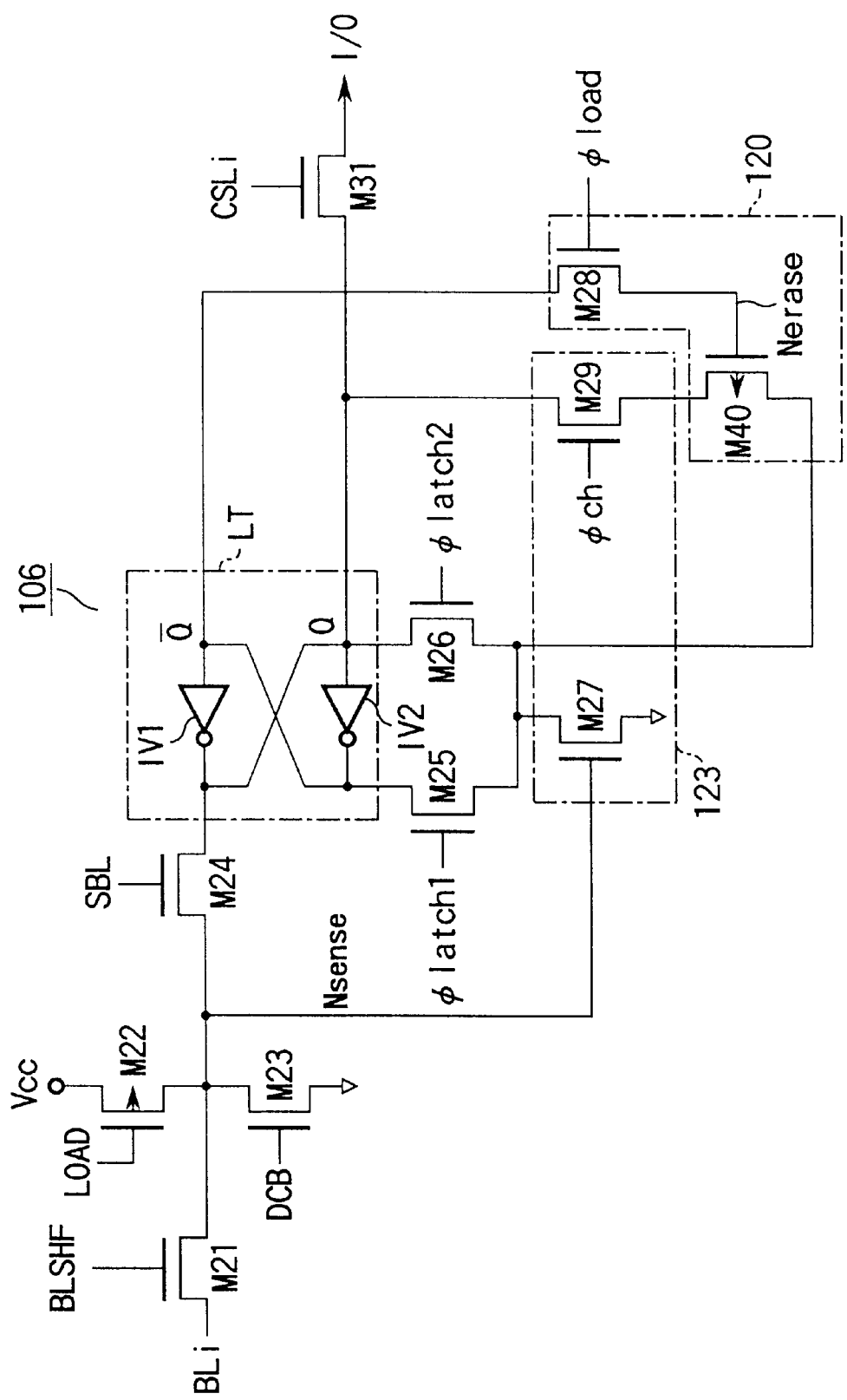
FIG. 42 is a circuit diagram showing the sense amplifier circuit S/A configuration of a NAND cell type EEPROM according to a first modification of the first embodiment of the present invention.

FIG. 42 shows the sense amplifier circuit S/A of a NAND cell type EEPROM according to the first modification of the second embodiment of the present invention. In the second embodiment, the NMOS transistor M30 is used as a memory transistor. In this modification, a PMOS transistor M40 is used as a memory transistor. Accordingly, in contrast with FIG. 38, the drain of a programming NMOS transistor M28 is connected to the first storage node /Q of a latch circuit LT so as to store data in the first storage node /Q. The rest is identical with the embodiment shown in FIG. 38.

That is, in the embodiment shown in FIG. 38, when Vcc is loaded into the second storage node /Q of the latch circuit LT, Vcc is programmed in the storage node $N_{erase}$ of the data storing circuit 120, and the NMOS memory transistor M30 is turned on to store program data. In this modification shown in FIG. 42, on the other hand, when Vcc is loaded into the second storage node Q of the latch circuit LT, Vss of the first storage node /Q is programmed in a storage node $N_{erase}$ of a data storing circuit 120, and the PMOS memory transistor M40 is similarly turned on to store program data. Therefore, erroneous program detection can be performed by the same logic as in the second embodiment.

Figure 43:
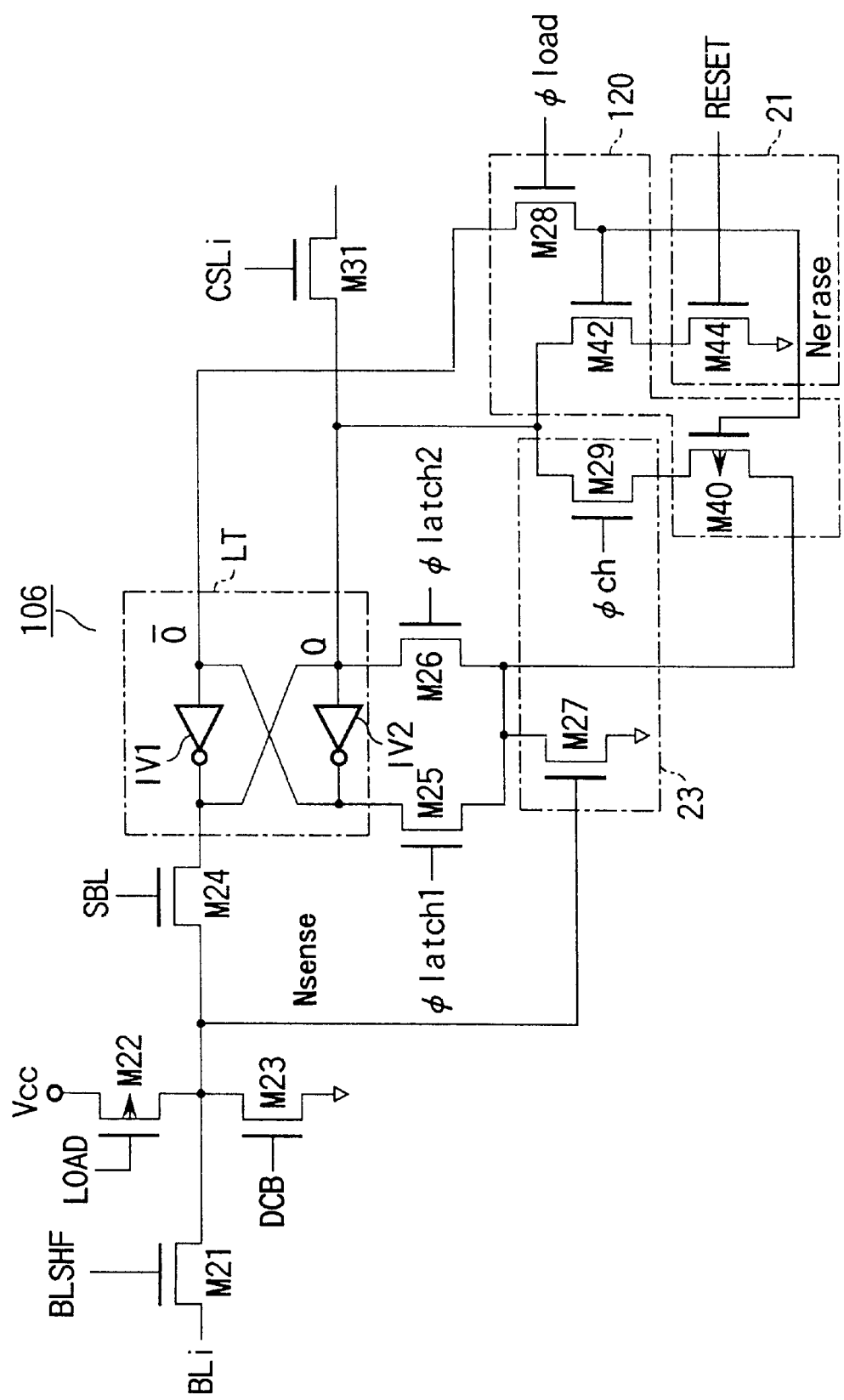
FIG. 43 is a circuit diagram showing the sense amplifier circuit S/A configuration of a NAND cell type EEPROM according to a second modification of the first embodiment of the present invention.

FIG. 43 shows a second modification of the first modification of the second embodiment shown in FIG. 42. In this modification, a data storing circuit 120 is additionally given a function of causing an already programmed memory cell to be able to perform additional programming by using initial data each time a program operation is performed, when the program operation and the program verify read operation are repeatedly performed. As described above, as data to be loaded into a sense amplifier circuit S/A in a program operation, Vss is applied to the second storage node Q in a sense amplifier circuit S/A for performing programming. When "0" programming is detected in a program verify read operation, the potential in the second storage node Q is inverted to Vcc. In an actual EEPROM, however, when a program operation and a verify read operation are repeatedly performed in units of pages, programming is sometimes found to be complete even if the threshold voltage is not sufficiently high "0" level in its initial stages. Accordingly, it is in some instances preferable to initialize data in a sense amplifier circuit S/A to program before each program verify read operation by using the loaded data stored in the data storing circuit 120, thereby performing additional programming by using the first loaded data.

In this modification, therefore, the data storing circuit 120 includes an NMOS transistor M42 as another memory transistor sharing a storage node $N_{erase}$ with a PMOS transistor M40. The NMOS transistor M42 has a gate connected to the storage node $N_{erase}$, a drain connected to the second storage node Q of a latch circuit LT, and a source grounded through a resetting NMOS transistor M44.

An operation of performing erroneous program detection by using the PMOS transistor M40 as a memory transistor of the data storing circuit 120 is the same as in the previous embodiment. Whenever a program operation and a program verify read operation, for example, are performed in this modification, a reset signal RESET is changed to "H" to turn on the resetting NMOS transistor M44. In a sense amplifier circuit S/A in which Vss is applied to the second storage node Q of the latch circuit LT by data loading, the storage node $N_{erase}$ is Vcc and stores an ON state of the NMOS transistor M42. Therefore, even if the second storage node Q is once inverted to Vcc, changing the reset signal RESET to "H" changes the second storage node Q to Vss through the NMOS transistors M42 and M44 which are simultaneously turned on. That is, this sense amplifier circuit S/A is initialized to the first data loaded state. Accordingly, if insufficient programming is found in the next program verify read operation, no data inversion occurs in the latch circuit LT. Consequently, additional programming is performed in the subsequent program operation. Alternately, it is possible to perform additional programming for a memory cell once determined as program pass cell by a similar control as in the modification of the first embodiment.

Figure 44:
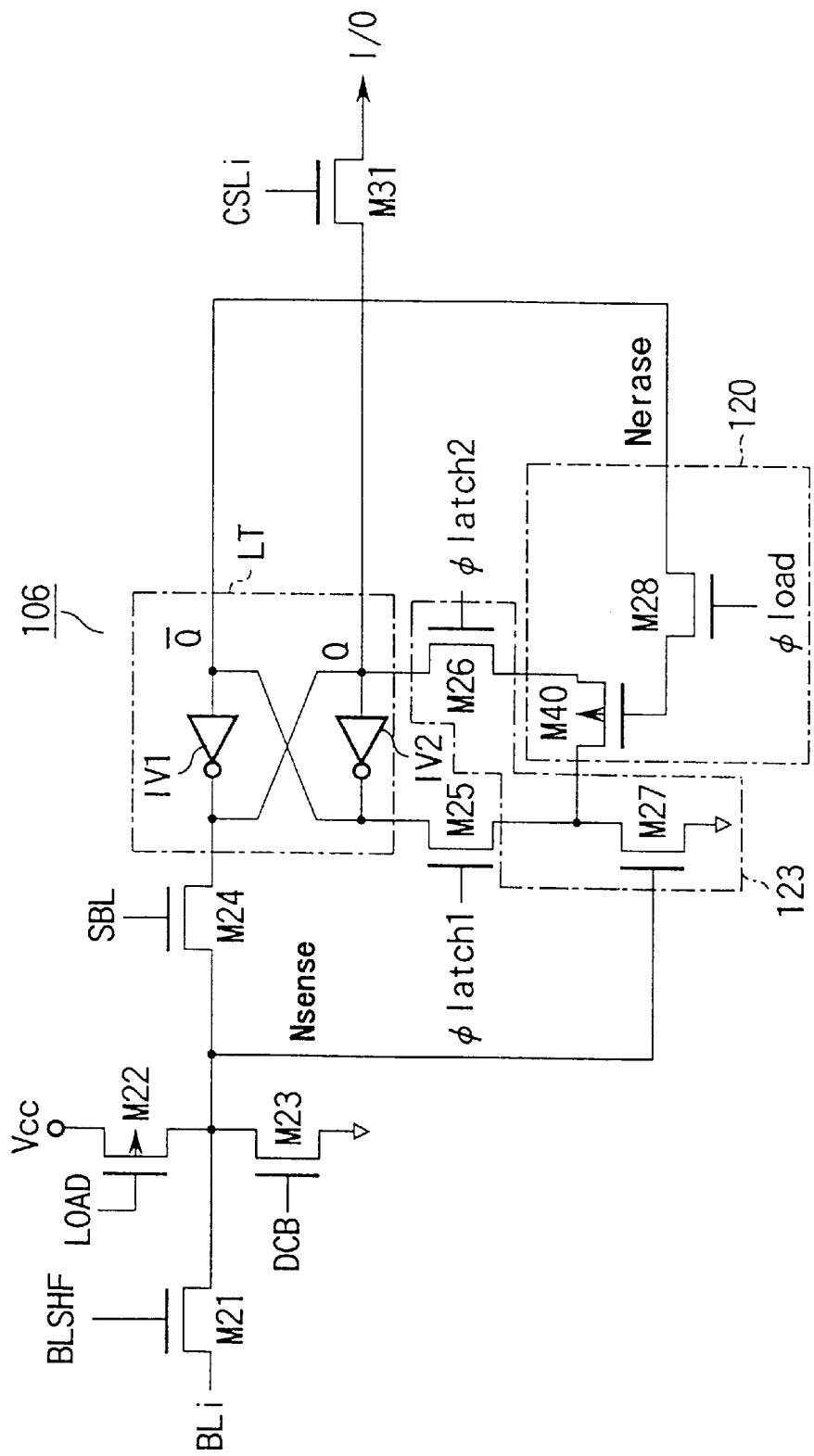
FIG. 44 is a circuit diagram showing the sense amplifier circuit S/A configuration of a NAND cell type EEPROM according to a third modification of the first embodiment of the present invention.

FIG. 44 shows a third modification of the second embodiment as a further modification of the first modification shown in FIG. 42. This modification differs from the first modification shown in FIG. 42 in that the PMOS transistor M40 is connected between the NMOS transistors M26 and M27 and the control signal $\phi_{latch2}$ also functions as the control signal $\phi_{ch}$. The NMOS transistor M29 shown in FIG. 42 can be omitted and thus the number of transistors can be reduced by one, thereby reducing the size of the circuit. In this modification, the inverse read operation is performed as follows. Before the inverse read operation, the nodes Q and /Q of the latch circuit LT of the sense amplifier circuit S/A 106 are Vcc and Vss, respectively. By setting the control signal $\phi_{load}$ to Vcc (or Vcc+Vth), the storage node $N_{erase}$ of the data storing circuit 20 holds the potential (Vss) of the first storage node /Q of the latch circuit LT and the memory transistor M40 is turned on.

Figure 45:
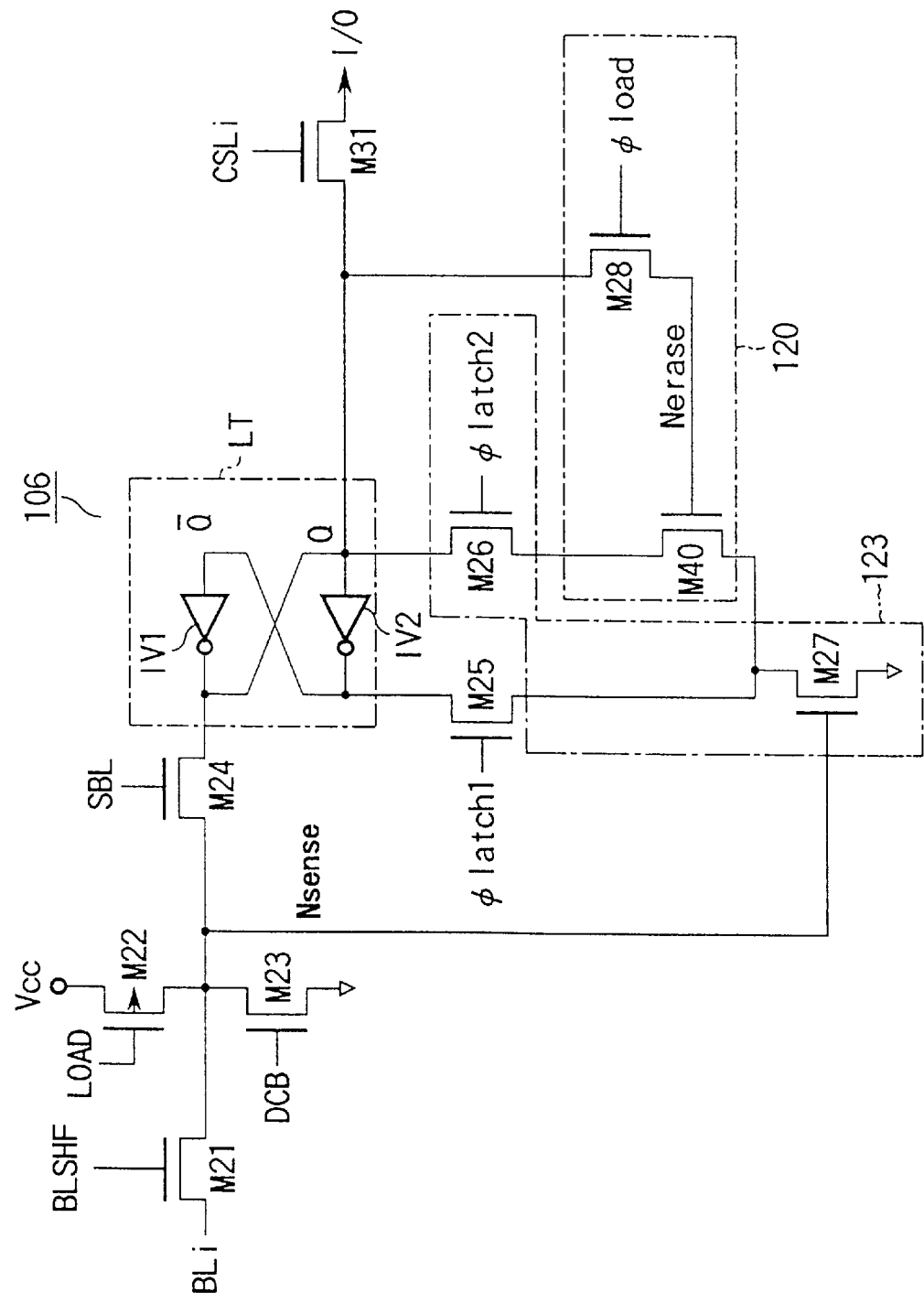
FIG. 45 is a circuit diagram showing the sense amplifier circuit S/A configuration of a NAND cell type EEPROM according to a fourth modification of the first embodiment of the present invention.

FIG. 45 shows a fourth modification of the second embodiment as a further modification of the third modification shown in FIG. 44. This modification differs from the third modification in which the memory transistor M40 is formed of an NMOS transistor.

Figure 46:
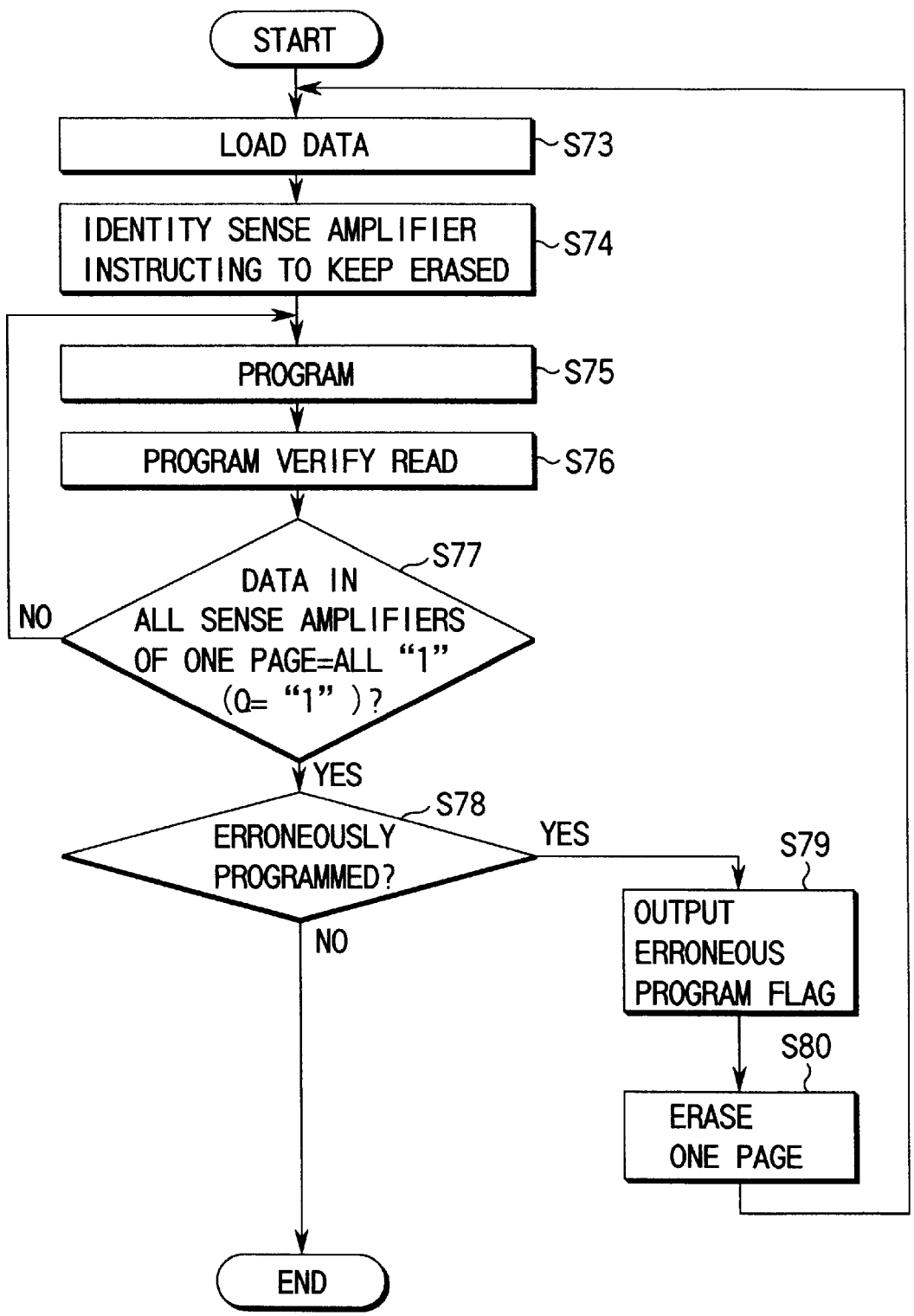
FIG. 46 is a flow chart showing a control flow of a program operation of an EEPROM in the modification of the second embodiment of the present invention.

The flow chart shown in FIG. 39 can be modified as shown in FIG. 46. In a control flow shown in FIG. 39, only an erroneous program detection flag is set (step S79) if the erroneous program is detected. It is desirable to erase one page at step S80 after output of the flag and return the flow to step S73 to load the program data and to perform the program operation again. Third Embodiment In the second embodiment, an erroneous program is detected based on a logical combination of the level of the sense node and the level of the data stored in the data storing circuit 120 at the time of program verify read operation. The third embodiment will be described in which an erroneous program is detected based on the same detection principle but using another detection circuit. The third embodiment uses the sense amplifier circuit S/A including the data storing circuit 20 according to the first embodiment such as shown in FIG. 12.

Figure 47:
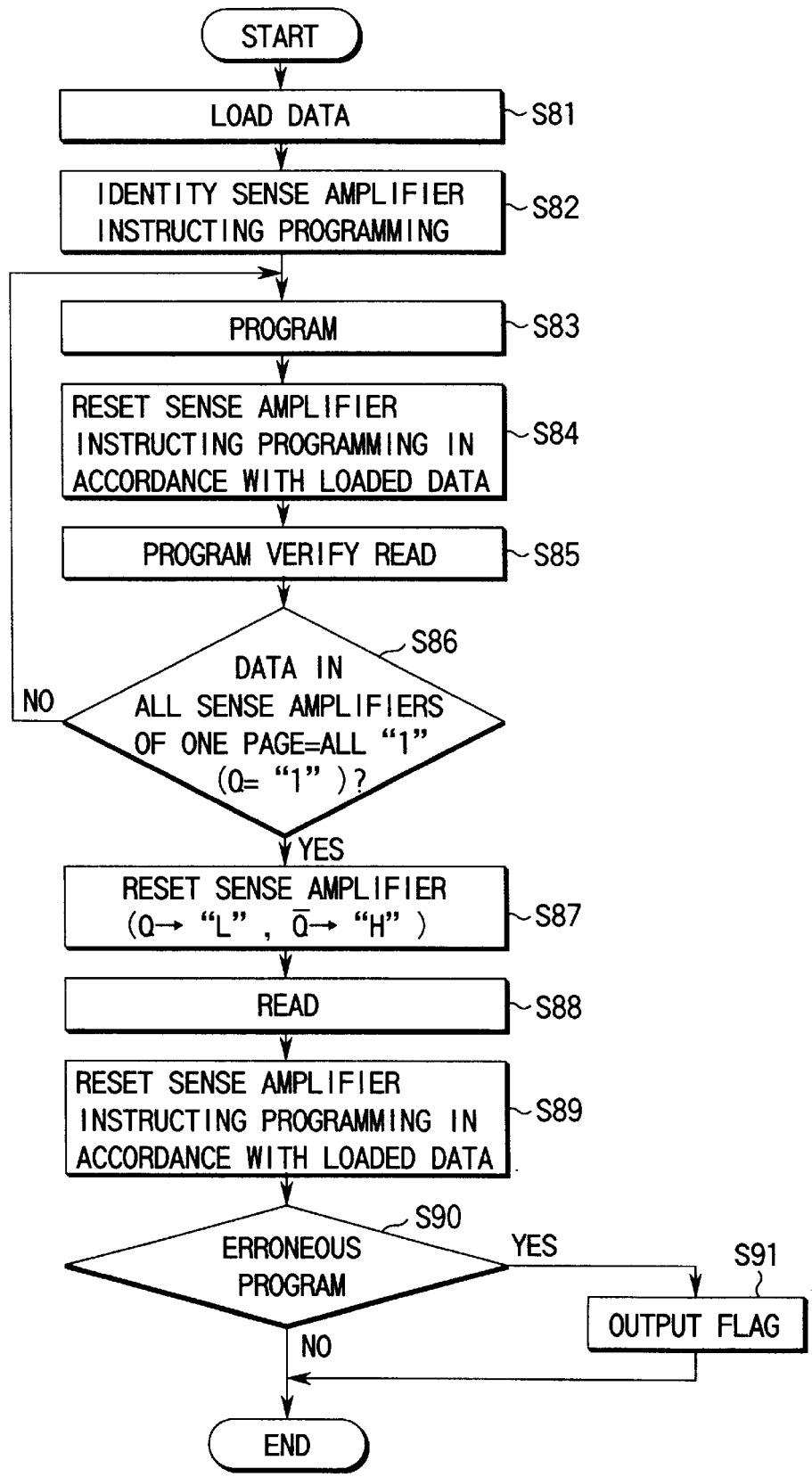
FIG. 47 is a flow chart showing a control flow of a program operation of an EEPROM in a third embodiment of the present invention.
Figure 48:
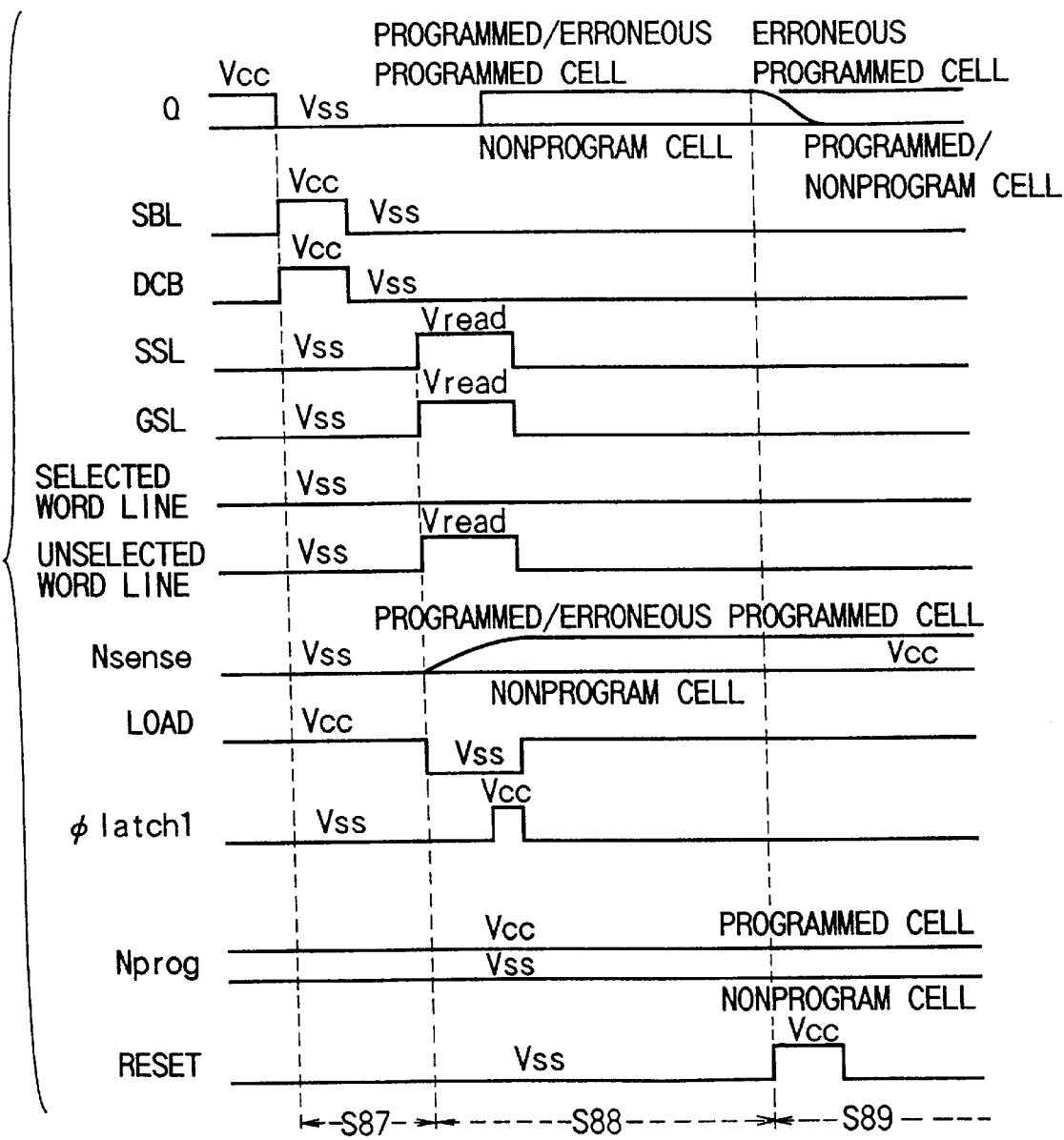
FIG. 48 is a timing chart showing an operation waveform in a program operation of the third embodiment.

FIG. 47 is a flow chart showing an outline of sequence control for a program operation and a program verify read operation of the NAND cell type EEPROM according to this embodiment. FIG. 48 is a timing chart showing an operation waveform at steps S87, S88 and S89 of FIG. 47.

In step S81, a program operation is started and program data is loaded into the latch circuit LT of the sense amplifier circuit S/A.

In step S82, a sense amplifier circuit S/A instructing programming is identified and the identification result is stored in the data storing circuit 20 corresponding to the identified sense amplifier circuit S/A.

In step S83, a program operation is performed.

In step S84, the data of the sense amplifier circuit S/A instructing programming is reset to the program data loaded into the latch circuit LT based on the data in the data storing circuit 20. Note that it is possible to omit step S84.

In step S85, a program verify read operation is performed.

In step S86, it is determined whether the output data of all the sense amplifier circuits S/A of one page indicate that all the data of one page are completely programmed. If NO in step S86, the flow returns to step S83 to perform a program operation again. If YES in step S86, the control signals SBL and DBL are set to "H" level to reset the nodes Q and /Q of the sense amplifier circuit S/A to "L" and "H" levels, respectively (step S87).

In step S88, a read operation is performed by setting the selection gate lines SSL and GSL to "H" level, the unselected word lines to "H" level and the control signal LOAD to "L" level. Thus, the level of the sense node $N_{sense}$ of the latch circuit corresponding to the programmed cell and erroneously programmed cell is increased to "H" level and that corresponding to the memory cell kept to be erased is kept "L" level. The control signal $\phi_{latch1}$ is changed to "H" level when the sense node is supposed to be "H" level so that the data of the latch circuit of the sense amplifier circuit corresponding to the programmed cell and erroneously programmed cell are inverted. As a result, the storage node Q of the sense amplifier circuit is "H" level for the programmed cell and erroneously programmed cell and "L" level for the memory cell kept to be erased.

In step S89, the data of the sense amplifier circuit S/A instructing programming is reset to the load data. That is, when the control signal RESET is changed to "H" level, the data of the second storage node Q of the sense amplifier circuit S/A instructing programming is inverted to "L" level. The data of the second storage node Q of the sense amplifier circuit S/A corresponding to the erroneously programmed cell is kept "H" level. The data of the second storage node Q of the sense amplifier circuit S/A corresponding to the programmed cell and the program inhibited memory cell kept to be erased is changed to "L" level.

In step S90, the erroneous program can detected using the level of the second storage node Q of the sense amplifier circuit S/A.

It is assumed that the program data to three memory cells are "0", "1" and "1" (programming of the second and the third cells is inhibited) and actual programmed data are "0", "1" and "0". This embodiment aims to detect the third cell (erroneously programmed cell). Is step S88, when data are read out from these memory cells, the read data and the program data have inverted relation so that the data of the second storage nodes Q of the latch circuit LT shown in FIG. 12 are "1", "0" and "1". Since the program data storage node $N_{prog}$ of the sense amplifier circuit S/A instructing programming is "H" level, when the resetting NMOS transistor M10 is turned on by setting the reset signal RESET to "H" level (=Vcc) in step S89, the data of the latch circuit LT which is read out from the erroneously programmed cell is kept unchanged but the data ("1") of the latch circuit LT which is read out from the "0" programmed cell is inverted to "0". Therefore, the data of three latch circuits LT corresponding to these memory cells are respectively "0", "0" and "1" in accordance with the logical combination of the level of the sense node and the level of the program data storage node $N_{prog}$ at the time of reading the programmed data. By detecting "1" data stored in the latch circuit LT, an erroneous program is detected. In step S90, an erroneous program can be detected by determining whether or not the data of the second storage node Q of all the sense amplifier circuits S/A of one page are "0" (=Vss).

When the erroneous program is detected in step S90, an erroneous program detection flag is output in step S91. Alternately, it is possible to erase one page and to load program data again to perform a program operation again after output of the detection flag as shown in FIG. 46.

The present invention is not limited to the embodiments described above and can be practiced in the form of various modifications. For example, although the above embodiments are individually explained, a plurality of embodiments or modifications can be appropriately combined.

In addition, each embodiment is explained by taking a NAND cell type EEPROM as an example. However, the present invention may be applicable to an AND cell or a DINOR cell type EEPROM in which a plurality of nonvolatile memory cell or a plurality of NAND cell units are connected in parallel.

The present invention is also effective in a NOR cell type EEPROM having a bit-by-bit verification function. The storing circuit for storing identification data indicating only a sense amplifier circuit instructing programming when the program data is loaded into the sense amplifier circuit. Before program verify read operation, the data of the sense amplifier circuit instructing programming is reset to the loaded data based on the storage data of the storing circuit.

In the above embodiments, a storing circuit is added to a static sense amplifier circuit sensing the bit line potential corresponding to cell data while flowing a load current through a bit line when the cell data is read out. However, the present invention is also applicable to a case wherein a storing circuit is added to a dynamic sense amplifier circuit sensing a lowering of a bit line potential arising from discharging of bit line electric charge corresponding to cell data when the cell data is read out.

In the present invention as has been described above, in a sense amplifier circuit instructed to perform programming by loaded data, data is reset before program verify read operation is performed. Therefore, even a memory cell once passed through verification is further programmed if the memory cell is found to be insufficiently programmed in a later program verify read operation. This improves the reliability of program data.

Additionally, when page divisional programming is performed, even an already programmed memory cell is further programmed if the memory cell is found to be insufficiently programmed in a later program verify read operation. This also improves the reliability.

Furthermore, it is possible to provide an EEPROM capable of easily finding erroneous program by comprising the data in a data storing circuit and that in an erroneous program detecting circuit. The data storing circuit stores program data loaded into a sense amplifier circuit. The erroneous program detecting circuit detects erroneous program in accordance with the logical combination of the data stored in the data storing circuit during a program operation and data obtained in a sense node by a program verify read operation. When detecting erroneous program, the erroneous program detecting circuit inverts the data stored in the sense amplifier circuit to inform the user of the erroneous program.

We claim:

1. A semiconductor memory device comprising:

a memory cell array having data lines and word lines crossing each other and having electrically programmable nonvolatile memory cells arranged at intersections of said data lines and word lines;

sense amplifier circuits connected to said data lines and having a function of reading out and latching data of said memory cell array through sense nodes and a function of loading and latching program data of said memory cell array;

data storing circuits for storing the program data loaded into said sense amplifier circuits; and reset circuits for resetting said sense amplifier circuits instructed to perform programming by the load data to the load data in accordance with the data stored in said data storing circuits.

2. A memory device according to claim 1, in which each of said sense amplifier circuits comprises:

a latch circuit for latching memory cell data read out to said sense node;

a sensing NMOS transistor connected between a first storage node of a pair of complementary storage nodes of said latch circuit and a ground potential and having a gate connected to said sense node;

a first data latching NMOS transistor connected in series with said sensing NMOS transistor between said first storage node of said latch circuit and said ground potential and turned on by a first data latch signal supplied to a gate thereof for a predetermined period; and a transfer gate NMOS transistor connected between said sense node and a second storage node of said pair of complementary storage nodes of said latch circuit, turned off when said memory cell data is read out, and turned on when said memory cell is programmed.

3. A memory device according to claim 2, in which said sense amplifier circuit further comprises:

a second data latching NMOS transistor connected in series with said sensing NMOS transistor between said second storage node of said latch circuit and said ground potential and turned on by a second data latch signal for an inverse read operation supplied to a gate thereof.

4. A memory device according to claim 2, in which a potential of said second storage node of the latch circuit in the sense amplifier circuit instructed to perform programming is reset to a ground potential before program verify read operation.

5. A memory device according to claim 2, in which each of said data storing circuits comprises:

a first NMOS transistor having a drain connected to said first storage node of said latch circuit, a gate to which a program data latch signal is input, and a source connected to a program data storage node; and a second NMOS transistor having a drain connected to said second storage node of said latch circuit and a gate connected to said program data storage node, and in which each of said reset circuits comprises a third NMOS transistor having a drain connected to a source of said second NMOS transistor, a gate to which a reset signal is input, and a source connected to a ground potential.

6. A memory device according to claim 5, in which a potential of the program data storage node is charged in said data storing circuit when the corresponding sense amplifier circuit is instructed to perform programming by the load data.

7. A memory device according to claim 5, further comprising one of a program data storing capacitor connected to said program data storage node and a program data latching flip-flop circuit connected to said program data storage node.

8. A memory device according to claim 2, in which each of said data storing circuits comprises:

a first NMOS transistor having a drain connected to said second storage node of said latch circuit, a gate to which a program data latch signal is input, and a source connected to a program data storage node; and a first PMOS transistor having a drain connected to said first storage node of said latch circuit and a gate connected to said program data storage node, and in which each of said reset circuits comprises a second PMOS transistor having a drain connected to a source of said first PMOS transistor, a gate to which a reset signal is input, and a source connected to a power supply potential.

9. A memory device according to claim 8, in which a potential of the program data storage node is discharged in said data storing circuit when the corresponding sense amplifier circuit is instructed to perform programming by the load data.

10. A memory device according to claim 1, in which a programming of a page of memory cells selected by a word line is performed by:

(a) loading program data into latch circuits of said sense amplifier circuits;

(b) identifying a sense amplifier circuit instructed to perform programming and storing an identification result in a data storing circuit corresponding to the identified sense amplifier circuit;

(c) performing a program operation;

(d) resetting data in said sense amplifier circuit instructed to perform programming to load program data in accordance with the identification result stored in the data storing circuit;

(e) performing a program verify read operation; and (f) determining whether latching data in all the sense amplifier circuits of one page indicate that all the memory cells of one page are completely programmed, ending the program operation if all the memory cells are completely programmed, and returning to step (c) if all the memory cells are not completely programmed.

11. A memory device according to claim 1, in which plural memory cells respectively connected each of said data lines are simultaneously selected, electric charges on corresponding data lines are discharged or not discharged in accordance with a threshold voltage of the plural memory cells when the plural memory cells are selected, and discharge paths of the plural memory cells are connected together.

12. A semiconductor memory device comprising:

a memory cell array having data lines and word lines crossing each other and having electrically programmable nonvolatile memory cells arranged at intersections of said data lines and word lines;

sense amplifier circuits connected to said data lines and having a function of reading out and latching data of said memory cell array through sense nodes and a function of loading and latching program data of said memory cell array;

data storing circuits for storing the program data loaded into said sense amplifier circuits; and reset circuits, where a programming of one page of memory cells selected by the word line is divisionally performed by plural divisional programmings, for resetting said sense amplifier circuits which have been instructed to perform programming by the load data of first to (n−1)th (n is an integer equal to or more than two) divisional programmings at a time of n-th divisional programming to the load data in accordance with the data stored in said data storing circuits.

13. A memory device according to claim 12, in which an inverse read operation in which a logic of the sense amplifier circuits is inverted as compared to a normal read operation is performed at a time of n-th divisional programming before or after n-th divisional program data are loaded into the sense amplifier circuits.

14. A memory device according to claim 12, in which data of the sense amplifier circuits are reset to the load data in accordance with the data stored in the data storing circuits before or after n-th divisional program data are loaded into the sense amplifier circuits and a program verify read operation is performed before a program operation is performed.

15. A semiconductor memory device comprising:

a memory cell array having data lines and word lines crossing each other and having electrically programmable nonvolatile memory cells arranged at intersections of said data lines and word lines;

sense amplifier circuits connected to said data lines and having a function of reading out and latching data of said memory cell array through sense nodes and a function of loading and latching program data of said memory cell array; and data storing circuits for storing the program data loaded into said sense amplifier circuits;

wherein a program operation and a program verify read operation are repeatedly performed until first program pass is determined, then the sense amplifier circuits instructed to perform programming are reset to the load data in accordance with the data stored in the data storing circuits, and a program verify read operation is performed again.

16. A memory device according to claim 15, in which the program operation and the program verify read operation are cyclically performed in a step-up programming method until first program pass is determined, with a program voltage being stepwise increased at each cycle of the program operation and the program verify read operation.

17. A memory device according to claim 16, in which the program operation is further performed for a memory cell, identified as an insufficient programmed cell by the program verify read operation performed again, with the program voltage being reset to an initial voltage of the step-up programming method.

18. A memory device according to claim 15, in which the program operation is further performed for a memory cell, identified as an insufficient programmed cell by a program verify read operation performed again, with the program voltage being reset to a voltage which is higher than an initial voltage of the step-up programming method by one or two steps.

19. A semiconductor memory device comprising:

a memory cell array having data lines and word lines crossing each other and having electrically programmable nonvolatile memory cells arranged at intersections of said data lines and word lines; and sense amplifier circuits connected to said data lines and having a function of reading out and latching data of said memory cell array through sense nodes and a function of loading and latching program data of said memory cell array, wherein if it is determined that memory cells to be programmed have been sufficiently programmed after a program operation and a program verify read operation are cyclically performed, an inverse read operation in which a logic of the sense amplifier circuits is inverted as compared to a normal read operation and in which the word line is set to a voltage which is equal to or higher than a normal read voltage and not higher than a program verify read voltage is performed to reset the sense amplifier circuits to the load data, and a program verify read operation is performed again.

20. A semiconductor memory device comprising:

a memory cell array having data lines and word lines crossing each other and having electrically programmable nonvolatile memory cells arranged at intersections of said data lines and word lines; and sense amplifier circuits connected to said data lines and having a function of reading out and latching data of said memory cell array through sense nodes and a function of loading and latching program data of said memory cell array, wherein, after a program operation and before program verify read operation, an inverse read operation in which a logic of the sense amplifier circuits is inverted as compared to a normal read operation and in which the word line is set to a voltage which is equal to or higher than a normal read voltage and not higher than a program verify read voltage is performed to reset the sense amplifier circuits to the load data.

21. A semiconductor memory device comprising:

a memory cell array having data lines and word lines crossing each other and having electrically programmable nonvolatile memory cells arranged at intersections of said data lines and word lines;

sense amplifier circuits connected to said data lines and having a function of reading out and latching data of said memory cell array through sense nodes and a function of loading and latching program data of said memory cell array;

data storing circuits for storing the program data loaded into said sense amplifier circuits; and an erroneous program detecting circuit for reading into the sense amplifier circuits information data indicating that an erroneous program occurred based on a logical combination of the data stored in the data storing circuits during a program operation and data appeared at the sense nodes by a normal read operation or a program verify read operation.

22. A memory device according to claim 21, in which each of said sense amplifier circuits has a latch circuit having complementary first and second storage nodes, the second storage node being selectively connected to the data line through the sense node;

each of said data storing circuits comprises a memory MOS transistor of which gate is a program data storage node and which dynamically stores a potential corresponding to the program data loaded into the latch circuit and a programming MOS transistor connected between the program data storage node of the memory MOS transistor and one of the first and the second storage nodes of the latch circuit; and said erroneous program detecting circuit comprises an erroneous program checking MOS transistor connected to said memory MOS transistor in series between the second storage node of the latch circuit into which the program data is loaded and a ground potential and turned on after the program operation is ended and a sensing MOS transistor whose gate is controlled in accordance with a potential of the sense node.

23. A memory device according to claim 22, in which said memory MOS transistor of said data storing circuit is an NMOS transistor, and said programming MOS transistor is connected between said second storage node of said latch circuit and said program data storage node of said memory MOS transistor.

24. A memory device according to claim 22, in which said memory MOS transistor of said data storing circuit is a PMOS transistor, and said programming MOS transistor is connected between said first storage node of said latch circuit and said program data storage node of said memory MOS transistor.

25. A memory device according to claim 24, in which said data storing circuit further comprises an NMOS transistor as a second memory MOS transistor storing initial program data loaded into the latch circuit, a gate of the NMOS transistor being the program data storage node which is common to a gate of the PMOS transistor as the memory MOS transistor, and which memory device further comprises a resetting MOS transistor connected in series with said NMOS transistor between said second storage node of said latch circuit and said ground potential and turned on by a reset signal before a program verify read operation is performed to reproduce initial program data in said latch circuit in accordance with a potential of said program data storage node.

26. A memory device according to claim 21, in which a programming of a page of memory cells selected by a word line is performed by:

(a) loading data into latch circuits of said sense amplifier circuits;

(b) identifying a sense amplifier circuit instructed to keep erased by the load data and storing an identification result in a storing circuit corresponding to the identified sense amplifier circuit;

(c) performing a program operation;

(d) performing a program verify read operation;

(e) determining whether latching data in all the sense amplifier circuits of one page indicate that all the memory cells of one page are completely programmed, ending the program operation if all the memory cells are completely programmed, and repeatedly performing the program operation and the program verify read operation if all the memory cells are not completely programmed; and (f) determining whether the erroneous program occurred after ending of the program operation based on a logical combination of the identification result stored in said storing circuit and program verify read data read out by said sense amplifier circuit.

27. A memory device according to claim 21, further comprising a flag output circuit for setting a flag when the information data indicating that an erroneous program occurred is read out to the sense amplifier circuit.

28. A memory device according to claim 21, in which each of said sense amplifier circuits has a latch circuit having complementary first and second storage nodes, the second storage node being selectively connected to the data line through the sense node;

each of said data storing circuits comprises a first NMOS transistor of which drain is connected to the first storage node of the latch circuit, gate is supplied with a program data latch signal, and source is connected to a program data storage node and a second NMOS transistor of which drain is connected to the second storage node of the latch circuit and gate is connected to the program data storage node; and said erroneous program detecting circuit comprises a third NMOS transistor of which drain is connected to a source of the second NMOS transistor, gate is supplied with a reset signal, and source is connected to a ground potential.

29. A memory device according to claim 28, in which after data read out from a programmed memory cell by a normal read operation is latched into the latch circuit through the sense node, said erroneous program detecting circuit reads out the information data indicating that an erroneous program occurred to the sense amplifier circuit by resetting the sense amplifier circuit which has been instructed to perform programming by the load data based on the data stored in the data storing circuit among the sense amplifier circuits latching data indicating that the corresponding memory cells are programmed.

* * * * *